US009324725B2

(12) United States Patent
Saito et al.

(10) Patent No.: US 9,324,725 B2
(45) Date of Patent: Apr. 26, 2016

(54) SEMICONDUCTOR DEVICE AND A MANUFACTURING METHOD THEREOF

(71) Applicant: RENESAS ELECTRONICS CORPORATION, Tokyo (JP)

(72) Inventors: Kentaro Saito, Kanagawa (JP); Hiraku Chakihara, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/884,273

(22) Filed: Oct. 15, 2015

(65) Prior Publication Data

US 2016/0035739 A1 Feb. 4, 2016

Related U.S. Application Data

(62) Division of application No. 14/146,036, filed on Jan. 2, 2014, now Pat. No. 9,196,748.

(30) Foreign Application Priority Data

Feb. 28, 2013 (JP) ................................. 2013-039615

(51) Int. Cl.
*H01L 29/792* (2006.01)
*H01L 27/115* (2006.01)
*H01L 29/423* (2006.01)
(Continued)

(52) U.S. Cl.
CPC ...... *H01L 27/11568* (2013.01); *H01L 21/0217* (2013.01); *H01L 21/02164* (2013.01); *H01L 21/28282* (2013.01); *H01L 21/31111* (2013.01); *H01L 21/32133* (2013.01); *H01L 29/0642* (2013.01); *H01L 29/42344* (2013.01); *H01L 29/4916* (2013.01); *H01L 29/513* (2013.01);

(Continued)

(58) Field of Classification Search
CPC ................... H01L 29/42344; H01L 29/42324; H01L 21/28273; H01L 29/4234; H01L 29/66825; H01L 21/823462; H01L 21/823443; H01L 21/823835
USPC .................................................. 438/591, 239
See application file for complete search history.

(56) References Cited

U.S. PATENT DOCUMENTS

| 6,096,602 | A | 8/2000 | Kim et al. |
| 6,265,739 | B1 | 7/2001 | Yaegashi et al. |
| 2011/0272753 | A1* | 11/2011 | Funayama ........ H01L 29/42324 257/299 |

FOREIGN PATENT DOCUMENTS

| JP | 2003-249579 A | 9/2003 |
| WO | WO 2010/082389 A1 | 7/2010 |

*Primary Examiner* — Cathy N Lam
(74) *Attorney, Agent, or Firm* — Shapiro, Gabor and Rosenberger, PLLC

(57) ABSTRACT

The performances of a semiconductor device are improved. The semiconductor device has a first control gate electrode and a second control gate electrode spaced along the gate length direction, a first cap insulation film formed over the first control gate electrode, and a second cap insulation film formed over the second control gate electrode. Further, the semiconductor device has a first memory gate electrode arranged on the side of the first control gate electrode opposite to the second control gate electrode, and a second memory gate electrode arranged on the side of the second control gate electrode opposite to the first control gate electrode. The end at the top surface of the first cap insulation film on the second control gate electrode side is situated closer to the first memory gate electrode side than the side surface of the first control gate electrode on the second control gate electrode side.

6 Claims, 67 Drawing Sheets

(51) Int. Cl.
*H01L 29/66* (2006.01)
*H01L 21/28* (2006.01)
*H01L 21/3213* (2006.01)
*H01L 29/06* (2006.01)
*H01L 29/51* (2006.01)
*H01L 29/49* (2006.01)
*H01L 21/02* (2006.01)
*H01L 21/311* (2006.01)

(52) U.S. Cl.
CPC ........ *H01L 29/518* (2013.01); *H01L 29/66833* (2013.01)

| APPLIED VOLTAGE / OPERATION | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

SEMICONDUCTOR DEVICE AND A MANUFACTURING METHOD THEREOF

CROSS-REFERENCE TO RELATED APPLICATIONS

The disclosure of Japanese Patent Application No. 2013-039615 filed on Feb. 28, 2013 including the specification, drawings and abstract is incorporated herein by reference in its entirety.

BACKGROUND

The present invention relates to a semiconductor device and a manufacturing method thereof, and may be preferably used for, for example, a semiconductor device having a nonvolatile memory, and a manufacturing method thereof.

As one of electrically writable/erasable nonvolatile memories, namely, EEPROMs (Electrically Erasable and Programmable Read Only Memories) which are nonvolatile semiconductor storage devices, flash memories have been widely used. The flash memories each have a conductive floating gate electrode surrounded by an oxide film and a trapping insulation film under a gate electrode of MISFET (Metal Insulator Semiconductor Field Effect Transistor). Further, the flash memory stores information by using a difference in threshold voltage of a MISFET caused by the presence or absence of charges, namely, electrons or holes in the floating gate electrode or the trapping insulation film. In a semiconductor device as such a nonvolatile memory, memory cells forming the nonvolatile memory are formed in a memory cell region over a semiconductor substrate.

WO 2010/82389 (Patent Document 1) discloses as follows: a memory cell has a first gate insulation film, a selection gate electrode formed over the first gate insulation film, and a memory gate electrode formed over one side surface of the selection gate electrode. Further, Patent Document 1 discloses as follows: the memory cell has a second gate insulation film formed between the selection gate electrode and the memory gate electrode, and between the memory gate electrode and the semiconductor substrate.

Japanese Unexamined Patent Publication No. 2003-249579 (Patent Document 2) discloses as follows: the memory cell has a two-layer gate structure including a gate insulation film, a floating gate layer, a control gate layer, and an insulation film for electrically insulating the floating gate layer and the control gate layer.

Patent Documents

[Patent Document 1]
WO 2010/82389
[Patent Document 2]
Japanese Unexamined Patent Publication No. 2003-249579

SUMMARY

For example, with a trend toward a larger capacity of a nonvolatile memory, miniaturization of a memory cell has been pursued. This results in a reduction of the gate length of the gate electrode included in the memory cell, and a reduction of the distance in the gate length direction between the gate electrodes included in two memory cells adjacent to each other along the gate length direction. On the other hand, when the thickness of the gate electrode is reduced, ions become more likely to penetrate through the gate electrode in ion implantation using the gate electrode as a mask. For this reason, the thickness of the gate electrode cannot be reduced with ease. Accordingly, the ratio of the thickness to the gate length of the gate electrode, namely, the aspect ratio increases. Thus, also for the trench part formed between the gate electrodes included in the two memory cells adjacent to each other along the gate length direction, the ratio of the depth of the trench part to the width in the gate length direction of the trench part, namely, the aspect ratio increases.

When an interlayer insulation film is formed over a semiconductor substrate with such a trench part having a high aspect ratio being formed, it becomes difficult to fill the trench part. As a result, a cavity may be formed in the inside of the trench part, namely, a portion between the gate electrodes included in two memory cells adjacent to each other along the gate length direction of the interlayer insulation film. In consequence, the formation of a conductive film or the like in the inside of the cavity in a later step causes an electrical short circuit between the memory cells and other portions. This results in the degradation of the performances of the semiconductor device.

Other objects and novel features will be apparent from the description of this specification and the accompanying drawings.

In accordance with one embodiment, a semiconductor device has a first gate electrode and a second gate electrode spaced along the gate length direction, a first cap insulation film formed over the first gate electrode, and a second cap insulation film formed over the second gate electrode. Further, the semiconductor device has a third gate electrode arranged opposite to the second gate electrode across the first gate electrode, and adjacent to the first gate electrode, and a fourth gate electrode arranged opposite to the first gate electrode across the second gate electrode, and adjacent to the second gate electrode. Then, the end at the top surface of the first cap insulation film on the second gate electrode side is situated closer to the third gate electrode side than the side surface of the first gate electrode on the second gate electrode side.

Further, in accordance with another embodiment, with a method for manufacturing a semiconductor device, over the main surface of a semiconductor substrate, a first insulation film, a first conductive film, and a second insulation film are formed sequentially from the bottom. Then, the second insulation film and the first conductive film are patterned, thereby to form a first gate electrode and a second gate electrode spaced along the gate length direction with the first conductive film. As a result, there is formed a first cap insulation film formed of the second insulation film over the first gate electrode, and there is formed a second cap insulation film formed of the second insulation film over the second gate electrode. Then, a portion of the first cap insulation film exposed at the side surface on the second gate electrode side is removed. As a result, the side surface of the first cap insulation film on the second gate electrode side is set back from the side surface of the first gate electrode on the second gate electrode side.

In accordance with one embodiment, it is possible to improve the performances of the semiconductor device.

DETAILED DESCRIPTION

Figure 1:
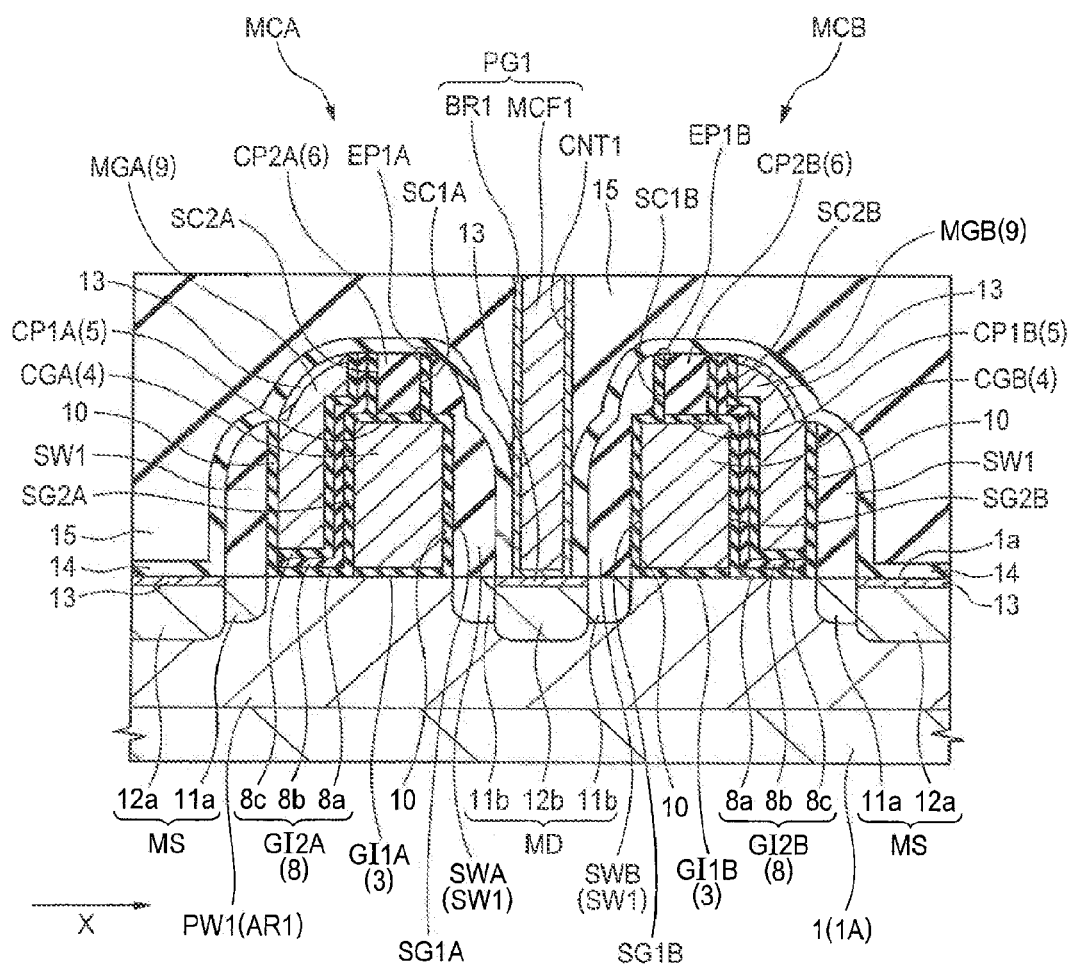
FIG. 1 is an essential part cross sectional view of a semiconductor device of First Embodiment.

In description of the following embodiment, the embodiment may be described in a plurality of divided sections or embodiments for convenience, if required. However, unless otherwise specified, these are not independent of each other, but are in a relation such that one is a modification example, details, complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, and except for other cases.

Further, in the following embodiments, it is naturally understood that the constitutional elements (including element steps, or the like) are not always essential, unless otherwise specified, except for the case where they are apparently considered essential in principle, and except for other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and ranges.

Below, representative embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar portions will not be repeated in principle unless particularly necessary.

Further, in the accompanying drawings used in the embodiments, hatching may be omitted even in cross sectional view for easy understanding of the drawings. Whereas, hatching may be added even in plan view for easy understanding of the drawings.

Further, in cross sectional view and plan view, the size of each site does not correspond to that of an actual device. For easy understanding of the drawings, a specific site may be shown on a relatively enlarged scale. Whereas, also when a plan view and a cross sectional view correspond to each other, each site may be shown on different scales.

Incidentally, in the following embodiments, when A to B represents a range, it is assumed to represent "equal to or larger than A, and equal to or smaller than B".

First Embodiment

In the present First Embodiment, as one example of a nonvolatile memory, a description will be given to the one having a charge accumulation part using a trapping insulation film, namely, an insulation film capable of accumulating electrical charges. Namely, in the present First Embodiment, a description will be given to a semiconductor device having a memory cell including a split gate type cell using a MONOS (Metal-Oxide-Nitride-Oxide-Semiconductor) film as a nonvolatile memory, and a manufacturing method thereof. Specifically, a description will be given based on a memory cell using an n channel type MISFET and a trapping insulation film as a nonvolatile memory.

Incidentally, in the present First Embodiment, a description will be given to the polarities of the applied voltages at the time of the write operation, at the time of the erase operation, and at the time of the read operation, and the polarity in the case using an n channel type MISFET as the polarity of the conductivity type of carriers. However, when a p channel type MISFET is used, all the polarities of the polarities of the applied voltages, the polarity of the conductivity type of carriers, and the like are inversed. As a result, the nonvolatile memory can be caused to perform the same operation.

<Structure of Semiconductor Device>

Then, the structure of the semiconductor device of the present First Embodiment will be described by reference to the accompanying drawings.

Figure 2:
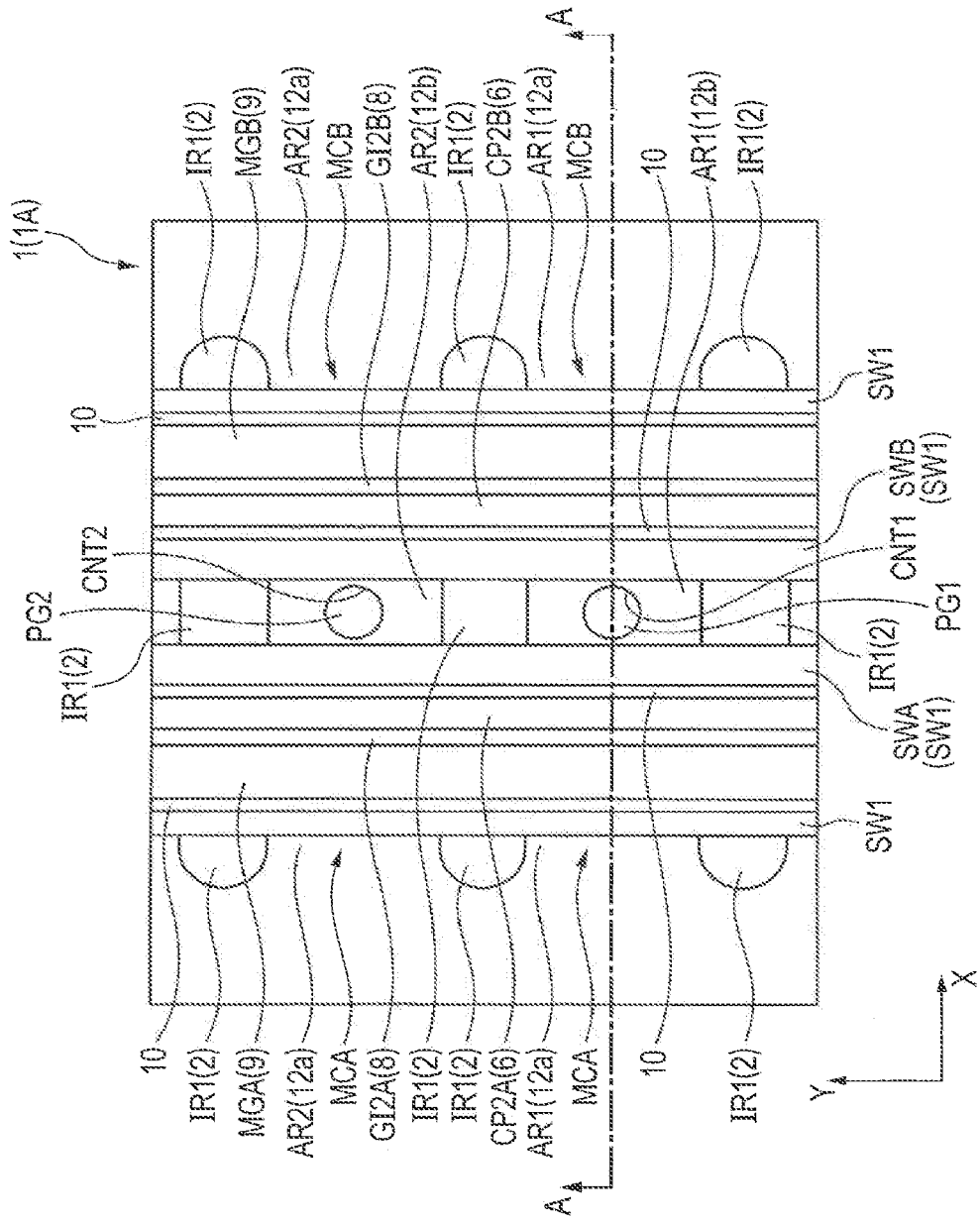
FIG. 2 is an essential part plan view of the semiconductor device of First Embodiment.
Figure 3:
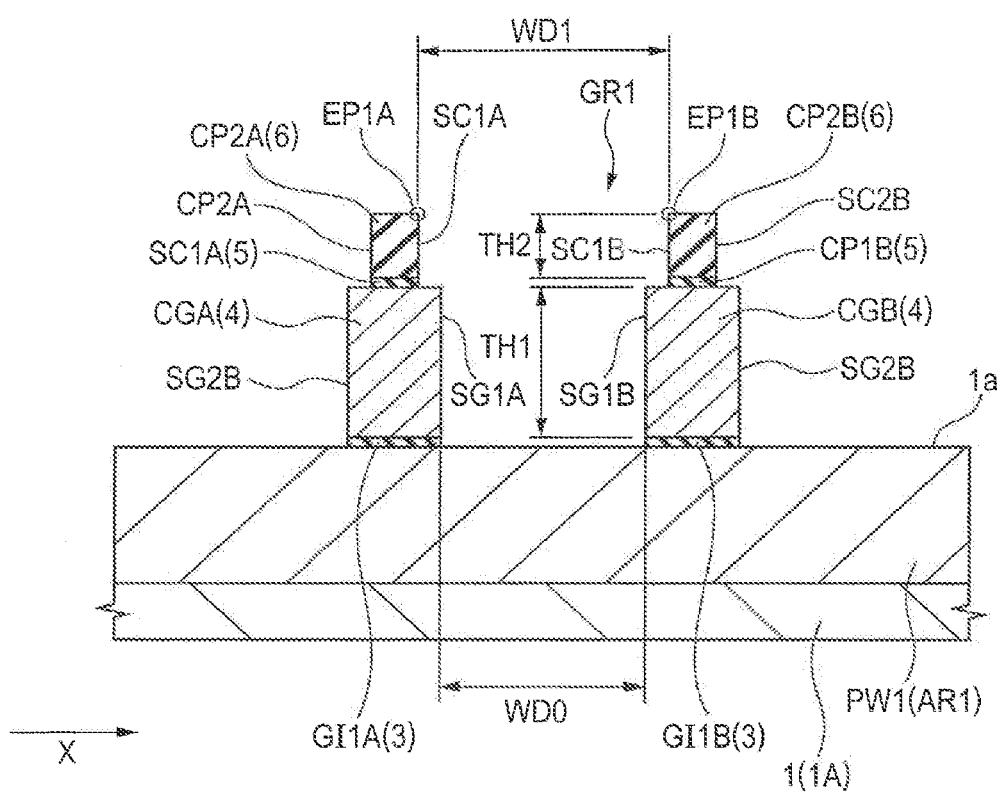
FIG. 3 is an essential part cross sectional view of the semiconductor device of First Embodiment.
Figure 4:
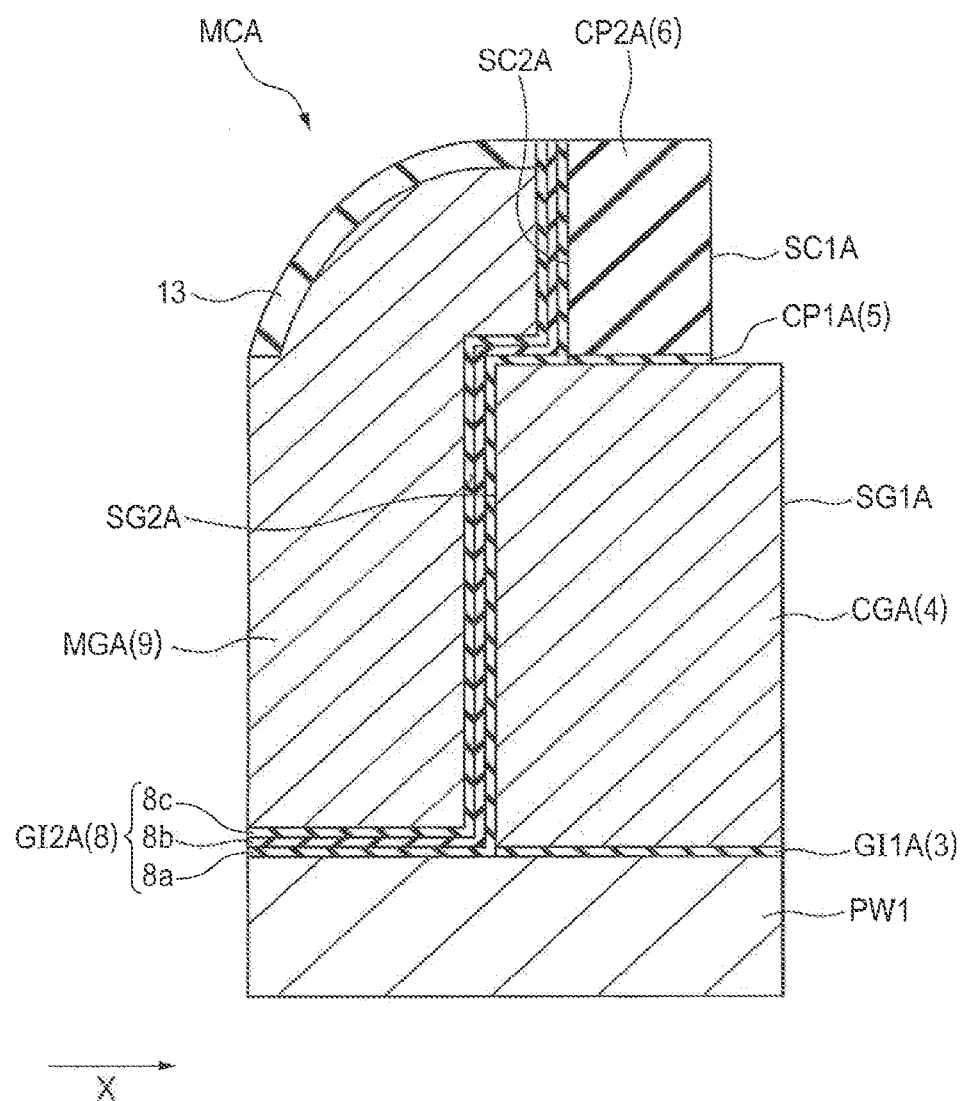
FIG. 4 is an essential part cross sectional view of the semiconductor device of First Embodiment.

FIG. 1 is an essential part cross sectional view of the semiconductor device of First Embodiment. FIG. 2 is an essential part plan view of the semiconductor device of First Embodiment. FIGS. 3 and 4 are each an essential part cross sectional view of the semiconductor device of First Embodiment. Incidentally, FIG. 1 is a cross sectional view along line A-A of FIG. 2. Whereas, FIG. 2 shows a state in which an insulation film 14 and an interlayer insulation film 15 described later have been removed, or seen therethrough. Further, FIG. 3 shows only a semiconductor substrate 1, a p type well PW1, gate insulation films GI1A and GI1B, control gate electrodes CGA and CGB, and cap insulation films CP1A, CP1B, CP2A, and CP2B of the semiconductor device shown in FIG. 1 for easy understanding. Further, FIG. 4 shows only the p type well PW1, the gate insulation film GI1A, the control gate electrode CGA, the cap insulation films CP1A and CP2A, a memory gate electrode MGA, and a metal silicide layer 13 of a memory cell MCA of the semiconductor device shown in FIG. 1.

As shown in FIGS. 1 and 2, the semiconductor device has the semiconductor substrate 1. The semiconductor substrate 1 is a semiconductor wafer formed of a p type single crystal silicon having a specific resistance of, for example, about 1 to 10 Ωcm.

Incidentally, as shown in FIGS. 1 and 2, two directions in parallel with a main surface 1a of the semiconductor substrate 1, and crossing with each other are referred to as an X axis direction and a Y axis direction. Namely, the two directions crossing with each other are referred to as an X axis direction and a Y axis direction (the same also applies to the following embodiments). Whereas, in the main surface 1a of the semiconductor substrate 1, the X axis direction and the Y axis direction are preferably orthogonal to each other. However, it is essential only that the X axis direction and the Y axis direction cross with each other. Thus, the present invention is not limited to the case where the X axis direction and the Y axis direction orthogonal to each other (this also applies to the following embodiments).

As shown in FIGS. 1 and 2, the semiconductor device has a memory cell region 1A on the main surface 1a side of the semiconductor substrate 1. Further, as shown in FIG. 2, in the memory cell region 1A, the semiconductor device has an active region AR1, an active region AR2, and an element isolation region IR1.

Incidentally, although not shown, the semiconductor device may have a peripheral circuit region in addition to the memory cell region 1A. The peripheral circuit is a circuit other than a nonvolatile memory, and is, for example, a processor such as a CPU (Central Processing Unit), a control circuit, a sense amplifier, a column decoder, a row decoder, or an input/output circuit.

The active region AR1 and the active region AR2 are respectively formed on the main surface 1a side of the semiconductor substrate 1, and respectively extend in the X axis direction in the main surface 1a of the semiconductor substrate 1. The active region AR1 and the active region AR2 are spaced along the Y axis direction in the main surface 1a of the semiconductor substrate 1.

On the main surface 1a side of the semiconductor substrate 1, and between the active region AR1 and the active region AR2, there is formed an element isolation region IR1. The element isolation region IR1 extends in the X axis direction in the main surface 1a of the semiconductor substrate 1, and is formed between the active region AR1 and the active region AR2. The element isolation region IR1 is for isolating elements. In the element isolation region IR1, there is formed an element isolation film 2.

Incidentally, as shown in FIG. 2, the active region AR1 and the active region AR2 are spaced along the Y axis direction. However, the active region AR1 and the active region AR2 may also be integrally connected to each other to form one active region. In other words, the following configuration is also acceptable: in the main surface 1a of the semiconductor substrate 1, the element isolation region IR1 extending in the X axis direction is formed in some region of one active region; accordingly, the active region AR1 and the active region AR2 are spaced along the Y axis direction.

The active region AR1 and the active region AR2 are defined or divided by the element isolation region IR1, and are electrically isolated from each other by the element isolation region IR1. Further, as shown in FIG. 1, in the active region AR1, a p type well PW1 is formed. Although not shown, also in the active region AR2, as in the active region AR1, a p type well PW1 is formed. Namely, the active region AR1 and the active region AR2 are each a region including the p type well PW1 formed therein. Thus, in the Y axis direction of FIG. 2, a plurality of active regions and a plurality of element isolation regions are alternately arranged, thereby to form rows of active regions. Further, a plurality of rows of the active regions are arranged in the X axis direction of FIG. 2.

In the active region AR1, two memory cells MCA and MCB as the nonvolatile memories are formed in the p type well PW1. The memory cells MCA and MCB are split gate type memory cells.

As shown in FIGS. 1 and 2, the memory cell MCA has a control transistor having a control gate electrode CGA, and a memory transistor coupled to the control transistor, and having a memory gate electrode MGA. Whereas, the memory cell MCB has a control transistor having a control gate electrode CGB, and a memory transistor coupled to the control transistor, and having a memory gate electrode MGB. The two memory cells MCA and MCB share a semiconductor region MD functioning as a drain region.

As shown in FIG. 2, also over the active region AR2, as over the active region AR1, there are formed the two memory cells MCA and MCB. Although not shown, also in the active region AR2, as in the active region AR1, the two memory cells MCA and MCB share a semiconductor region MD functioning as a drain region. Thus, a plurality of memory cells MCA and MCB are arranged in the Y axis direction, thereby to form memory cell rows. Whereas, a plurality of memory cell rows including a plurality of memory cells MCA and a plurality of memory cells MCB arrayed in the Y axis direction are arranged in the X axis direction of FIG. 2. Thus, a plurality of memory cells are formed in an array in the X axis direction and the Y axis direction in plan view.

Incidentally, in the present specification, the wording "in plan view" means the case of a view seen from a direction normal to the main surface 1a of the semiconductor substrate 1. Incidentally, the case of the wording "in the main surface 1a of the semiconductor substrate 1" also means the case of a view seen from a direction normal to the main surface 1a of the semiconductor substrate 1.

As shown in FIG. 1, the memory cell MCA and the memory cell MCB are arranged nearly symmetrically across the semiconductor region MD functioning as a drain region. The memory cell MCA and the memory cell MCB are arranged side by side along the X axis direction of FIG. 1.

The memory cell MCA has n type semiconductor regions MS and MD, a control gate electrode CGA, and a memory gate electrode MGA. Further, the memory cell MCA has a cap insulation film CP1A formed over the control gate electrode CGA, and a cap insulation film CP2A formed over the cap insulation film CP1A. Then, the memory cell MCA has a gate insulation film GI1A formed between the control gate electrode CGA and the semiconductor substrate 1, and a gate insulation film GI2A formed between the memory gate electrode MGA and the semiconductor substrate 1, and between the memory gate electrode MGA and the control gate electrode CGA. Namely, the gate insulation film GI1A, the control gate electrode CGA, the cap insulation film CP1A, the cap insulation film CP2A, the memory gate electrode MGA, and the gate insulation film GI2A form the memory cell MCA.

The memory cell MCB has n type semiconductor regions MS and MD, a control gate electrode CGB, and a memory gate electrode MGB. Whereas, the memory cell MCB has a cap insulation film CP1B formed over the control gate electrode CGB, and a cap insulation film CP2B formed over the cap insulation film CP1B. Then, the memory cell MCB has a gate insulation film GI1B formed between the control gate electrode CGB and the semiconductor substrate 1, and a gate insulation film GI2B formed between the memory gate electrode MGB and the semiconductor substrate 1, and between the memory gate electrode MGB and the control gate electrode CGB. Namely, the gate insulation film GI1B, the control gate electrode CGB, the cap insulation film CP1B, the cap insulation film CP2B, the memory gate electrode MGB, and the gate insulation film GI2B form the memory cell MCB.

In the memory cell MCA, the control gate electrode CGA and the memory gate electrode MGA extend and are arranged side by side along the main surface 1a of the semiconductor substrate 1 with the gate insulation film GI2A interposed between the mutually opposing side surfaces, i.e., sidewalls thereof. The direction of extension of the control gate electrode CGA and the memory gate electrode MGA is the direction normal to the paper plane of FIG. 1, i.e., the Y axis direction of FIG. 2.

In the memory cell MCB, the control gate electrode CGB and the memory gate electrode MGB extend and are arranged side by side along the main surface 1a of the semiconductor substrate 1 with the gate insulation film GI2B interposed between the mutually opposing side surfaces, i.e., sidewalls thereof. The direction of extension of the control gate electrode CGB and the memory gate electrode MGB is the direction normal to the paper plane of FIG. 1, i.e., the Y axis direction of FIG. 2.

Thus, the control gate electrode CGA, the cap insulation film CP2A, the memory gate electrode MGA, and the gate insulation film GI2A are formed in such a manner as to extend along the Y axis direction through over the active region AR1, over the element isolation region IR1, and over the active region AR2. Whereas, the control gate electrode CGB, the cap insulation film CP2B, the memory gate electrode MGB, and the gate insulation film GI2B are formed in such a manner as to extend along the Y axis direction through over the active region AR1, over the element isolation region IR1, and over the active region AR2.

Incidentally, the X axis direction of FIGS. 1 and 2 is the gate length direction of the control gate electrode CGA, the memory gate electrode MGA, the control gate electrode CGB, and the memory gate electrode MGB. Whereas, the Y axis direction of FIG. 2 is the gate width direction of the control gate electrode CGA, the memory gate electrode MGA, the control gate electrode CGB, and the memory gate electrode MGB.

The control gate electrode CGA and the control gate electrode CGB are spaced along the X axis direction of FIGS. 1 and 2.

The control gate electrode CGA is formed over the p type well PW1 between the semiconductor region MD and the semiconductor region MS, namely, over the semiconductor substrate 1 via the gate insulation film GI1A. Then, the memory gate electrode MGA is formed over the p type well PW1 between the semiconductor region MD and the semiconductor region MS, namely, over the semiconductor substrate 1 via the gate insulation film GI2A. Further, on the semiconductor region MS side, the memory gate electrode MGA is arranged, and on the semiconductor region MD side, the control gate electrode CGA is arranged. The control gate electrode CGA and the memory gate electrode MGA are gate electrodes forming the memory cell MCA, namely, the nonvolatile memory.

The control gate electrode CGB is formed over the p type well PW1 between the semiconductor region MD and the semiconductor region MS, namely, over the semiconductor substrate 1 via the gate insulation film GI1B. Then, the memory gate electrode MGB is formed over the p type well PW1 between the semiconductor region MD and the semiconductor region MS, namely over the semiconductor substrate 1 via the gate insulation film GI2B. Further, on the semiconductor region MS side, the memory gate electrode MGB is arranged, and on the semiconductor region MD side, the control gate electrode CGB is arranged. The control gate electrode CGB and the memory gate electrode MGB are gate electrodes forming the memory cell MCB, namely, the nonvolatile memory.

The control gate electrode CGA and the memory gate electrode MGA are adjacent to each other with the gate insulation film GI2A interposed therebetween. The memory gate electrode MGA is formed in a sidewall spacer shape at the side surface SG2A of the control gate electrode CGA, namely, over the sidewall of the control gate electrode CGA via the gate insulation film GI2A. Whereas, the gate insulation film GI2A is formed over both regions of the region between the memory gate electrode MGA and the p type well PW1 of the semiconductor substrate 1, and the region between the memory gate electrode MGA and the control gate electrode CGA.

The control gate electrode CGB and the memory gate electrode MGB are adjacent to each other with the gate insulation film GI2B interposed therebetween. The memory gate electrode MGB is formed in a sidewall spacer shape at the side surface SG2B of the control gate electrode CGB, namely, over the sidewall of the control gate electrode CGB via the gate insulation film GI2B. Whereas, the gate insulation film GI2B is formed over both regions of the region between the memory gate electrode MGB and the p type well PW1 of the semiconductor substrate 1, and the region between the memory gate electrode MGB and the control gate electrode CGB.

Incidentally, the wording "being formed at the side surface of an electrode" means "being formed outwardly of the side surface of the electrode". The wording "being formed over the sidewall of an electrode" means "being formed outwardly of the sidewall of the electrode".

The memory gate electrode MGA is arranged over the main surface 1a of the semiconductor substrate 1, and opposite to the control gate electrode CGB across the control gate electrode CGA. Whereas, the memory gate electrode MGB is arranged over the main surface 1a of the semiconductor substrate 1, and opposite to the control gate electrode CGA across the control gate electrode CGB.

The gate insulation film GI1A formed between the control gate electrode CGA and the p type well PW1 functions as the gate insulation film of the control transistor. The gate insulation film GI2A formed between the memory gate electrode MGA and the p type well PW1 functions as the gate insulation film of the memory transistor.

The gate insulation film GI1B formed between the control gate electrode CGB and the p type well PW1 functions as the gate insulation film of the control transistor. The gate insulation film GI2B between the memory gate electrode MGB and the p type well PW1 functions as the gate insulation film of the memory transistor.

The gate insulation film GI1A and the gate insulation film GI1B are each formed of an insulation film 3. The insulation film 3 is formed of an insulation film such as an silicon oxide film, a silicon nitride film, or a silicon oxynitride film, and is preferably formed of a high dielectric constant film having a higher relative dielectric constant than that of a silicon nitride film, namely, a so-called High-k film. Incidentally, in the present invention, the term "High-k film or high dielectric constant film" means a film having a higher dielectric constant (relative dielectric constant) than that of a silicon nitride film. When the insulation film 3 is a high dielectric constant film, as the insulation film 3, there can be used a metal oxide film such as a hafnium oxide film, a zirconium oxide film, an aluminum oxide film, a tantalum oxide film, or a lanthanum oxide film.

The gate insulation film GI2A between the memory gate electrode MGA and the p type well PW1, and the gate insulation film GI2B between the memory gate electrode MGB and the p type well PW1 each function as the gate insulation film of the memory transistor. On the other hand, the gate insulation film GI2A between the memory gate electrode MGA and the control gate electrode CGA functions as an insulation film for insulating, namely, electrically isolating the memory gate electrode MGA and the control gate electrode CGA. Whereas, the gate insulation film GI2B between the memory gate electrode MGB and the control gate electrode CGB functions as an insulation film for insulating, namely, electrically isolating the memory gate electrode MGB and the control gate electrode CGB.

The gate insulation film GI2A and the gate insulation film GI2B are each formed of an insulation film 8. The insulation film 8 is a lamination film including, for example, a silicon oxide film 8a, a silicon nitride film 8b as a charge accumulation part over the silicon oxide film 8a, and a silicon oxide film 8c over the silicon nitride film 8b.

Of the insulation film 8, the silicon nitride film 8b is an insulation film for accumulating electrical charges, and functions as a charge accumulation part. Namely, the silicon nitride film 8b is a trapping insulation film formed in the insulation film 8. For this reason, the insulation film 8 can be regarded as an insulation film having a charge accumulation part in the inside thereof.

The silicon oxide film 8c and the silicon oxide film 8a situated over and under the silicon nitride film 8b, respectively, each function as a charge block layer for confining electrical charges. The structure in which the silicon nitride film 8b is sandwiched between the silicon oxide film 8c and the silicon oxide film 8a enables accumulation of electrical charges into the silicon nitride film 8b. The silicon oxide film 8a, the silicon nitride film 8b, and the silicon oxide film 8c can be regarded as an ONO (Oxide-Nitride-Oxide) film as a part of a MONOS film.

The control gate electrode CGA and the control gate electrode CGB are each formed of a conductive film 4 such as an n type polysilicon film which is a polysilicon film including n type impurities introduced therein. Whereas, the memory gate electrode MGA and the memory gate electrode MGB are each formed of a conductive film 9 such as an n type polysilicon film which is a polysilicon film doped with n type impurities.

The memory gate electrode MGA is formed in the following manner. The conductive film 9 formed of, for example, a silicon film, formed in such a manner as to cover the control gate electrode CGA over the semiconductor substrate 1 is anisotropically etched, namely, etched back. Then, the memory gate electrode MGA is formed in the following manner. At the side surface SG2A of the control gate electrode CGA opposite to the control gate electrode CGB side, namely, over the sidewall of the control gate electrode CGA, the conductive film 9 is left via the gate insulation film GI2A. Accordingly, the memory gate electrode MGA is formed in a sidewall spacer shape at the side surface SG2A of the control gate electrode CGA, namely, over the sidewall of the control gate electrode CGA via the gate insulation film GI2A.

The memory gate electrode MGB is formed in the following manner. The conductive film 9 formed of, for example, a silicon film, formed in such a manner as to cover the control gate electrode CGB over the semiconductor substrate 1 is anisotropically etched, namely, etched back. Then, the memory gate electrode MGB is formed in the following manner. At the side surface SG2B of the control gate electrode CGB opposite to the control gate electrode CGA side, namely, over the sidewall of the control gate electrode CGB, the conductive film 9 is left via the gate insulation film GI2B. Accordingly, the memory gate electrode MGB is formed in a sidewall spacer shape at the side surface SG2B of the control gate electrode CGB, namely, over the sidewall of the control gate electrode CGB via the gate insulation film GI2B.

The cap insulation film CP1A and the cap insulation film CP1B are each formed of an insulation film 5 such as a silicon oxide film. The cap insulation film CP2A and the cap insulation film CP2B are each formed of an insulation film 6 such as a silicon nitride film.

The cap insulation film CP2A is a protective film for protecting the control gate electrode CGA, a hard mask film for patterning the conductive film 4, and forming the control gate electrode CGA, or, a spacer film for adjusting the height of the top surface of the memory gate electrode MGB when the conductive film 9 is etched back to form the memory gate electrode MGA. The cap insulation film CP2B is a protective film for protecting the control gate electrode CGB, or, a hard mask film for patterning the conductive film 4, and forming the control gate electrode CGB, or, a spacer film for adjusting the height of the top surface of the memory gate electrode MGB when the conductive film 9 is etched back to form the memory gate electrode MGB.

The insulation film 5 is preferably a silicon oxide film, and the insulation film 6 is preferably a silicon nitride film. Then, as described later by reference to FIG. 11, when phosphoric acid having a temperature of preferably 140 to 170° C., namely, hot phosphoric acid is used as an etchant, it is possible to sufficiently increase the ratio of the etching rate of the insulation film 6 to the etching rate of the insulation film 5, namely, the selectivity.

As a result, the cap insulation film CP2A can be selectively etched and removed, and the cap insulation film CP1A between the cap insulation film CP2A and the control gate electrode CGA is not etched. This can prevent the cap insulation film CP2A from being released from the control gate electrode CGA. Whereas, the cap insulation film CP2B can be selectively etched and removed, and the cap insulation film CP1B between the cap insulation film CP2B and the control gate electrode CGB is not etched. This can prevent the cap insulation film CP2B from being released from the control gate electrode CGB.

Incidentally, for the material of the insulation film 6, an insulation film made of other materials functioning as a cap insulation film, a hard mask film, or a spacer film can be used in place of the silicon nitride film. Whereas, for the material of the insulation film 5, an insulation film made of other materials can be used in place of the silicon oxide film.

Alternatively, without forming the cap insulation film CP1A, the cap insulation film CP2A can be directly formed on the control gate electrode CGA; and without forming the cap insulation film CP1B, the cap insulation film CP2B can be directly formed on the control gate electrode CGB.

The cap insulation film CP1A and the cap insulation film CP1B can be each set as an insulation film having a thickness of, for example, about 5 nm. Whereas, the cap insulation film CP2A and the cap insulation film CP2B can be each set as an insulation film having a thickness of for example, about 50 to 100 nm.

The semiconductor region MS is a semiconductor region functioning as one of a source region or a drain region. The semiconductor region MD is a semiconductor region functioning as a source region or a drain region. Herein, a description will be given to an example in which the semiconductor region MS is a semiconductor region functioning as a source region, and the semiconductor region MD is a semiconductor region functioning as a drain region.

The semiconductor regions MS and MD are each formed of a semiconductor region doped with n type impurities, and each has a LDD (Lightly doped drain) structure. Namely, the semiconductor region MS functioning as a source region has an $n^-$ type semiconductor region 11a, and an $n^+$ type semiconductor region 12a having a higher impurity density than that of the $n^-$ type semiconductor region 11a. Whereas, the semiconductor region MD functioning as a drain region has an $n^-$ type semiconductor region 11b, and an $n^+$ type semiconductor region 12b having a higher impurity density than that of the $n^-$ type semiconductor region 11b. The $n^+$ type semiconductor region 12a is larger in junction depth and higher in impurity density than the $n^-$ type semiconductor region 11a. Whereas, the $n^+$ type semiconductor region 12b is larger in junction depth, and higher in impurity density than the $n^-$ type semiconductor region 11b.

Sidewall spacers SW1 are formed at the side surface SG1A of the control gate electrode CGA on the control gate electrode CGB side, the side surface SC1A of the cap insulation film CP2A on the control gate electrode CGB side, and the side surface of the memory gate electrode MGA opposite to the control gate electrode CGA side. Whereas, sidewall spacers SW1 are formed at the side surface SG1B of the control gate electrode CGB on the control gate electrode CGA side, the side surface SC1B of the cap insulation film CP2B on the control gate electrode CGA side, and the side surface of the memory gate electrode MGB opposite to the control gate electrode CGB side. The sidewall spacer SW1 is formed of an insulation film such as a silicon oxide film or a silicon nitride film, or a lamination film thereof.

Incidentally, as shown in FIG. 1, each sidewall spacer SW1 formed at the side surface SG1A of the control gate electrode CGA on the control gate electrode CGB side, and the side surface SC1A of the cap insulation film CP2A on the control gate electrode CGB side is referred to as a sidewall spacer SWA. Whereas, each sidewall spacer SW1 formed at the side surface SG1B of the control gate electrode CGB on the control gate electrode CGA side, and the side surface SC1B of the cap insulation film CP2B on the control gate electrode CGA side is referred to as a sidewall spacer SWB.

Further, the insulation film 10 may be interposed between the side surface SG1A of the control gate electrode CGA and the sidewall spacer SW1, between the side surface SC1A of the cap insulation film CP2A and the sidewall spacer SW1, and between the side surface of the memory gate electrode MGA and the sidewall spacer SW1. Whereas, the insulation film 10 may be interposed between the side surface SG1B of the control gate electrode CGB and the sidewall spacer SW1, between the side surface SC1B of the cap insulation film CP2B and the sidewall spacer SW1, and between the side surface of the memory gate electrode MGB and the sidewall spacer SW1.

Incidentally, in the present First Embodiment, the height position at the top end of the memory gate electrode MGA can be set equal to the height position of the top surface of the cap insulation film CP2A. The height position at the top end of the memory gate electrode MGB can be set equal to the height position of the top surface of the cap insulation film CP2B.

The $n^-$ type semiconductor region 11a as a source region is formed in a self-aligned manner with respect to the side surface of the memory gate electrode MGA, and is formed in a self-aligned manner with respect to the side surface of the memory gate electrode MGB. Whereas, the $n^+$ type semiconductor region 12a as a source region is formed in a self-aligned manner with respect to the side surface of the sidewall spacer SW1 formed at the side surface of the memory gate electrode MGA, and is formed in a self-aligned manner with respect to the side surface of the sidewall spacer SW1 formed at the side surface of the memory gate electrode MGB. Accordingly, the low-density $n^-$ type semiconductor region 11a is formed under the sidewall spacer SW1 formed at the side surface of the memory gate electrode MGA, and is formed under the sidewall spacer SW1 formed at the side surface of the memory gate electrode MGB. Whereas, the high-density $n^+$ type semiconductor region 12a is formed outside the low-density $n^-$ type semiconductor region 11a. Therefore, the low-density $n^-$ type semiconductor region 11a is formed in such a manner as to be adjacent to the channel region of the memory transistor. The high-density $n^+$ type semiconductor region 12a is formed in such a manner as to be in contact with the low-density $n^-$ type semiconductor region 11a, and to be separated from the channel region of the memory transistor by the $n^-$ type semiconductor region 11a.

The $n^-$ type semiconductor region 11b as a drain region is formed in a self-aligned manner with respect to the side surface SG1A of the control gate electrode CGA, and is formed in a self-aligned manner with respect to the side surface SG1B of the control gate electrode CGB. Whereas, the $n^+$ type semiconductor region 12b as a drain region is formed in a self-aligned manner with respect to the side surface of the sidewall spacer SW1 formed at the side surface SG1A of the control gate electrode CGA, and is formed in a self-aligned manner with respect to the side surface of the sidewall spacer SW1 formed at the side surface SG1B of the control gate electrode CGB. Accordingly, the low-density n⁻ type semiconductor region 11b is formed under the sidewall spacer SW1 formed at the side surface SG1A of the control gate electrode CGA, and is formed under the sidewall spacer SW1 formed at the side surface SG1B of the control gate electrode CGB. Whereas, the high-density n⁺ type semiconductor region 12b is formed between the two low-density n⁻ type semiconductor regions 11b formed on the control gate electrode CGA side and on the control gate electrode CGB side. In other words, the control transistor of the memory cell MCA and the control transistor of the memory cell MCB share the high-density n⁺ type semiconductor region 12b. Therefore, the low-density n⁻ type semiconductor region 11b is formed in such a manner as to be adjacent to the channel region of the control transistor. The high-density n⁺ type semiconductor region 12b is formed in such a manner as to be in contact with the low-density n⁻ type semiconductor region 11b, and to be separated from the channel region of the control transistor by the n⁻ type semiconductor region 11b.

Under the gate insulation film GI2A under the memory gate electrode MGA, the channel region of the memory transistor is formed. Under the gate insulation film GI1A under the control gate electrode CGA, the channel region of the control transistor is formed. Whereas, under the gate insulation film GI2B under the memory gate electrode MGB, the channel region of the memory transistor is formed. Under the gate insulation film GI1B under the control gate electrode CGB, the channel region of the control transistor is formed.

Over each top part, namely, each top surface of the n⁺ type semiconductor regions 12a and 12b, a metal silicide layer 13 is formed by a salicide (Salicide: Self Aligned Silicide) technology, or the like. The metal silicide layer 13 is formed of, for example, a cobalt silicide layer, a nickel silicide layer, or a platinum-added nickel silicide layer. The metal silicide layer 13 can reduce the diffusion resistance or the contact resistance.

Further, each metal silicide layer 13 may be formed entirely or partially over the top surface of the control gate electrode CGA, the top surface of the control gate electrode CGB, the top surface of the memory gate electrode MGA, and the top surface of the memory gate electrode MGB.

As described previously, the control gate electrode CGA, the cap insulation film CP2A, the memory gate electrode MGA, and the gate insulation film GI2A each extend in the Y axis direction, namely, in the gate width direction through over the active region AR1, over the element isolation region IR1, and over the active region AR2.

On the other hand, the control gate electrode CGB, the cap insulation film CP2B, the memory gate electrode MGB, and the gate insulation film GI2B each extend in the Y axis direction, namely, in the gate width direction through over the active region AR1, over the element isolation region IR1, and over the active region AR2.

Whereas, also in the active region AR2, as in the active region AR1, the semiconductor region MS including the n⁻ type semiconductor region 11a and the n⁺ type semiconductor region 12a, and the semiconductor region MD including the n⁻ type semiconductor region 11b and the n⁺ type semiconductor region 12b are formed. Further, also in the active region AR2, as in the active region AR1, at each top part, namely, each top surface of the n⁺ type semiconductor regions 12a and 12b, the metal silicide layer 13 is formed.

Thus, also over the active region AR2, as over the active region AR1, the memory cell MCA and the memory cell MCB are formed. The memory cell MCA and the memory cell MCB over the active region AR2 have the same structures as respective structures of the memory cell MCA and the memory cell MCB over the active region AR1, respectively, and hence will not be described.

Over the semiconductor substrate 1 including the memory cell MCA and the memory cell MCB formed thereover, there is formed an insulation film 14. The insulation film 14 is formed over the semiconductor substrate 1 in such a manner as to cover the control gate electrodes CGA and CGB, the cap insulation films CP2A and CP2B, the memory gate electrodes MGA and MGB, the gate insulation films GI2A and GI2B, and the sidewall spacers SW1. The insulation film 14 is formed of, for example, a silicon nitride film.

Over the insulation film 14, there is formed an interlayer insulation film 15. The interlayer insulation film 15 is formed over the active region AR1 in such a manner as to cover the control gate electrodes CGA and CGB, the cap insulation films CP2A and CP2B, the memory gate electrodes MGA and MGB, and the sidewall spacer SW1. The interlayer insulation film 15 is formed of, for example, a single film of a silicon oxide film, or a lamination film of a silicon nitride film and a silicon oxide film. The top surface of the interlayer insulation film 15 is planarized.

Incidentally, the interlayer insulation film 15 is also formed over the element isolation region IR1, and over the active region AR2 in such a manner as to cover the control gate electrodes CGA and CGB, the cap insulation films CP2A and CP2B, the memory gate electrodes MGA and MGB, the gate insulation films GI2A and GI2B, and the sidewall spacers SW1.

Over the active region AR1, in the interlayer insulation film 15, there is formed an opening, namely a contact hole CNT1 penetrating through the interlayer insulation film 15, and reaching the active region AR1, namely, the p type well PW1, between the control gate electrode CGA and the control gate electrode CGB. Further, in the inside of the contact hole CNT1, there is formed a plug PG1 formed of a conductive film embedded in the contact hole CNT1, and electrically coupled with the active region AR1. At the bottom part of the contact hole CNT1, there is exposed a part of the metal silicide layer 13 at the top surface of the n⁺ type semiconductor region 12b in the semiconductor region MD. To the exposed portion, the plug PG1 filling the contact hole CNT1 is electrically coupled.

The plug PG1 is formed of a thin barrier conductive film BR1 formed at the bottom part and the side surface of the contact hole CNT1, and a main conductive film MCF1 formed over the barrier conductive film BR1 in such a manner as to fill the contact hole CNT1. The barrier conductive film BR1 can be set as, for example, a titanium (Ti) film or a titanium nitride (TiN) film, or a lamination film thereof. The main conductive film MCF1 can be set as a tungsten (W) film.

Further, although all are not shown, the contact hole CNT1 and the plug PG1 may be formed over the n⁺ type semiconductor regions 12a and 12b, over the control gate electrodes CGA and CGB, over the memory gate electrodes MGA and MGB, or the like. In this case, at the bottom part of the contact hole CNT1, there is exposed, for example, a part of the metal silicide layer 13 at each top surface of the n⁺ type semiconductor regions 12a and 12b, a part of the metal silicide layer 13 at each top surface of the control gate electrodes CGA and CGB, a part of the metal silicide layer 13 at each top surface of the memory gate electrodes MGA and MGB, or the like. Then, to the exposed portion, the plug PG1 is electrically coupled.

Incidentally, also in the active region AR2, in the interlayer insulation film 15, there is formed an opening, namely, a contact hole CNT2 (see FIG. 2) penetrating through the interlayer insulation film 15, and reaching the active region AR2 between the control gate electrode CGA and the control gate electrode CGB. Whereas, in the inside of the contact hole CNT2, there is formed a plug PG2 formed of a conductive film embedded in the contact hole CNT2, and electrically coupled with the active region AR2. The plug PG2 has the same structure as that of the plug PG1, and hence will not be described.

Over the interlayer insulation film 15 including the plug PG1 embedded therein, there is formed a first-layer wire as a damascene wire as an embedded wire including, for example, copper (Cu) as a main conductive material. Over the first-layer wire, an upper-layer wire is also formed as a damascene wire, but, herein, is not shown, and not described. Further, the first-layer wire and upper-layer wires are not limited to damascene wires, can also be formed by patterning a wiring conductive film, and can be set as, for example, a tungsten (W) wire or an aluminum (Al) wire.

In the present First Embodiment, in the main surface 1a, the end EP1A at the top surface of the cap insulation film CP2A on the control gate electrode CGB side is situated closer to the memory gate electrode MGA side than the side surface SG1A of the control gate electrode CGA on the control gate electrode CGB side. Whereas, in the main surface 1a, the end EP1B at the top surface of the cap insulation film CP2B on the control gate electrode CGA side is situated closer to the memory gate electrode MGB side than the side surface SG1B of the control gate electrode CGB on the control gate electrode CGA side.

Further, as shown in FIG. 3, in the present First Embodiment, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR1. The bottom part of the trench part GR1 is set as the main surface 1a of the semiconductor substrate 1. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR1 becomes equal to the sum of the thickness TH1 and the thickness TH2. Further, the width in the X axis direction, namely, the gate length direction at the upper end of the trench part GR1 is referred to as a width WD1.

At this step, the distance WD0 can be set at, for example, about 150 to 200 nm. Whereas, the thickness TH1 can be set at, for example, about 80 to 100 nm, and the thickness TH2 can be set at, for example, about 50 to 100 nm. At this step, the depth of the trench part GR1 can be set at, for example, about 130 to 200 nm.

With such a structure, the width WD1 is larger than the width WD0 between the side surface SG1A of the control gate electrode CGA on the control gate electrode CGB side and the side surface SG1B of the control gate electrode CGB on the control gate electrode CGA side. Accordingly, the width WD1 can be set larger than that when along the X axis direction, namely, the gate length direction, the end EP1A is situated at the same position as that of the side surface SG1A, and the end EP1B is situated at the same position as that of the side surface SG1B. This makes it easy for the raw materials of the interlayer insulation film 15 to reach the inside of the trench part GR1 when the interlayer insulation film 15 is formed. Accordingly, it is possible to prevent the formation of a cavity in the interlayer insulation film 15 in the inside of the trench part GR1. Then, it is possible to prevent the occurrence of the following: the barrier conductive film BR1 or the main conductive film MCF1 forming the plug PG1 and the plug PG2 is formed in the resulting cavity, resulting in an electrical short circuit between the plug PG1 and the plug PG2.

Incidentally, the foregoing effects are also produced when along the X axis direction, namely, the gate length direction, the end EP1A is situated closer to the memory gate electrode MGA side than the side surface SG1A, but the end EP1B is situated at the same position as that of the side surface SG1B. Further, the foregoing effects are also produced when along the X axis direction, namely, the gate length direction, the end EP1B is situated closer to the memory gate electrode MGB side than the side surface SG1B, but the end EP1A is situated at the same position as that of the side surface SG1A. Therefore, along the X axis direction, namely, the gate length direction, the end EP1A is situated closer to the memory gate electrode MGA side than the side surface SG1A, but the end EP1B is not required to be situated closer to the memory gate electrode MGB side than the side surface SG1B. Alternatively, along the X axis direction, namely, the gate length direction, the end EP1B is situated closer to the memory gate electrode MGB side than the side surface SG1B, but the end EP1A is not required to be situated closer to the memory gate electrode MGA side than the side surface SG1A.

Whereas, in the present First Embodiment, the width of the cap insulation film CP2A in the X axis direction, namely, the gate length direction is smaller than the width of the control gate electrode CGA in the X axis direction, namely, the gate length direction. Namely, the side surface SC1A of the cap insulation film CP2A on the control gate electrode CGB side is set back from the side surface SG1A of the control gate electrode CGA on the control gate electrode CGB side toward the memory gate electrode MGA side. Whereas, the side surface SC2A of the cap insulation film CP2A on the memory gate electrode MGA side is set back from the side surface SG2A of the control gate electrode CGA on the memory gate electrode MGA side toward the control gate electrode CGB side. Then, the memory gate electrode MGA is formed at the side surface SC2A of the cap insulation film CP2A on the memory gate electrode MGA side, and the side surface SG2A of the control gate electrode CGA on the memory gate electrode MGA side via the gate insulation film GI2A.

Whereas, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B on the control gate electrode CGA side is set back from the side surface SG1B of the control gate electrode CGB on the control gate electrode CGA side toward the memory gate electrode MGB side. Whereas, the side surface SC2B of the cap insulation film CP2B on the memory gate electrode MGB side is set back from the side surface SG2B of the control gate electrode CGB on the memory gate electrode MGB side toward the control gate electrode CGA side. Then, the memory gate electrode MGB is formed at the side surface SC2B of the cap insulation film CP2B on the memory gate electrode MGB side, and the side surface SG2B of the control gate electrode CGB on the memory gate electrode MGB side via the gate insulation film GI2B.

Incidentally, the distance by which the side surface SC1A of the cap insulation film CP2A is set back from the side surface SG1A of the control gate electrode CGA, namely, the set-back amount can be set at, for example, about 5 to 10 nm. Further, the distance by which the side surface SC1B of the cap insulation film CP2B is set back from the side surface SG1B of the control gate electrode CGB, namely, the set-back amount can be set at, for example, about 5 to 10 nm. The set-back amount corresponds to half the difference between the width WD1 and the distance WD0 shown in FIG. 3. Namely, the difference between the width WD1 and the distance WD0 shown in FIG. 3 can be set at, for example, about 10 to 20 nm.

Further, when the film thickness of the silicon oxide film 8a, the silicon nitride film 8b, and the silicon oxide film 8c is smaller relative to the set-back amount, for example, as shown in FIG. 4, the upper layer part of the memory gate electrode MGA extends over the control gate electrode CGA, namely, is formed over the control gate electrode CGA. Further, although not shown, the same also applies to the memory cell MCB.

In the present First Embodiment, the side surface SC2A of the cap insulation film CP2A is set back from the side surface SG2A of the control gate electrode CGA; and the side surface SC2B of the cap insulation film CP2B is set back from the side surface SG2B of the control gate electrode CGB. Accordingly, the area of the top surface of the memory gate electrode MGA and the area of the top surface of the memory gate electrode MGB increase. This facilitates the formation of the metal silicide layers 13 over the top surface of the memory gate electrode MGA and the top surface of the memory gate electrode MGB. Further, there is caused an increase in the area of the metal silicide layers 13 formed over the top surface of the memory gate electrode MGA and the top surface of the memory gate electrode MGB. Therefore, it is possible to reduce the electrical resistance between the plug (not shown) electrically coupled with the memory gate electrode MGA and the memory gate electrode MGA, and the electrical resistance between the plug (not shown) electrically coupled with the memory gate electrode MGB and the memory gate electrode MGB.

Figures 5, 6:
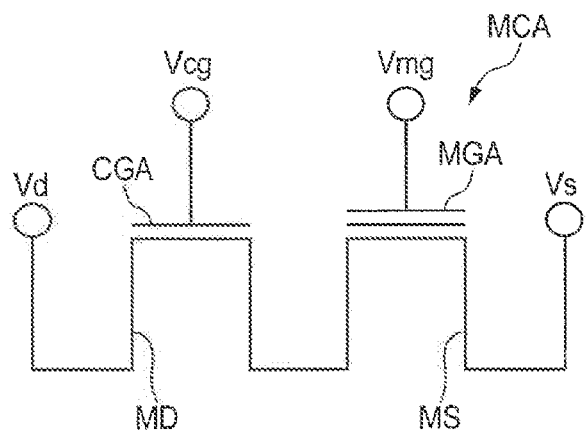
FIG. 5 is an equivalent circuit diagram of a memory cell in the semiconductor device of First Embodiment.
FIG. 6 is a table showing one example of the conditions for applying voltages to respective sites of the memory cell at the time of "write", "erase", and "read"

Then, a description will be given to the operation of the memory cell MCA and the operation of the memory cell MCB in the semiconductor device of the present First Embodiment. FIG. 5 is an equivalent circuit diagram of a memory cell in the semiconductor device of First Embodiment.

Below, a description will be given to the operation of the memory cell MCA as a representative of the memory cell MCA and the memory cell MCB. However, the memory cell MCB also has the same circuit configuration as the circuit configuration of the memory cell MCA. Accordingly, the operation of the memory cell MCB is also the same as the operation of the memory cell MCA, and hence will not be described.

FIG. 6 is a table showing one example of the conditions for applying voltages to respective sites of the memory cell at the time of "write", "erase", and "read". In the table of FIG. 6, there are described the voltage Vmg to be applied to the memory gate electrode MGA, the voltage Vs to be applied to the semiconductor region MS, the voltage Vcg to be applied to the control gate electrode CGA, and the voltage Vd to be applied to the semiconductor region MD at the times of "write", "erase" and "read", respectively. Further, in the table of FIG. 6, there are described the voltages Vb to be applied to the p type well PW1 at respective times of "write", "erase", and "read". Incidentally, those shown in the table of FIG. 6 are preferable examples of the voltage application conditions, are not exclusive, and if required, may be variously changed. Further, in the present First Embodiment, injection of electrons into the silicon nitride film 8b which is the charge accumulation part in the gate insulation film GI2A of the memory transistor is defined as "write", and injection of holes or positive holes is defined as "erase". Further, the source voltage Vdd is set at 1.5 V.

As the write method, there can be used hot electron write referred to as a so-called Source Side Injection: SSI method. For example, the voltages as shown in the row of "write" of FIG. 6 are applied to respective sites of the memory cell MCA to perform write. Thus, electrons are injected into the silicon nitride film 8b in the gate insulation film GI2A of the memory cell MCA. Hot electrons are generated in the channel region under between the memory gate electrode MGA and the control gate electrode CGA, and are injected into the silicon nitride film 8b which is the charge accumulation part in the gate insulation film GI2A under the memory gate electrode MGA. The injected hot electrons are trapped at the trap level in the silicon nitride film 8b in the gate insulation film GI2A. This results in an increase in threshold voltage (Vth) of the memory transistor.

As the erase method, there can be used a hot hole injection erase method by the Band-To-Band Tunneling: BTBT phenomenon. In other words, holes or positive holes generated by the BTBT phenomenon are injected into the charge accumulation part, namely, the silicon nitride film 8b in the gate insulation film GI2A, thereby to perform erase. For example, the voltages as shown in the row of "erase" of FIG. 6 are applied to respective sites of the memory cell MCA to perform erase. Thus, holes are generated by the BTBT phenomenon to accelerate the electric field. Accordingly, holes are injected into the silicon nitride film 8b in the gate insulation film GI2A of the memory cell MCA. This results in the reduction of the threshold voltage of the memory transistor.

For read, for example, the voltages as shown in the row of "read" of FIG. 6 are applied to respective sites of the memory cell MCA to perform read. The voltage Vmg to be applied to the memory gate electrode MGA at the time of read is set at a value between the threshold voltage of the memory transistor in a write state and the threshold voltage of the memory transistor in an erase state. This enables the discrimination between the write state and the erase state.

<Manufacturing Method of Semiconductor Device>

Then, a description will be given to the manufacturing method of the semiconductor device of the present First Embodiment.

FIGS. 7 to 24 are each an essential part cross sectional view of the semiconductor device of First Embodiment during a manufacturing step; and FIGS. 7 to 24 each show the same cross section as the cross section shown in FIG. 1, and are each a cross-sectional view corresponding to the cross-sectional view along line A-A of FIG. 2.

Further, in the present First Embodiment, a description will be given to the case where n channel type control transistors and memory transistors are formed. However, it is also possible to form p channel type control transistors and memory transistors by inverting the conductivity type.

Figure 7:
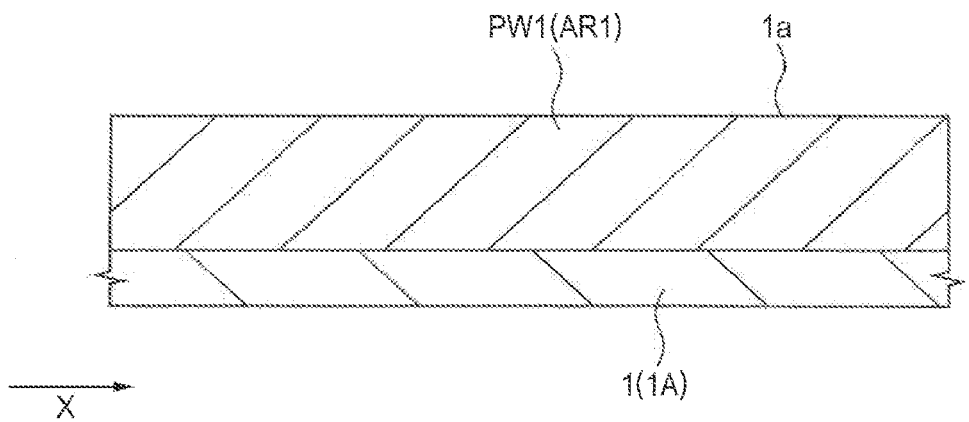
FIG. 7 is an essential part cross sectional view of the semiconductor device of First Embodiment during a manufacturing step.

As shown in FIG. 7, first, there is provided or made available a semiconductor substrate 1 as a semiconductor wafer formed of, for example, a p type single crystal silicon having a specific resistance of about 1 to 10 Ωcm.

At this step, in the memory cell region 1A on the main surface 1a side of the semiconductor substrate 1, as shown in FIG. 2, in plan view, an element isolation film 2 to be an element isolation region IR1 is formed between the active region AR1 and the active region AR2. The element isolation film 2 is formed of an insulator such as silicon oxide, and can be formed by, for example, a STI (Shallow Trench Isolation)

method or a LOCOS (Local Oxidization of Silicon) method. For example, in the element isolation region IR1, an element isolating trench is formed. Then, in the element isolating trench, an insulation film formed of, for example, silicon oxide is embedded. As a result, the element isolation film 2 can be formed.

Further, in the memory cell region 1A on the main surface 1a side of the semiconductor substrate 1, in the active region AR1, there is formed a p type well PW1. The p type well PW1 can be formed by ion-implanting p type impurities such as boron (B) into the semiconductor substrate 1, or other procedures. The p type well PW1 is formed from the main surface 1a to a prescribed depth of the semiconductor substrate 1. Incidentally, although not shown, also in the active region AR2, as in the active region AR1, the p type well PW1 is formed.

Herein, in the present First Embodiment, desirably, channel dope ion implantation is not performed on the p type well PW1 of the semiconductor substrate 1. Alternatively, even when channel dope ion implantation is performed, desirably, the dose amount is reduced to reduce the impurity density in the channel region.

Then, by wet etching using, for example, a hydrofluoric acid (HF) aqueous solution, a natural oxide film over the surface of the semiconductor substrate 1 is removed, and the surface of the semiconductor substrate 1 is cleaned. Thus, the surface of the semiconductor substrate 1 is purified. As a result, the surface of the semiconductor substrate 1, namely, the surface of the p type well PW1 is exposed.

Figure 8:
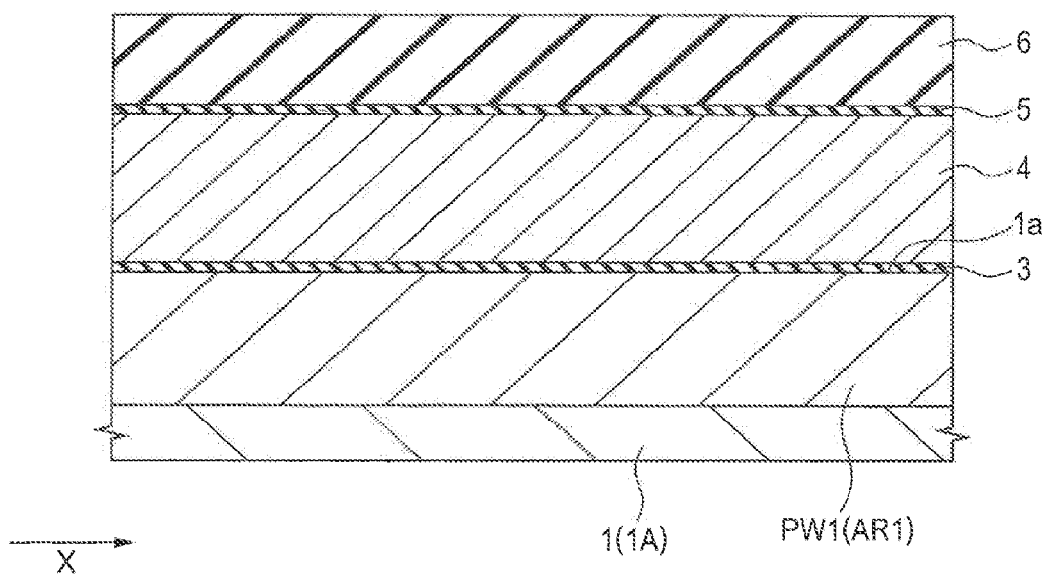
FIG. 8 is an essential part cross sectional view of the semiconductor device of First Embodiment during a manufacturing step.

Then, as shown in FIG. 8, entirely over the main surface 1a of the semiconductor substrate 1, an insulation film 3, a conductive film 4, an insulation film 5, and an insulation film 6 are formed sequentially from the bottom.

First, entirely over the main surface 1a of the semiconductor substrate 1, the insulation film 3 is formed, namely, deposited. Specifically, in the memory cell region 1A on the main surface 1a side of the semiconductor substrate 1, over the main surface 1a of the semiconductor substrate 1 including over the active region AR1 and over the active region AR2, there is formed the insulation film 3. The examples of the material usable as the insulation film 3 are as described previously. Further, the insulation film 3 can be formed using a sputtering method, an Atomic Layer Deposition: ALD method, a Chemical Vapor Deposition: CVD method, or the like.

Incidentally, although not shown, the following procedure is also possible: before the formation of the insulation film 3, over the surface of the semiconductor substrate 1, namely, over the surface of the p type well PW1, an interface layer formed of a silicon oxide film or the like is formed using a thermal oxidation method or the like; then, over the interface layer, the insulation film 3 is formed.

Then, entirely over the main surface 1a of the semiconductor substrate 1, in other words, over the insulation film 3, the conductive film 4 is formed, namely, deposited. The conductive film 4 serves as the control gate electrode CGA of the memory cell MCA, and the control gate electrode CGB of the memory cell MCB.

The conductive film 4 is formed of a polycrystal silicon film, namely, a polysilicon film having a thickness of, for example, about 80 to 100 nm, and can be formed using a CVD method or the like. For deposition, the following procedure is also possible: the conductive film 4 is formed as an amorphous silicon film; then, the amorphous silicon film is formed into a polycrystal silicon film by the subsequent heat treatment.

The conductive film 4 is more preferably reduced in resistivity by being doped with n type impurities such as phosphorus (P) or arsenic (As), or p type impurities such as boron (B). The impurities can be introduced during deposition or after deposition of the conductive film 4. When impurities are introduced during deposition of the conductive film 4, inclusion of a doping gas for depositing the conductive film 4 enables the deposition of the conductive film 4 doped with impurities. On the other hand, when impurities are introduced after deposition of the silicon film, intentionally, a silicon film is deposited without being doped with impurities. Then, impurities are introduced into the silicon film by an ion-implantation method or the like. As a result, it is possible to form a conductive film 4 doped with impurities.

Then, over the conductive film 4, an insulation film 5 is formed. The insulation film 5 serves as the cap insulation film CP1A (see FIG. 9 described later), and the cap insulation film CP1B (see FIG. 9 described later).

The surface of the conductive film 4 formed of, for example, a silicon film is thermally oxidized. As a result, it is possible to form an insulation film 5 formed of a silicon oxide film having a thickness of, for example, about 6 nm. Alternatively, it is also possible to form the insulation film 5 formed of a silicon oxide film using a CVD method in place of thermal oxidation of the surface of the conductive film 4 formed of a silicon film.

Further, for the materials of the insulation film 5, there can be used insulation films formed of other materials in place of the silicon oxide film. Alternatively, the insulation film 6 can be formed directly on the conductive film 4 without forming the insulation film 5.

Then, over the insulation film 5, there is formed the insulation film 6. The insulation film 6 is a film functioning as a cap insulation film, a hard mask film, or a spacer film, and serves as the cap insulation film CP2A (see FIG. 9 described later), and the cap insulation film CP2B (see FIG. 9 described later).

Using, for example, a CVD method, there can be formed the insulation film 6 formed of a silicon nitride film. Incidentally, for the materials of the insulation film 6, there can be used insulation films formed of other materials functioning as a cap insulation film, a hard mask film, or a spacer film in place of a silicon nitride film.

Figure 9:
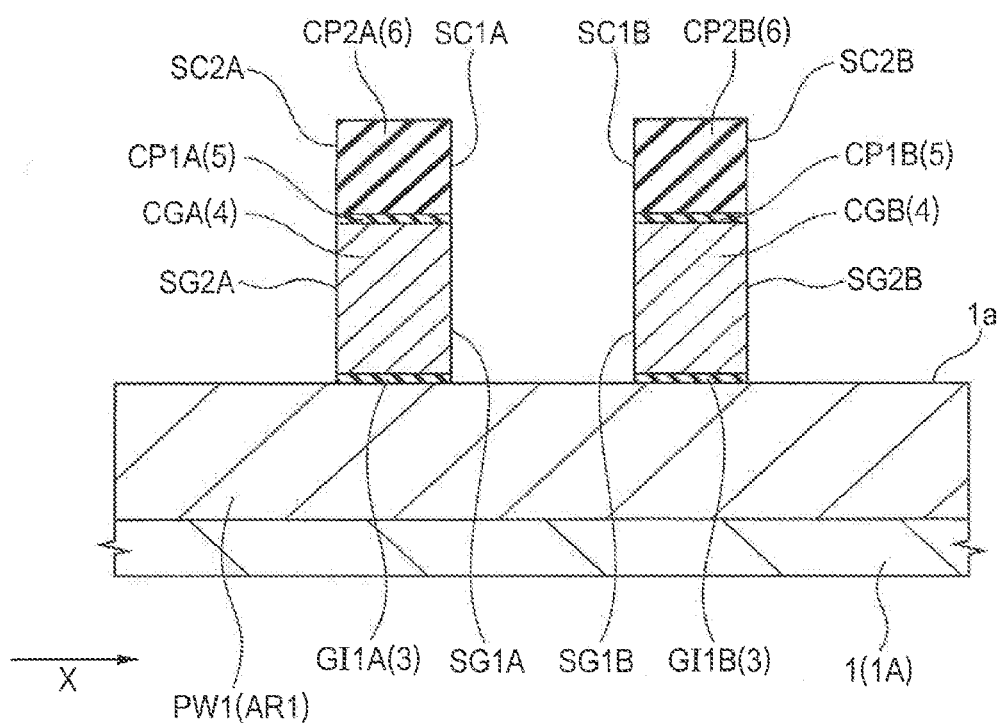
FIG. 9 is an essential part cross sectional view of the semiconductor device of First Embodiment during a manufacturing step.

Incidentally, the cap insulation film CP2A and the cap insulation film CP2B formed by patterning the insulation film 6 in a step described later by reference to FIG. 9 are subjected to slimming in a step described later by reference to FIG. 11, resulting in a decrease in thickness. Further, the cap insulation film CP2A and the cap insulation film CP2B after slimming each have a thickness of, for example, about 50 to 100 nm. Therefore, the thickness of the insulation film 6 is adjusted so that the thickness of the cap insulation film CP2A and the thickness of the cap insulation film CP2B each have a desired thickness after slimming.

Thus, as shown in FIG. 8, over the main surface 1a of semiconductor substrate 1, there are deposited the insulation film 3, the conductive film 4, the insulation film 5, and the insulation film 6.

Then, the insulation film 6, the insulation film 5, the conductive film 4, and the insulation film 3 are patterned by etching such as dry etching.

First, over the insulation film 6, a photoresist pattern (not shown) is formed using a photolithography method. Then, using the photoresist pattern as an etching mask, the insulation film 6, the insulation film 5, the conductive film 4, and the insulation film 3 are patterned by etching such as dry etching. Then, the photoresist pattern is removed.

Thus, the insulation film 6, the insulation film 5, the conductive film 4, and the insulation film 3 are patterned. As a result, as shown in FIG. 9, the control gate electrode CGA and the control gate electrode CGB each formed of the conductive film 4, spaced from each other along the X axis direction, namely, the gate length direction are formed over the main surface 1a of the semiconductor substrate 1. Whereas, there is formed the gate insulation film GI1A formed of the insulation film 3 between the control gate electrode CGA and the semiconductor substrate 1; and there is formed the gate insulation film GI1B formed of the insulation film 3 between the control gate electrode CGB and the semiconductor substrate 1. Then, there is formed the cap insulation film CP2A formed of the insulation film 6 over the control gate electrode CGA; and there is formed the cap insulation film CP2B formed of the insulation film 6 over the control gate electrode CGB. Further, there is formed the cap insulation film CP1A formed of the insulation film 5 between the control gate electrode CGA and the cap insulation film CP2A; and there is formed the cap insulation film CP1B formed of the insulation film 5 between the control gate electrode CGB and the cap insulation film CP2B.

At this step, as shown in FIG. 2, the control gate electrode CGA and the control gate electrode CGB each extend along the Y axis direction through over the active region AR1, over the element isolation region IR1, and over the active region AR2. Whereas, the cap insulation film CP2A and the cap insulation film CP2B each extend along the Y axis direction through over the active region AR1, over the element isolation region IR1, and over the active region AR2.

As shown in FIG. 9, the side surface of the control gate electrode CGA on the control gate electrode CGB side is referred to as a side surface SG1A. The side surface of the control gate electrode CGA opposite to the control gate electrode CGB side is referred to as a side surface SG2A. Further, the side surface of the control gate electrode CGB on the control gate electrode CGA side is referred to as a side surface SG1B. The side surface of the control gate electrode CGB opposite to the control gate electrode CGA side is referred to as a side surface SG2B. On the other hand, the side surface of the cap insulation film CP2A on the control gate electrode CGB side is referred to as a side surface SC1A. The side surface of the cap insulation film CP2A opposite to the control gate electrode CGB side is referred to as a side surface SC2A. Still further, the side surface of the cap insulation film CP2B on the control gate electrode CGA side is referred to as a side surface SC1B. The side surface of the cap insulation film CP2B opposite to the control gate electrode CGA side is referred to as a side surface SC2B.

Figure 10:
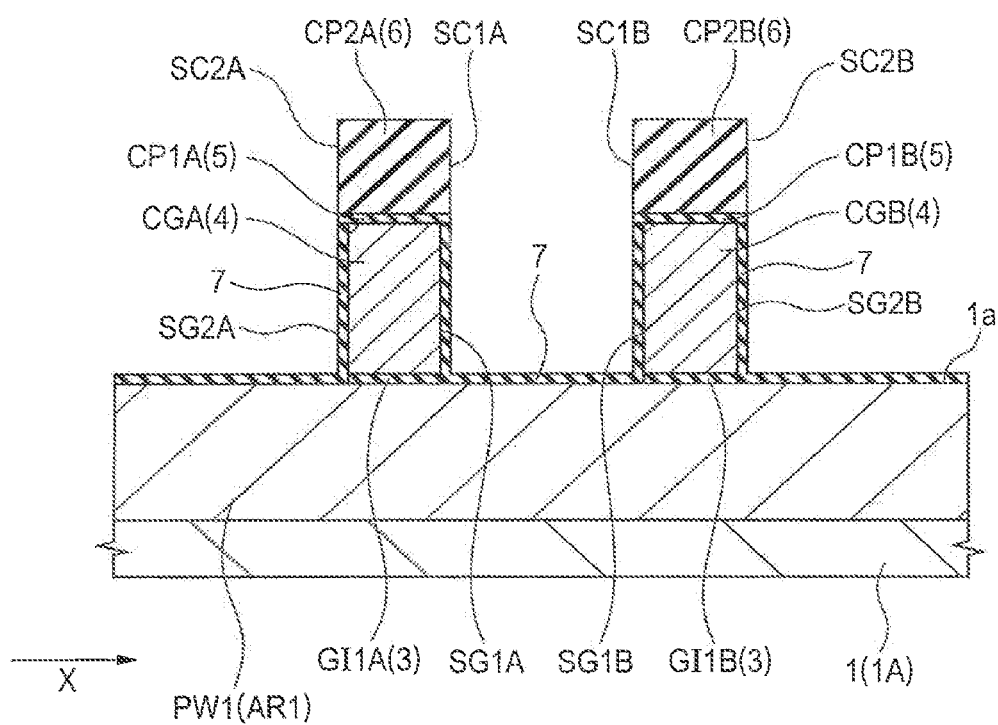
FIG. 10 is an essential part cross sectional view of the semiconductor device of First Embodiment during a manufacturing step.

Then, as shown in FIG. 10, at the side surface of the control gate electrode CGA and the side surface of the control gate electrode CGB, there is formed an insulation film 7. The insulation film 7 is not removed when the cap insulation film CP2A and the cap insulation film CP2B are slimmed by an etchant in a step described later by reference to FIG. 11, and is for protecting the control gate electrode CGA and the control gate electrode CGB.

The side surface of the control gate electrode CGA and the side surface of the control gate electrode CGB formed of, for example, a silicon film are thermally oxidized. As a result, it is possible to form the insulation film 7 formed of a silicon oxide film, and having a thickness of, for example, about 6 nm, at the side surface of the control gate electrode CGA and the side surface of the control gate electrode CGB.

Further, it is essential only that the material for the insulation film 7 is not removed when the cap insulation film CP2A and the cap insulation film CP2B are slimmed by an etchant in a step described later by reference to FIG. 11. Therefore, for the materials of the insulation film 7, insulation films formed of other materials may be used in place of the silicon oxide film according to the materials for the cap insulation film CP2A and the cap insulation film CP2B, and the etchant.

Figure 11:
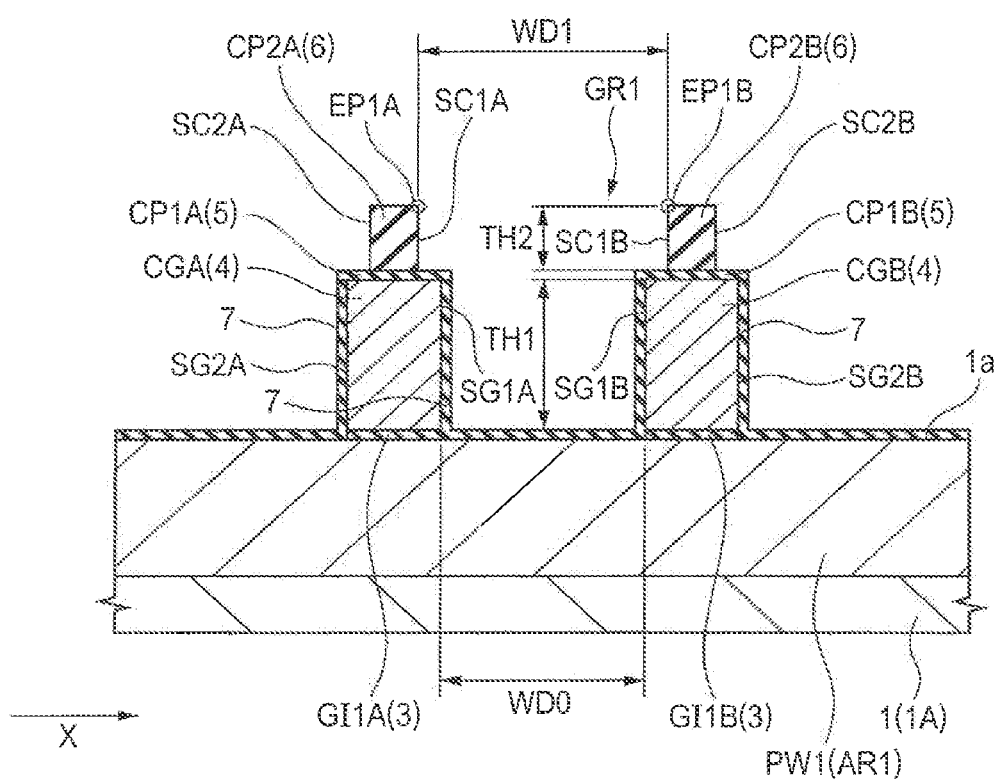
FIG. 11 is an essential part cross sectional view of the semiconductor device of First Embodiment during a manufacturing step.

Then, as shown in FIG. 11, the cap insulation film CP2A and the cap insulation film CP2B are slimmed by an etchant. For example, when the insulation film 5 and the insulation film 7 are silicon oxide films, and the insulation film 6 is a silicon nitride film, etching is performed using phosphoric acid having a temperature of, for example, about 140 to 170° C., namely, hot phosphoric acid. As a result, it is possible to sufficiently increase the ratio of the etching rate of the insulation film 6 to the etching rate of the insulation film 5 and the insulation film 7, namely, the selectivity. For this reason, the cap insulation film CP2A and the cap insulation film CP2B can be selectively etched.

By performing such slimming, a portion of the cap insulation film CP2A exposed at the side surface SC1A on the control gate electrode CGB side, and a portion of the cap insulation film CP2A exposed at the side surface SC2A opposite to the control gate electrode CGB side are etched and removed. Whereas, a portion of the cap insulation film CP2B exposed at the side surface SC1B on the control gate electrode CGA side, and a portion of the cap insulation film CP2B exposed at the side surface SC2B opposite to the control gate electrode CGA side are etched and removed.

As a result, the end EP1A at the top surface of the cap insulation film CP2A on the control gate electrode CGB side is situated closer to the opposite side to the control gate electrode CGB side than the side surface SG1A of the control gate electrode CGA on the control gate electrode CGB side. Whereas, the end EP1B at the top surface of the cap insulation film CP2B on the control gate electrode CGA side is situated closer to the opposite side to the control gate electrode CGA side than the side surface SG1B of the control gate electrode CGB on the control gate electrode CGA side.

As shown in FIG. 11, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR1. The bottom part of the trench part GR1 is the main surface 1a of the semiconductor substrate 1. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR1 becomes equal to the sum of the thickness TH1 and the thickness TH2. Further, the width in the X axis direction, namely, the gate length direction at the upper end of the trench part GR1 is referred to as a width WD1.

In the present First Embodiment, after performing the steps described by reference to FIG. 11, the width of the cap insulation film CP2A in the X axis direction, namely, the gate length direction is smaller than the width of the control gate electrode CGA in the X axis direction, namely, the gate length direction. Namely, the side surface SC1A of the cap insulation film CP2A on the control gate electrode CGB side is set back from the side surface SG1A of the control gate electrode CGA on the control gate electrode CGB side toward the opposite side to the control gate electrode CGB side. Whereas, the side surface SC2A of the cap insulation film CP2A opposite to the control gate electrode CGB side is set back from the side surface SG2A of the control gate electrode CGA opposite to the control gate electrode CGB side toward the control gate electrode CGB side.

Whereas, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B on the control gate electrode CGA side is set back from the side surface SG1B of the control gate electrode CGB on the control gate electrode CGA side toward the opposite side to the control gate electrode CGA side. Whereas, the side surface SC2B of the cap insulation film CP2B opposite to the control gate electrode CGA side is set back from the side surface SG2B of the control gate electrode CGB opposite to the control gate electrode CGA side toward the control gate electrode CGA side.

Incidentally, the cap insulation film CP1A between the cap insulation film CP2A and the control gate electrode CGA is not etched. This can prevent the cap insulation film CP2A from being peeled from the control gate electrode CGA. Whereas, the cap insulation film CP1B between the cap insulation film CP2B and the control gate electrode CGB is not etched. This can prevent the cap insulation film CP2B from being peeled from the control gate electrode CGB.

Alternatively, in the step described by reference to FIG. 11, one of the cap insulation film CP2A and the cap insulation film CP2B is covered with, for example, a photoresist pattern. As a result, it is also possible not to perform slimming.

Figure 12:
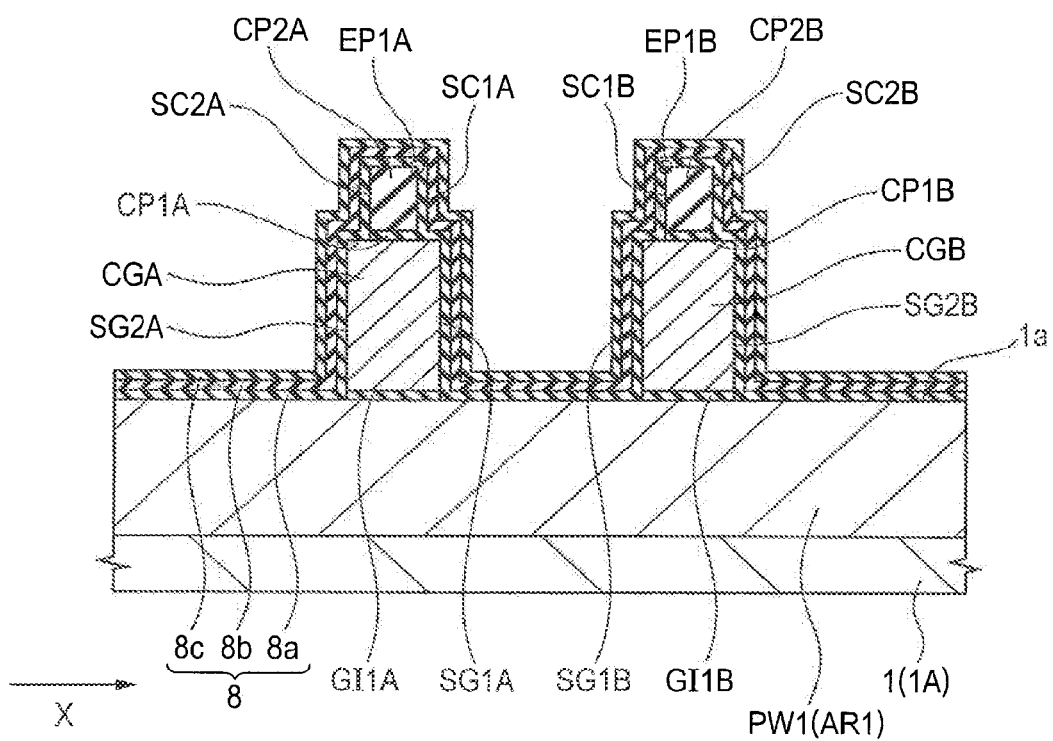
FIG. 12 is an essential part cross sectional view of the semiconductor device of First Embodiment during a manufacturing step.

Then, the surface of the semiconductor substrate 1 is cleaned. As a result, the surface of the semiconductor substrate 1 is purified. Then, as shown in FIG. 12, entirely over the main surface 1a of the semiconductor substrate 1, there is formed an insulation film 8 for the gate insulation film of a memory transistor. As described previously, the insulation film 8 is a lamination film including, for example, a silicon oxide film 8a, a silicon nitride film 8b as a charge accumulation part over the silicon oxide film 8a, and a silicon oxide film 8c over the silicon nitride film 8b.

Of the insulation film 8, the silicon oxide film 8a can be formed by an oxidation treatment such as a thermal oxidation treatment. As the thermal oxidation treatment, there can be used ISSG (In Situ Steam Generation) oxidation. Whereas, of the insulation film 8, the silicon nitride film 8b can be formed by, for example, a CVD method. Further, of the insulation film 8, the silicon oxide film 8c can be formed by, for example, a CVD method.

First, over the exposed portions of the main surface 1a of the semiconductor substrate 1, the surface of the control gate electrode CGA, the surface of the control gate electrode CGB, the surface of the cap insulation film CP2A, and the surface of the cap insulation film CP2B, the silicon oxide film 8a is formed by a thermal oxidation treatment such as ISSG oxidation. At this step, the exposed portions of the main surface 1a of the semiconductor substrate 1, the surface of the control gate electrode CGA, and the surface of the control gate electrode CGB are oxidized. The thickness of the silicon oxide film 8a can be set at, for example, about 5 nm. Alternatively, as another form, the silicon oxide film 8a can also be formed by an ALD method.

Incidentally, in FIG. 12, for easy understanding, portions of the cap insulation films CP1A and CP1B, the insulation film 7 formed of a silicon oxide film, and the silicon oxide film 8a are integrated to be shown as the silicon oxide film 8a.

Then, over the silicon oxide film 8a, the silicon nitride film 8b is formed by a CVD method. Further, over the silicon nitride film 8b, the silicon oxide film 8c is formed by a CVD method or thermal oxidation, or both thereof. The thickness of the silicon nitride film 8b can be set at, for example, about 5 nm. The thickness of the silicon oxide film 8c can be set at, for example, about 5 nm. As a result, it is possible to form the insulation film 8 formed of a lamination film of the silicon oxide film 8a, the silicon nitride film 8b, and the silicon oxide film 8c.

The insulation film 8 functions as the gate insulation film of the memory gate electrode MGA, and the gate insulation film of the memory gate electrode MGB formed in a step described later by reference to FIG. 14, and has a charge holding function. The insulation film 8 has a structure in which the silicon nitride film 8b as a charge accumulation part is sandwiched between the silicon oxide films 8a and 8c as charge block layers. Then, the potential barrier height of the charge block layer formed of the silicon oxide film 8a or 8c becomes higher than the potential barrier height of the charge accumulation part formed of the silicon nitride film 8b.

Incidentally, in the present First Embodiment, as an insulation film having a trapping level, the silicon nitride film 8b is used. The case using the silicon nitride film 8b is preferable in terms of the reliability. However, the insulation films each having a trapping level are not limited to a silicon nitride film. There can be used a high dielectric constant film having a higher dielectric constant than that of a silicon nitride film, such as an aluminum oxide (alumina) film, a hafnium oxide film, or a tantalum oxide film.

Figure 13:
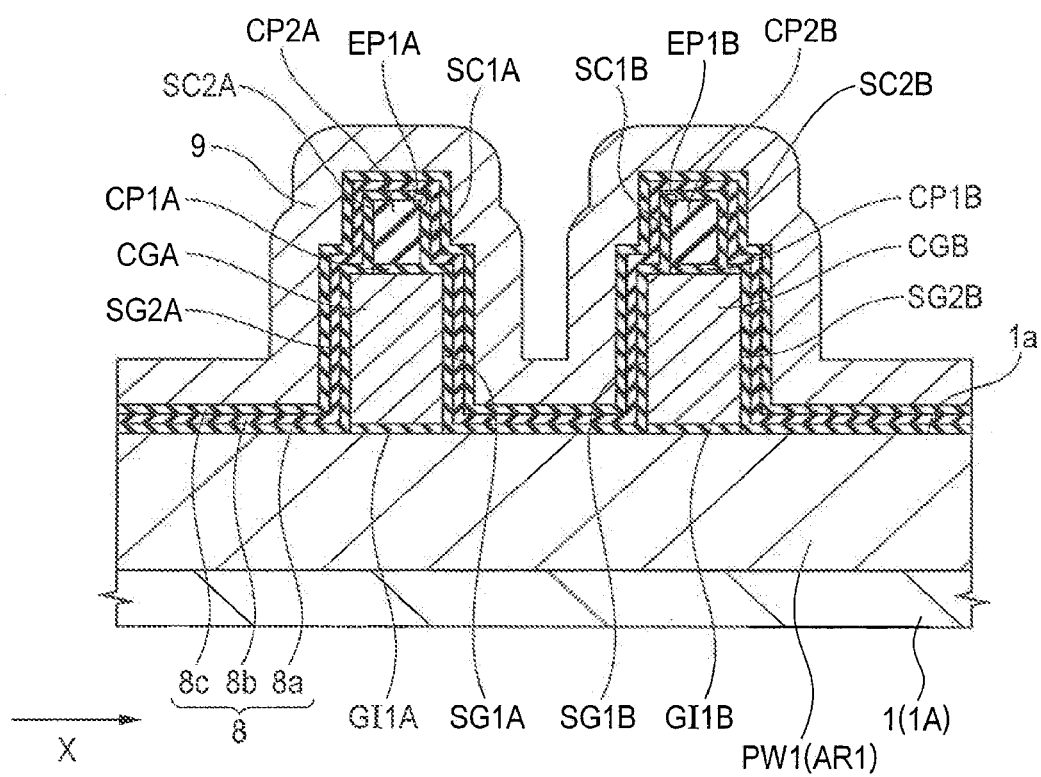
FIG. 13 is an essential part cross sectional view of the semiconductor device of First Embodiment during a manufacturing step.

Then, as shown in FIG. 13, entirely over the main surface 1a of the semiconductor substrate 1, in other words, over the insulation film 8, a conductive film 9 is formed, namely, deposited.

The conductive film 9 is formed of a polycrystal silicon film, namely, a polysilicon film, and can be formed using a CVD method or the like. For deposition, the following procedure is also possible: the conductive film 9 is formed as an amorphous silicon film; then, the amorphous silicon film is formed into a polycrystal silicon film by the subsequent heat treatment.

The conductive film 9 is more preferably reduced in resistivity by being doped with n type impurities such as phosphorus (P) or arsenic (As), or p type impurities such as boron (B). Although the impurities can be introduced into the conductive film 9 by ion implantation after deposition of the conductive film 9, the impurities can also be introduced into the conductive film 9 during deposition of the conductive film 9. When impurities are introduced during deposition of the conductive film 9, inclusion of a doping gas for depositing the conductive film 9 enables the deposition of the conductive film 9 doped with impurities.

Then, by an anisotropical etching technology, the conductive film 9 is etched back, thereby to form the memory gate electrode MGA and the memory gate electrode MGB.

The conductive film 9 is etched back so that, for example, the etched back thickness becomes equal to the thickness of the conductive film 9. As a result, at the side surfaces on the opposite sides of the control gate electrode CGA, namely, over the sidewalls on opposite sides of the control gate electrode CGA, the conductive film 9 is left in a sidewall spacer shape via the insulation film 8. Whereas, at the side surfaces on the opposite sides of the control gate electrode CGB, namely, over the sidewalls on the opposite sides of the control gate electrode CGB, the conductive film 9 is left in a sidewall spacer shape via the insulation film 8. Further, the conductive film 9 in other regions is removed.

Figure 14:
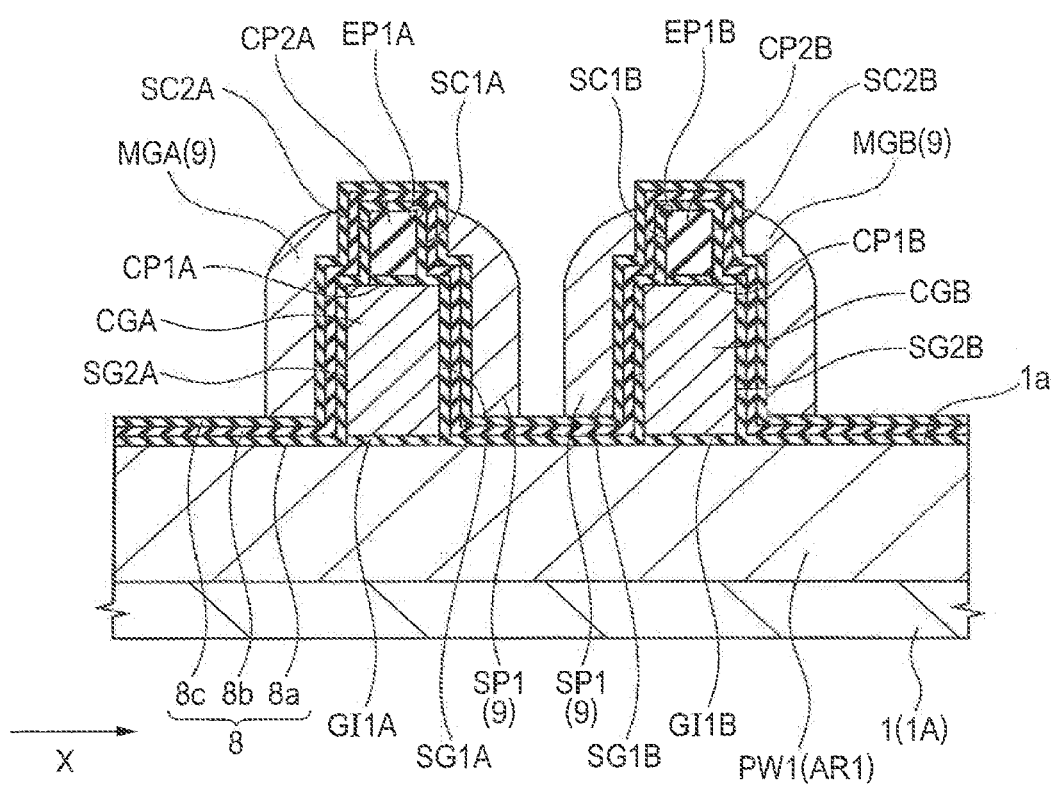
FIG. 14 is an essential part cross sectional view of the semiconductor device of First Embodiment during a manufacturing step.

As a result, as shown in FIG. 14, at the side surface SG2A of the control gate electrode CGA on the control gate electrode CGB side, the memory gate electrode MGA is formed with the conductive film 9 left in a sidewall spacer shape via the insulation film 8. Whereas, at the side surface SG1A of the control gate electrode CGA on the control gate electrode CGB side, a spacer SP1 is formed with the conductive film 9 left in a sidewall spacer shape via the insulation film 8.

Further, as shown in FIG. 14, at the side surface SG2B of the control gate electrode CGB opposite to the control gate electrode CGA side, the memory gate electrode MGB is formed with the conductive film 9 left in a sidewall spacer shape via the insulation film 8. Whereas, at the side surface SG1B of the control gate electrode CGB on the control gate electrode CGA side, a spacer SP1 is formed with the conductive film 9 left in a sidewall spacer shape via the insulation film 8.

The memory gate electrode MGA is formed over the insulation film 8 in such a manner as to be adjacent to the control gate electrode CGA via the insulation film 8. The memory gate electrode MGA and the spacer SP1 have a nearly symmetrical structure across the control gate electrode CGA. Between the memory gate electrode MGA and the p type well PW1 of the semiconductor substrate 1, and between the memory gate electrode MGA and the control gate electrode CGA, there is interposed the insulation film 8. The memory gate electrode MGA is formed of the conductive film 9 in contact with the insulation film 8.

The memory gate electrode MGB is formed over the insulation film 8 in such a manner as to be adjacent to the control gate electrode CGB via the insulation film 8. The memory gate electrode MGB and the spacer SP1 have a nearly symmetrical structure across the control gate electrode CGB. Between the memory gate electrode MGB and the p type well PW1 of the semiconductor substrate 1, and between the memory gate electrode MGB and the control gate electrode CGB, there is interposed the insulation film 8. The memory gate electrode MGB is formed of the conductive film 9 in contact with the conductive film 8.

At the stage of having performed the etching back step of the conductive film 9, the portions of the insulation film 8 not covered with any of the memory gate electrode MGA, the memory gate electrode MGB, and the spacer SP1 are exposed. Namely, the portions of the insulation film 8 not covered with any of the memory gate electrode MGA, the memory gate electrode MGB, and the spacer SP1 are exposed. Incidentally, by adjusting the thickness of the conductive film 9, it is possible to adjust the gate length of the memory gate electrode MGA, and the gate length of the memory gate electrode MGB.

Figure 15:
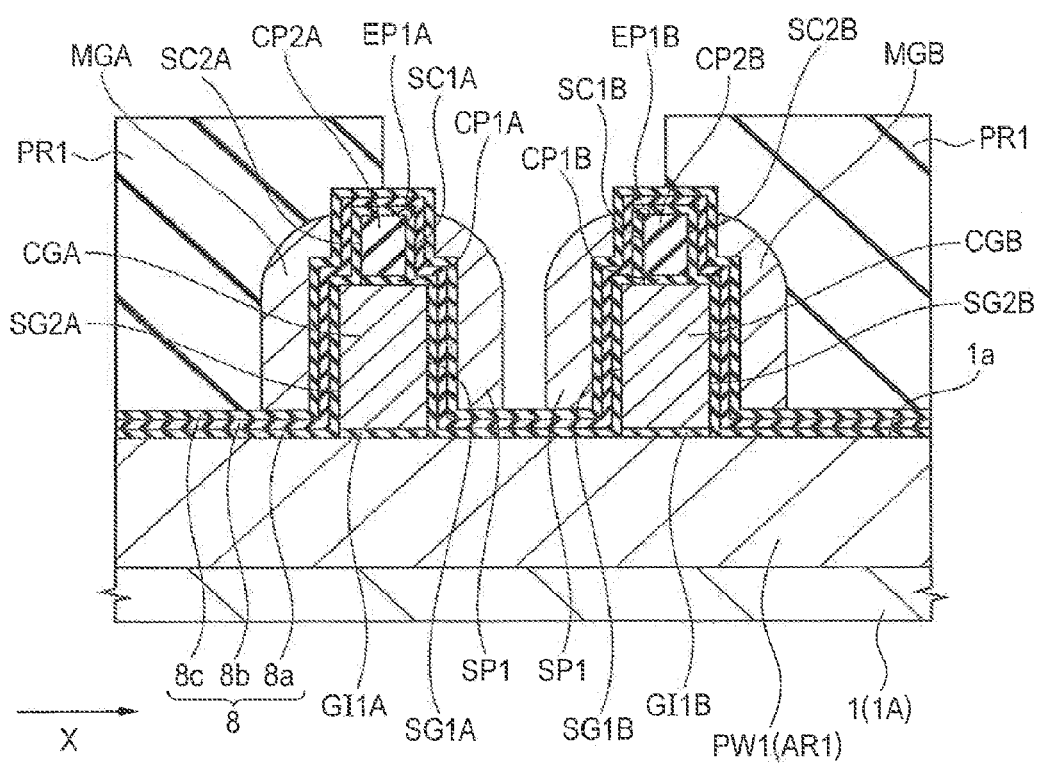
FIG. 15 is an essential part cross sectional view of the semiconductor device of First Embodiment during a manufacturing step.

Then, as shown in FIG. 15, using a photolithography technology, a photoresist pattern PR1 is formed over the semiconductor substrate 1. The photoresist pattern PR1 is such a photoresist pattern as to cover the memory gate electrode MGA and the memory gate electrode MGB, and as to expose the spacer SP1.

Figure 16:
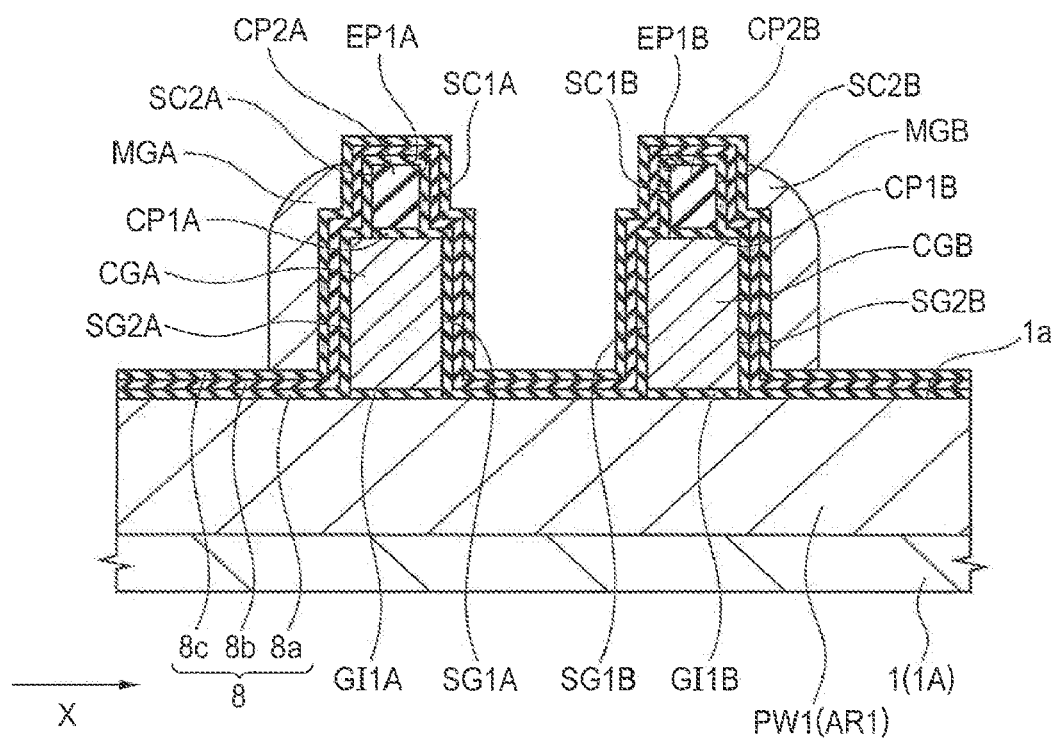
FIG. 16 is an essential part cross sectional view of the semiconductor device of First Embodiment during a manufacturing step.

Then, by dry etching using the formed photoresist pattern PR1 as an etching mask, the spacers SP1 are removed. Then, the photoresist pattern is removed. As a result, as shown in FIG. 16, the two spacers SP1 are removed. However, the memory gate electrode MGA and the memory gate electrode MGB have been covered with the photoresist pattern, and hence, are left without being etched.

Figure 17:
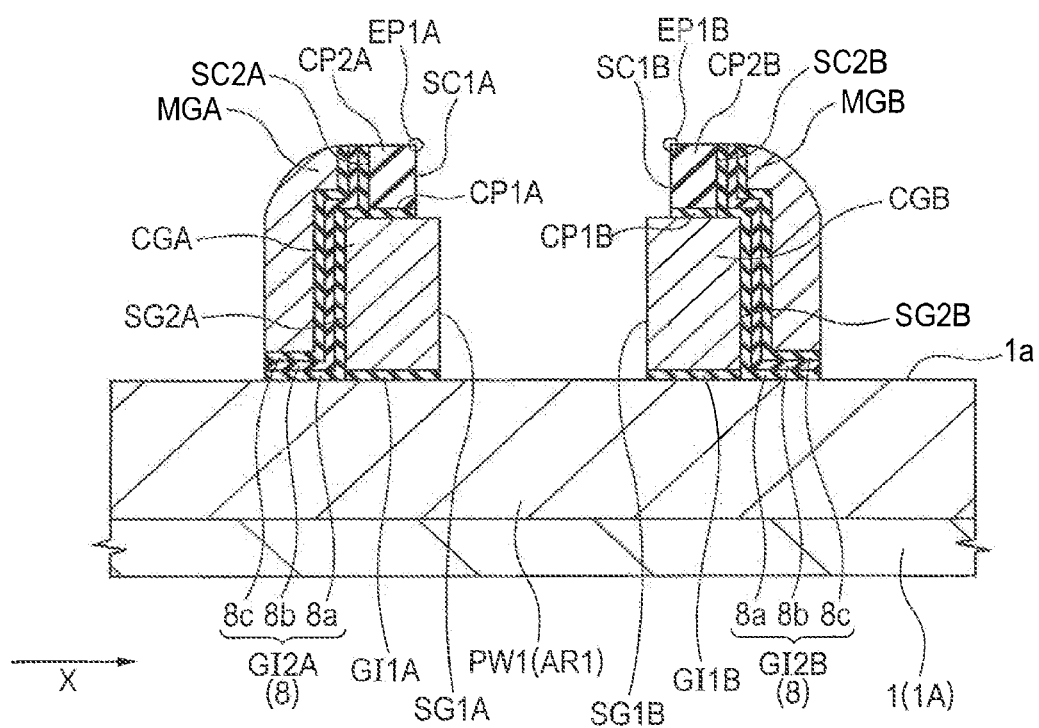
FIG. 17 is an essential part cross sectional view of the semiconductor device of First Embodiment during a manufacturing step.

Then, as shown in FIG. 17, the portions of the insulation film 8 exposed without being covered with the memory gate electrode MGA and the memory gate electrode MGB are removed by etching such as wet etching. Namely, the portions of the insulation film 8 not covered with the memory gate electrode MGA and the memory gate electrode MGB are removed. At this step, the insulation film 8 situated under the memory gate electrode MGA, and the insulation film 8 situated between the memory gate electrode MGA and the control gate electrode CGA are left without being removed. Whereas, the insulation film 8 situated under the memory gate electrode MGB, and the insulation film 8 situated between the memory gate electrode MGB and the control gate electrode CGB are left without being removed. Further, the insulation films 8 situated in other regions are removed.

As a result, as shown in FIG. 17, there is formed a gate insulation film GI2A including the insulation film 8 between the memory gate electrode MGA and the p type well PW1 of the semiconductor substrate 1, and the insulation film 8 between the control gate electrode CGA and the memory gate electrode MGA. Whereas, there is formed a gate insulation film GI2B including the insulation film 8 between the memory gate electrode MGB and the p type well PW1 of the semiconductor substrate 1, and the insulation film 8 between the control gate electrode CGB and the memory gate electrode MGB.

Also indicated from FIG. 17, in the region between the memory gate electrode MGA and the p type well PW1 of the semiconductor substrate 1, and the region between the memory gate electrode MGA and the control gate electrode CGA, the insulation film 8 extends in the direction normal to the paper plane of FIG. 17 (the Y axis direction of FIG. 2). Whereas, in the region between the memory gate electrode MGB and the p type well PW1 of the semiconductor substrate 1, and the region between the memory gate electrode MGB and the control gate electrode CGB, the insulation film 8 extends in the direction normal to the paper plane of FIG. 17 (the Y axis direction of FIG. 2).

Incidentally, when the insulation film 8 is etched, etching can also be performed so that, of the insulation film 8, the silicon oxide film 8c and the silicon nitride film 8b are removed, and the silicon oxide film 8a is left without being removed. In this case, at the stage of FIG. 17, the state in which the silicon oxide film 8a has been left is kept.

Figure 18:
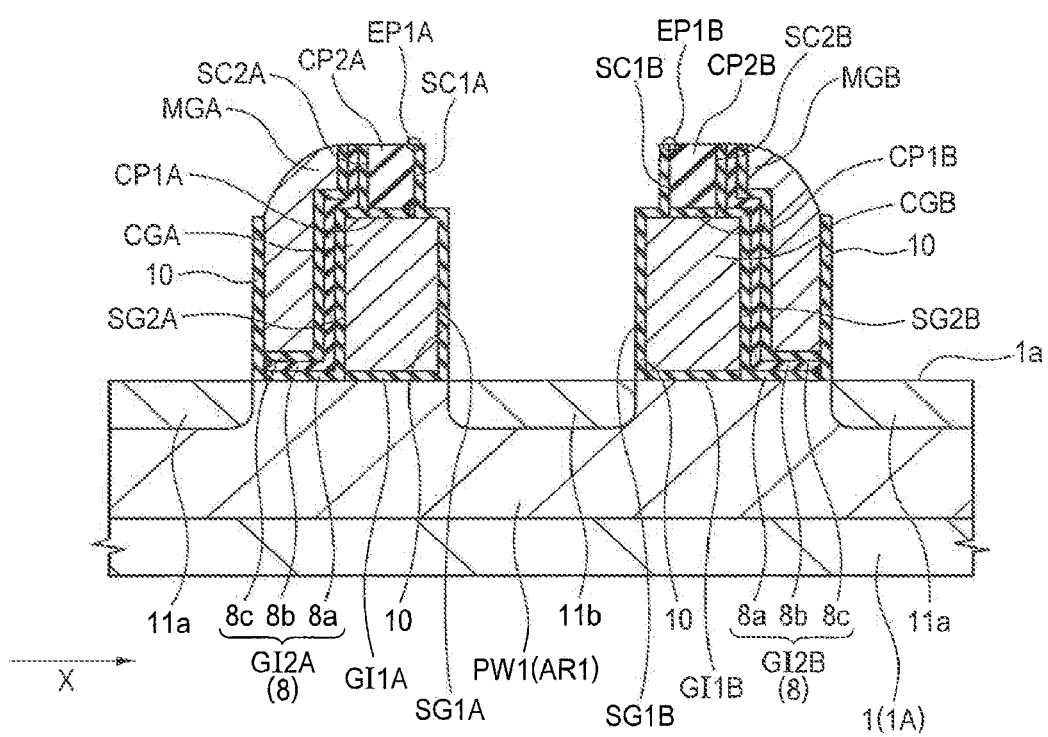
FIG. 18 is an essential part cross sectional view of the semiconductor device of First Embodiment during a manufacturing step.

Then, as shown in FIG. 18, an insulation film 10 is formed at the side surface of the control gate electrode CGA, the side surface of the memory gate electrode MGA, the side surface of the control gate electrode CGB, and the side surface of the memory gate electrode MGB.

For example, by a CVD method using an ozone ($O_3$) gas and a tetraethoxysilane (TEOS) gas as raw material gases, the insulation film 10 is formed in such a manner as to cover the surface of the control gate electrode CGA, the surface of the memory gate electrode MGA, the side surface of the control gate electrode CGB, and the surface of the memory gate electrode MGB. Then, by an anisotropical etching technology, the insulation film 10 is etched back. As a result, the insulation film 10 is left at the side surface of the control gate electrode CGA, the side surface of the memory gate electrode MGA, the side surface of the control gate electrode CGB, and the side surface of the memory gate electrode MGB. As a result, the insulation film 10 is formed at the side surface of the control gate electrode CGA, the side surface of the memory gate electrode MGA, the side surface of the control gate electrode CGB, and the side surface of the memory gate electrode MGB.

Incidentally, the following procedure is also possible: the foregoing step is not performed, so that the insulation film 10 is not formed at the side surface of the control gate electrode CGA, the side surface of the memory gate electrode MGA, the side surface of the control gate electrode CGB, and the side surface of the memory gate electrode MGB; alternatively a silicon nitride film is formed as the insulation film 10.

Then, n⁻ type semiconductor regions 11a and 11b are formed using an ion implantation method or the like. N type impurities such as arsenic (As) or phosphorus (P) are introduced, namely, doped in the p type well PW1 of the semiconductor substrate 1 using the control gate electrode CGA, the memory gate electrode MGA, the control gate electrode CGB, and the memory gate electrode MGB as a mask. As a result, as shown in FIG. 18, the n⁻ type semiconductor regions 11a and 11b are formed.

At this step, the n⁻ type semiconductor region 11a is formed in a self-aligned manner with respect to the side surface of the memory gate electrode MGA, and is formed in a self-aligned manner with respect to the side surface of the memory gate electrode MGB. Whereas, the n⁻ type semiconductor region 11b is formed in a self-aligned manner with respect to the side surface SG1A of the control gate electrode CGA, and is formed in a self-aligned manner with respect to the side surface SG1B of the control gate electrode CGB. The n⁻ type semiconductor regions 11a and 11b can be formed by the same ion implantation step, but can also be formed by different ion implantation steps.

Figure 19:
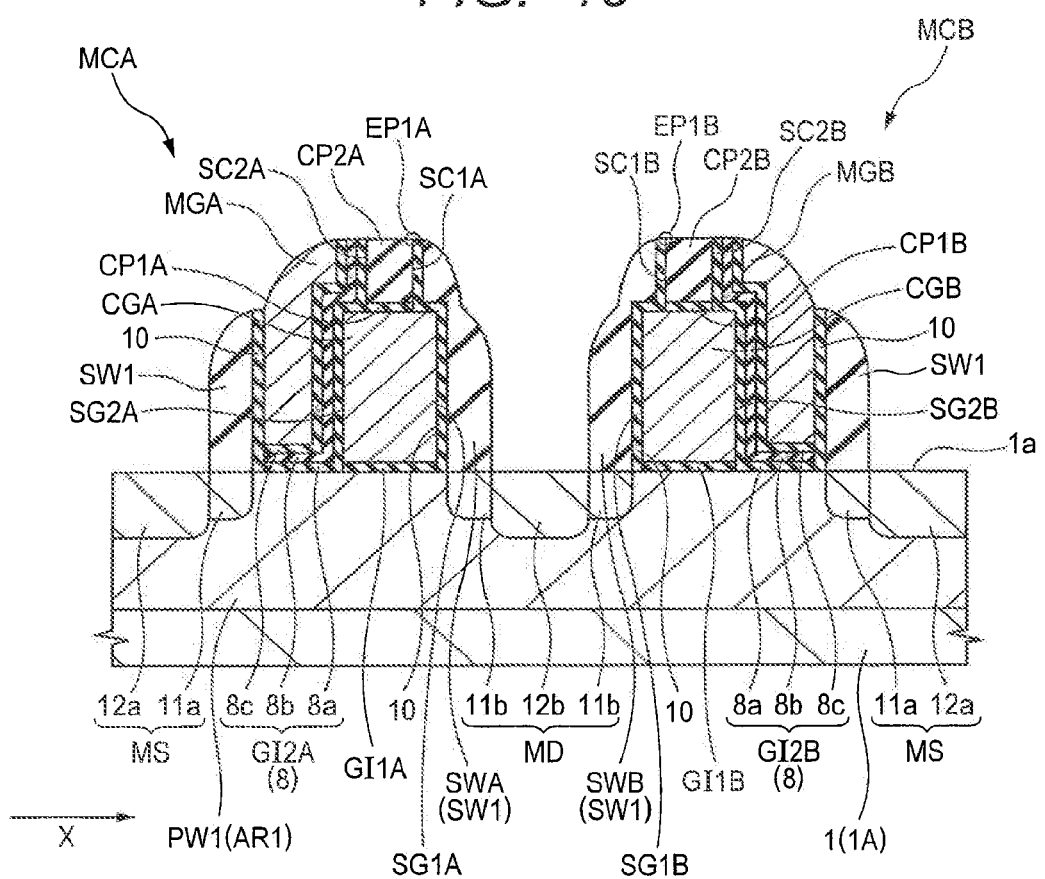
FIG. 19 is an essential part cross sectional view of the semiconductor device of First Embodiment during a manufacturing step.

Then, as shown in FIG. 19, sidewall spacers SW1 are formed.

First, entirely over the main surface 1a of the semiconductor substrate 1, an insulation film for sidewall spacer SW1 is formed, namely, deposited. The formed insulation film is etched back by, for example, anisotropic etching. The insulation film for sidewall spacer SW1 is formed of an insulation film such as a silicon oxide film or a silicon nitride film, or a lamination film thereof.

Thus, as shown in FIG. 19, the insulation film is selectively left at the side surface SG1A of the control gate electrode CGA on the control gate electrode CGB side, the side surface SC1A of the cap insulation film CP2A on the control gate electrode CGB side, and the side surface of the memory gate electrode MGA opposite to the control gate electrode CGA side. Whereas, the insulation film is selectively left at the side surface SG1B of the control gate electrode CGB on the control gate electrode CGA side, the side surface SC1B of the cap insulation film CP2B on the control gate electrode CGA side, and the side surface of the memory gate electrode MGB opposite to the control gate electrode CGB side. The insulation films thus left form the sidewall spacers SW1.

Incidentally, as shown in FIG. 19, the sidewall spacer SW1 formed at the side surface SG1A of the control gate electrode CGA on the control gate electrode CGB side, and the side surface SC1A of the cap insulation film CP2A on the control gate electrode CGB side via the insulation film 10 is a sidewall spacer SWA. Whereas, the sidewall spacer SW1 formed at the side surface SG1B of the control gate electrode CGB on the control gate electrode CGA side, and the side surface SC1B of the cap insulation film CP2B on the control gate electrode CGA side is a sidewall spacer SWB.

Then, the n⁺ type semiconductor regions 12a and 12b are formed using an ion implantation method or the like. N type impurities such as arsenic (As) or phosphorus (P) are introduced, namely, doped in the p type well PW1 of the semiconductor substrate 1 using the control gate electrode CGA, the memory gate electrode MGA, the control gate electrode CGB, and the memory gate electrode MGB, and the sidewall spacers SW1 formed at the side surfaces thereof as a mask. As a result, the n type semiconductor regions 12a and 12b are formed.

At this step, the n⁺ type semiconductor region 12a is formed in a self-aligned manner with respect to the side surface of the sidewall spacer SW1 formed at the side surface of the memory gate electrode MGA, and formed in a self-aligned manner with respect to the side surface of the sidewall spacer SW1 formed at the side surface of the memory gate electrode MGB. Whereas, the n⁺ type semiconductor region 12b is formed in a self-aligned manner with respect to the side surface of the sidewall spacer SW1 formed at the side surface SG1A of the control gate electrode CGA, and is formed in a self-aligned manner with respect to the side surface of the sidewall spacer SW1 formed at the side surface SG1B of the control gate electrode CGB. As a result, a LDD structure is formed. The n⁺ type semiconductor regions 12a and 12b can be formed by the same ion implantation step, but can also be formed by different ion implantation steps.

Thus, the n⁺ type semiconductor region 11a and the n⁺ type semiconductor region 12a having a higher impurity density than that form an n type semiconductor region MS functioning as the source region of the memory transistor. Whereas, the n⁻ type semiconductor region 11b and the n⁺ type semiconductor region 12b having a higher impurity density than that form an n type semiconductor region MD functioning as the drain region of the control transistor.

Then, there is performed activation annealing which is a heat treatment for activating the impurities introduced in the n⁻ type semiconductor regions 11a and 11b, and the n⁺ type semiconductor regions 12a and 12b. As a result, as shown in FIG. 19, over the active region AR1, the control gate electrode CGA, the gate insulation film GI1A, the cap insulation film CP2A, the memory gate electrode MGA, and the gate insulation film GI2A form a memory cell MCA. Whereas, over the active region AR1, the control gate electrode CGB, the gate insulation film GI1B, the cap insulation film CP2B, the memory gate electrode MGB, and the gate insulation film GI2B form a memory cell MCB.

Incidentally, as partially shown in FIG. 2, also over the active region AR2, as over the active region AR1, the control gate electrode CGA (not shown), the gate insulation film GI1A (not shown), the cap insulation film CP2A, the memory gate electrode MGA, and the gate insulation film GI2A form the memory cell MCA. Whereas, also over the active region AR2, as over the active region AR1, the control gate electrode CGB (not shown), the gate insulation film GI1B (not shown), the cap insulation film CP2B, the memory gate electrode MGB, and the gate insulation film GI2B form the memory cell MCB.

Figure 20:
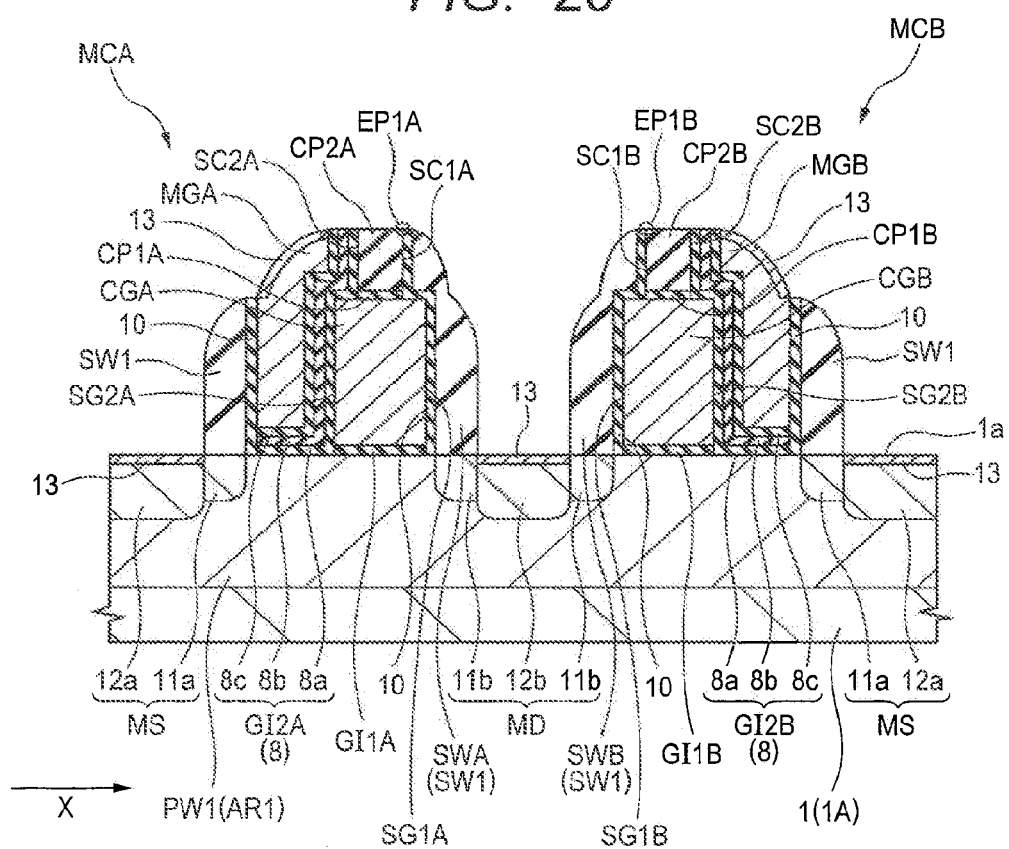
FIG. 20 is an essential part cross sectional view of the semiconductor device of First Embodiment during a manufacturing step.

Then, as shown in FIG. 20, a metal silicide layer 13 is formed. In the step of forming the metal silicide layer 13, entirely over the main surface 1a of the semiconductor substrate 1, a metal film is formed, namely, deposited in such a manner as to cover the control gate electrodes CGA and CGB, the cap insulation films CP2A and CP2B, the memory gate electrodes MGA and MGB, and the sidewall spacers SW1. The metal film is formed of, for example, a cobalt (Co) film, a nickel (Ni) film, or a nickel platinum alloy film, and can be formed using a sputtering method or the like. Then, the semiconductor substrate 1 is subjected to a heat treatment, so that respective upper layer portions of the n⁺ type semiconductor regions 12a and 12b are allowed to react with the metal film. As a result, the metal silicide layers 13 are formed at respective top parts of the n⁺ type semiconductor regions 12a and 12b, respectively. The metal silicide layer 13 can be set as, for example, a cobalt silicide layer, a nickel silicide layer, or a platinum-added nickel silicide layer. Then, the unreacted portions of the metal film are removed. Such a so-called salicide process is performed. As a result, as shown in FIG. 20, at the top surface of the memory gate electrode MGA and the top surface of the memory gate electrode MGB, and respective top parts of the n+ type semiconductor regions 12a and 12b, there can be formed the metal silicide layers 13.

Incidentally, the top parts of the control gate electrode CGA and the control gate electrode CGB are covered with the insulation films such as the insulation films 10 and the sidewall spacers SW1. For this reason, the metal silicide layer 13 is not formed. However, for example, in the region (not shown) for forming plugs formed in a later step for feeding to the control gate electrode CGA and the control gate electrode CGB, the metal silicide layers 13 may be formed at the top surface of the control gate electrode CGA and the top surface of the control gate electrode CGB.

Figure 21:
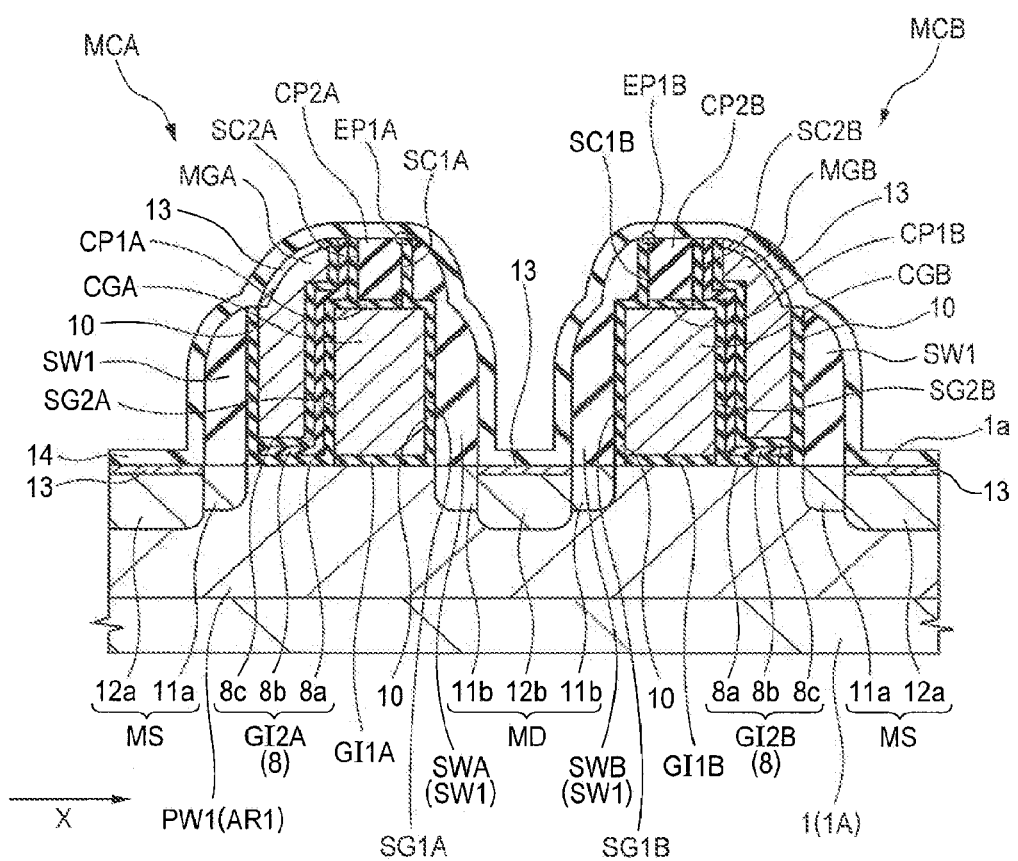
FIG. 21 is an essential part cross sectional view of the semiconductor device of First Embodiment during a manufacturing step.

Then, as shown in FIG. 21, entirely over the main surface 1a of the semiconductor substrate 1, the insulation film 14 is formed, namely, deposited. In the step of forming the insulation film 14, the insulation film 14 is formed, namely, deposited in such a manner as to cover the control gate electrodes CGA and CGB, the cap insulation films CP2A and CP2B, the memory gate electrodes MGA and MGB, and the sidewall spacers SW1. By, for example, a CVD method, it is possible to form the insulation film 14 formed of, for example, a silicon nitride film.

Figure 22:
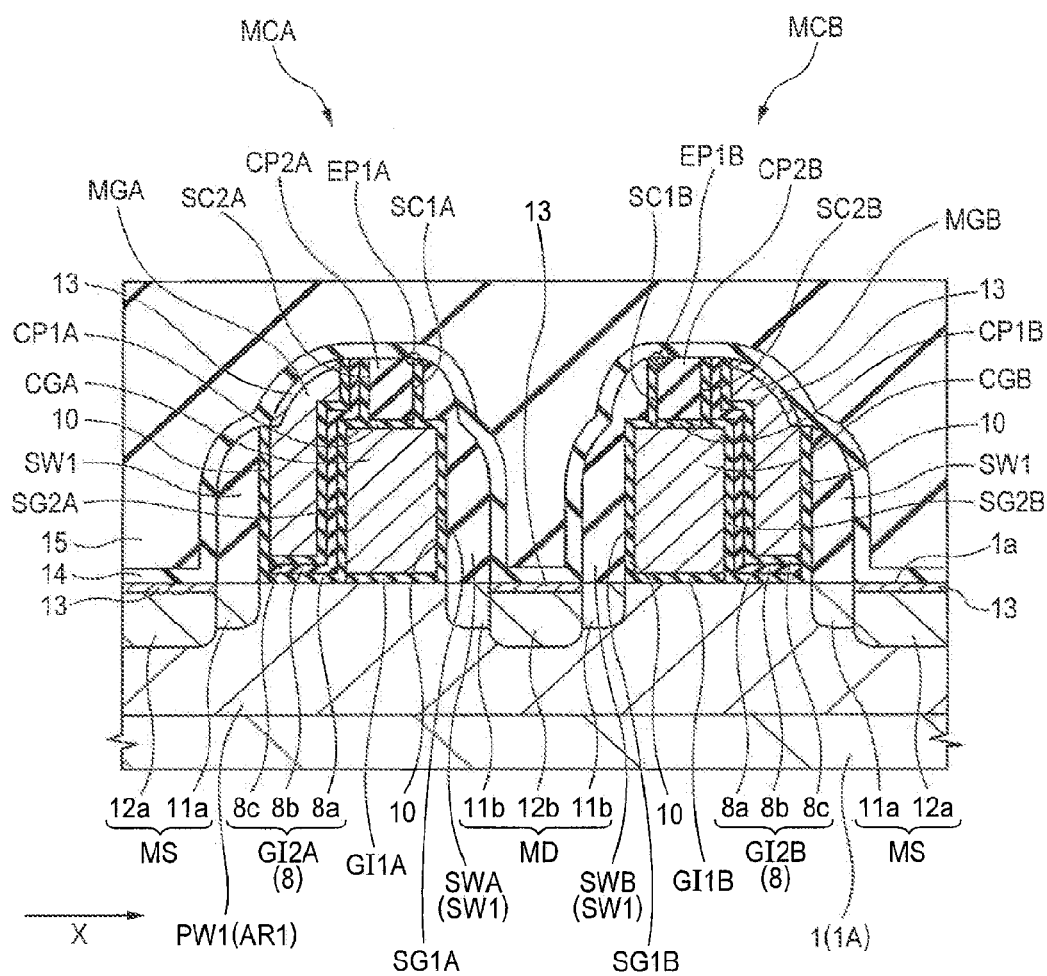
FIG. 22 is an essential part cross sectional view of the semiconductor device of First Embodiment during a manufacturing step.

Then, as shown in FIG. 22, entirely over the main surface 1a of the semiconductor substrate 1, in other words, over the insulation film 14, an interlayer insulation film 15 is formed, namely, deposited. The interlayer insulation film 15 is formed of a single film of a silicon oxide film, or a lamination film of a silicon nitride film and a silicon oxide film, and can be formed using, for example, a CVD method.

At this step, over the active region AR1, over the element isolation region IR1, and over the active region AR2, the interlayer insulation film 15 is formed in such a manner as to cover the control gate electrodes CGA and CGB, the cap insulation films CP2A and CP2B, the memory gate electrodes MGA and MGB, and the sidewall spacers SW1.

Figure 23:
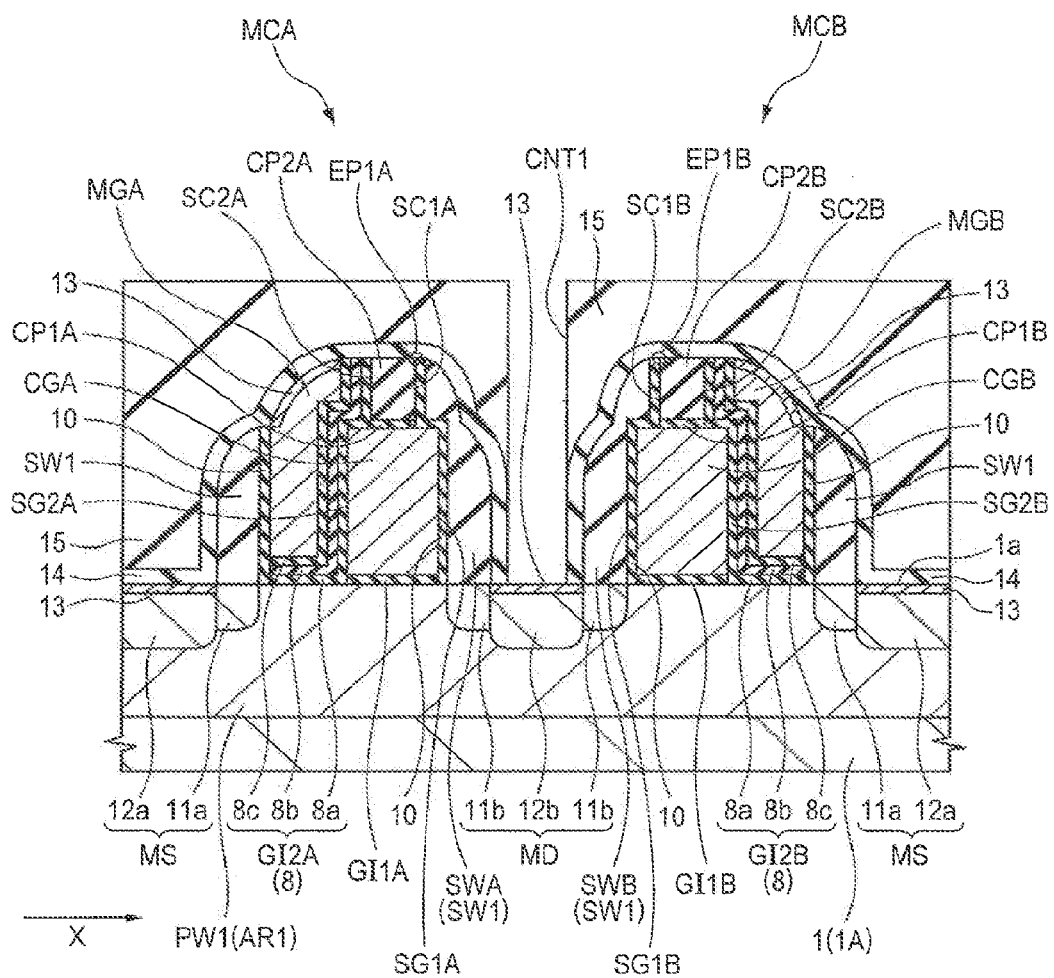
FIG. 23 is an essential part cross sectional view of the semiconductor device of First Embodiment during a manufacturing step.

Then, as shown in FIG. 23, with a photoresist pattern (not shown) formed over the interlayer insulation film 15 using a photolithography method as an etching mask, the interlayer insulation film 15 is dry etched. As a result, over the active region AR1, a contact hole CNT1 is formed in the interlayer insulation film 15. There is formed the contact hole CNT1 penetrating through the interlayer insulation film 15, and reaching the active region AR1, namely, the p type well PW1 between the control gate electrode CGA and the control gate electrode CGB.

At the bottom part of the contact hole CNT1, for example, there is exposed a portion of the metal silicide layer 13 formed over the top surface of the n+ type semiconductor region 12b.

Further, over the active region AR1, the contact hole CNT1 is formed. In addition, as shown in FIG. 2, over the active region AR2, there is formed a contact hole CNT2 penetrating through the interlayer insulation film 15, and reaching the active region AR2 between the control gate electrode CGA (not shown) and the control gate electrode CGB (not shown).

Then, a conductive plug PG1 (see FIG. 1) is formed in the contact hole CNT1.

Figure 24:
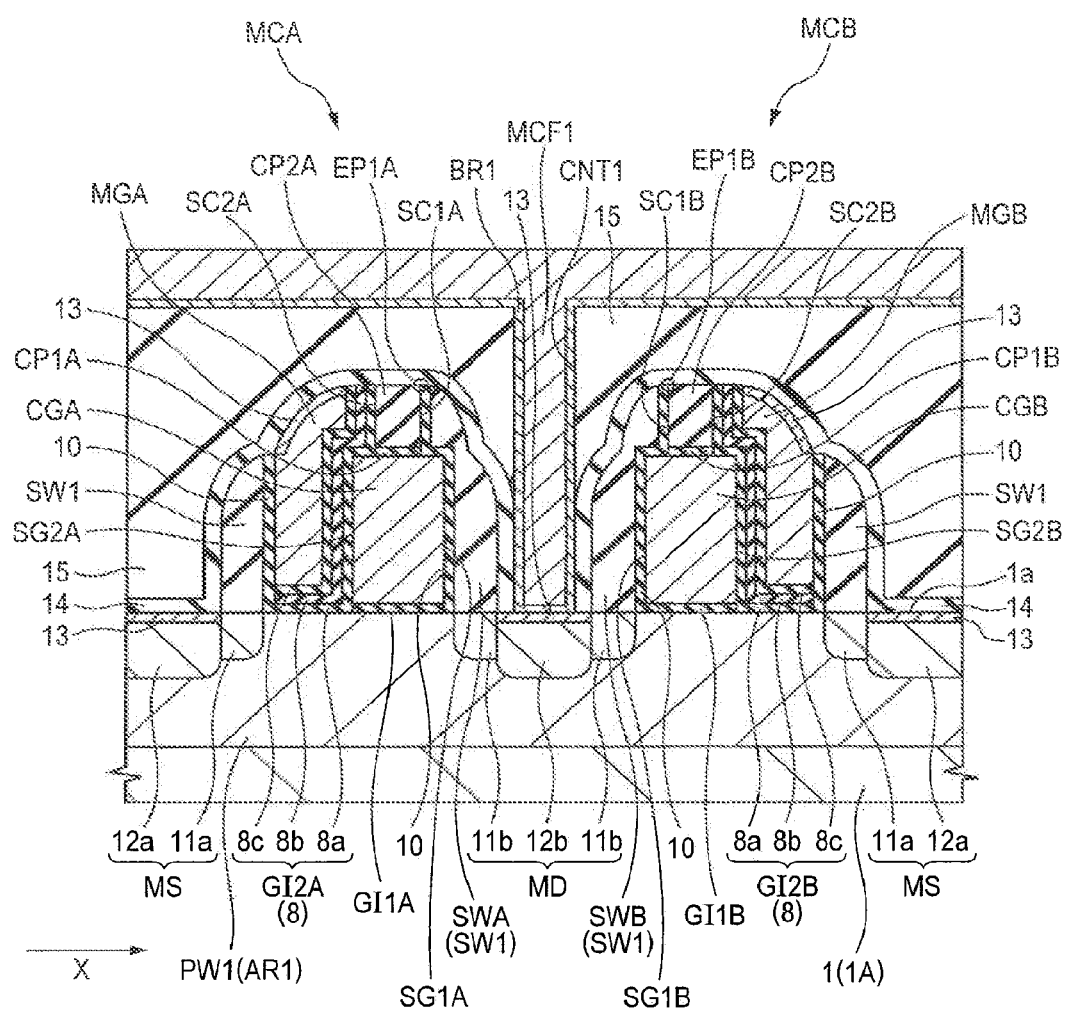
FIG. 24 is an essential part cross sectional view of the semiconductor device of First Embodiment during a manufacturing step.

For forming the plug PG1, for example, over the interlayer insulation film 15 including the inside of the contact hole CNT1, there is formed a barrier conductive film BR1 formed of, for example, a titanium (Ti) film or a titanium nitride (TiN) film, or a lamination film thereof. Then, as shown in FIG. 24, over the barrier conductive film BR1, a main conductive film MCF1 formed of a tungsten (W) film or the like is formed in such a manner as to fill the contact hole CNT1. Then, unnecessary portions of the main conductive film MCF1 and the barrier conductive film BR1 over the interlayer insulation film 15 are removed by a CMP (Chemical Mechanical Polishing) method, a etching back method, or the like. With such a method, as shown in FIG. 1, there is formed the plug PG1 formed of the barrier conductive film BR1 and the main conductive film MCF1 embedded in the contact hole CNT1, and electrically coupled with the n+ type semiconductor region 12b in the active region AR1 via the metal silicide layer 13.

Incidentally, the contact hole CNT1 and the plug PG1 embedded therein may be formed over the n+ type semiconductor region 12a, over the control gate electrodes CGA and CGB, over the memory gate electrodes MGA and MGB, and the like, in addition to over the n+ type semiconductor region 12b. At this step, at the bottom part of the contact hole CNT1, there are exposed portions of the metal silicide layers 13 formed, for example, at the top surface of the n+ type semiconductor region 12a, the top surfaces of the control gate electrodes CGA and CGB, and the top surfaces of the memory gate electrodes MGA and MGB. Then, the conductive plug PG1 is formed in the contact hole CNT1.

Further, as shown in FIG. 2, over the active region AR2, a conductive plug PG2 is formed in the contact hole CNT2. In other words, as partially shown in FIG. 2, over the active region AR2, there is formed the plug PG2 formed of the barrier conductive film BR1 and the main conductive film MCF1 (not shown) embedded in the contact hole CNT2, and electrically coupled with the n+ type semiconductor region 12b in the active region AR2 via the metal silicide layer 13 (not shown).

In the manner described up to this point, the semiconductor device of the present First Embodiment described previously by reference to FIG. 1 is manufactured. Incidentally, over the interlayer insulation film 15 including the plug PG1 and the plug PG2 embedded therein, a wire including, for example, copper (Cu) as the main conductive film can be formed using, for example, a damascene technology, but herein will not be described.

<Regarding Short-Circuit Between Plugs>

Figure 25:
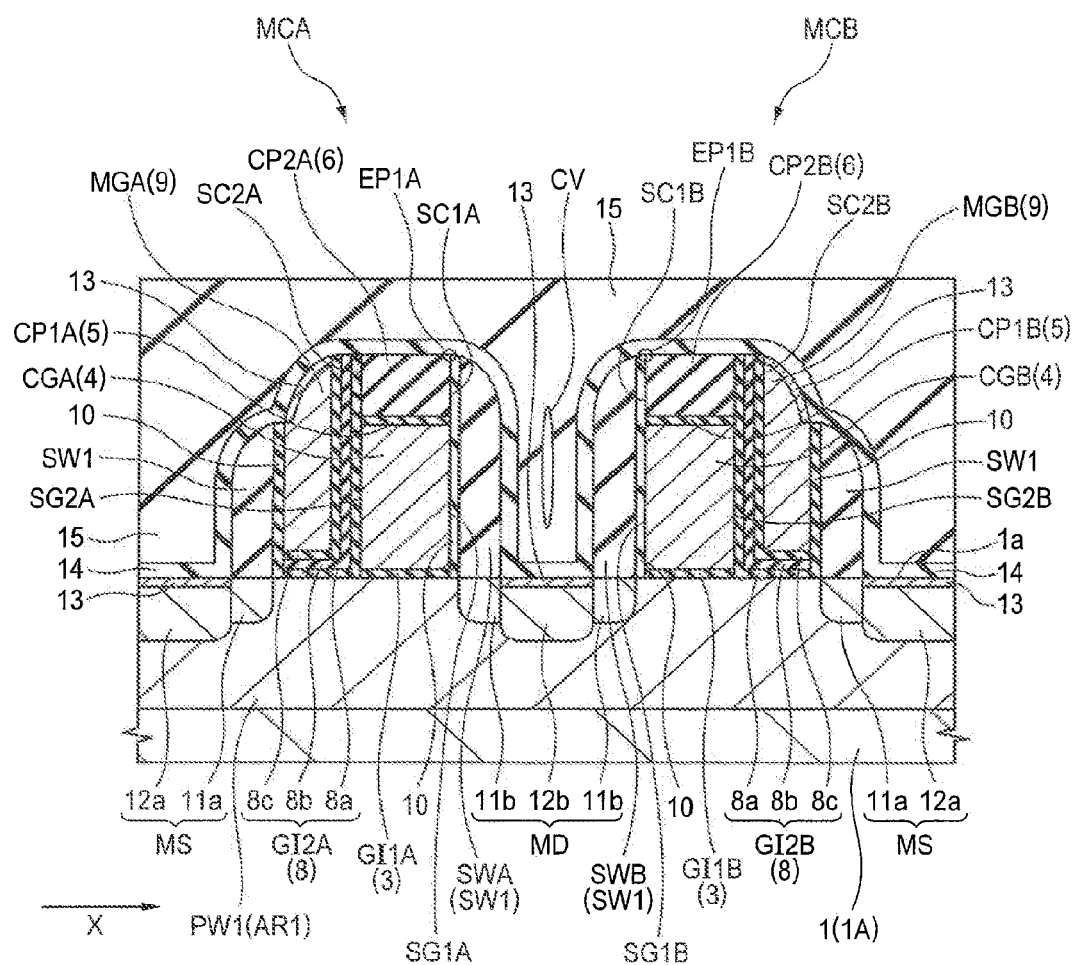
FIG. 25 is an essential part cross sectional view of a semiconductor device of Comparative Example 1.
Figure 26:
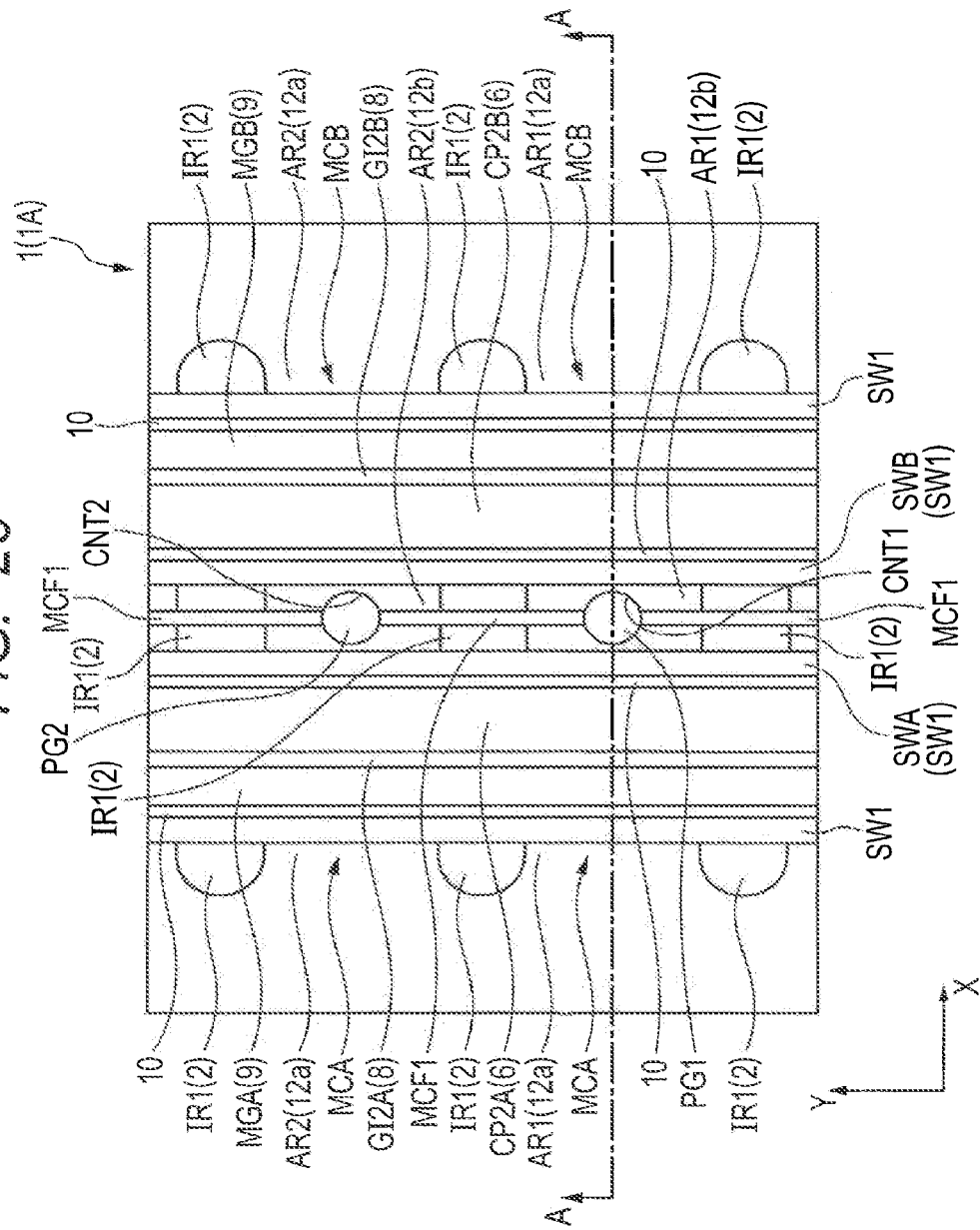
FIG. 26 is an essential part plan view the semiconductor device of Comparative Example 1.
Figure 27:
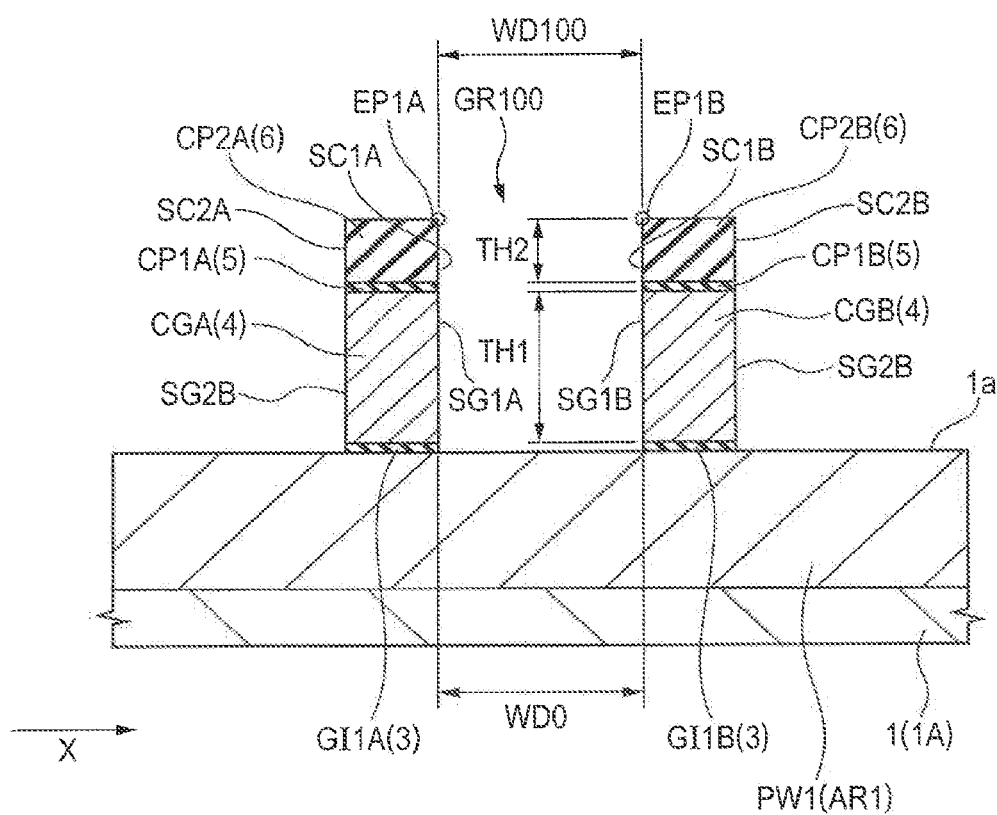
FIG. 27 is an essential part cross sectional view of the semiconductor device of Comparative Example 1 during a manufacturing step.

A semiconductor device of Comparative Example 1 will be described by reference to the accompanying drawings. FIG. 25 is an essential part cross sectional view of a semiconductor device of Comparative Example 1. FIG. 26 is an essential part plan view of the semiconductor device of Comparative Example 1. FIG. 27 is an essential part cross sectional view of the semiconductor device of Comparative Example 1 during a manufacturing step. Incidentally, FIG. 25 is a cross sectional view corresponding to the cross sectional view along line A-A of FIG. 26, and is a cross sectional view in the same step as the step described by reference to FIG. 22 of the manufacturing steps of the semiconductor device of First Embodiment. Whereas, FIG. 26 shows a state in which the insulation film 14 and the interlayer insulation film 15 have been removed, or seen therethrough. Further, FIG. 27 shows only the semiconductor substrate 1, the p type well PW1, the gate insulation films GI1A and GI1B, the control gate electrodes CGA and CGB, and the cap insulation films CP1A, CP1B, CP2A, and CP2B of the semiconductor device shown in FIG. 25 for easy understanding.

Respective portions of the semiconductor device of Comparative Example 1 other than the cap insulation film CP2A and the cap insulation film CP2B are the same as respective portions of the semiconductor device of First Embodiment other than the cap insulation film CP2A and the cap insulation film CP2B. Further, respective steps of the manufacturing steps of the semiconductor device of Comparative Example 1 are the same as respective steps of the manufacturing steps of the semiconductor device of First Embodiment, except for not performing the step of slimming the cap insulation films CP2A and CP2B described by reference to FIG. 11.

As shown in FIG. 25, in the semiconductor device of Comparative Example 1, the end EP1A at the top surface of the cap insulation film CP2A on the control gate electrode CGB side is not situated closer to the memory gate electrode MGA side than the side surface SG1A of the control gate electrode CGA on the control gate electrode CGB side. Whereas, the end EP1B at the top surface of the cap insulation film CP2B on the control gate electrode CGA side is not situated closer to the memory gate electrode MGB side than the side surface SG1B of the control gate electrode CGB on the control gate electrode CGA side. In other words, along the X axis direction, namely, the gate length direction, the end EP1A is situated at the same position as that of the side surface SG1A, and the end EP1B is situated at the same position as that of the side surface SG1B.

In Comparative Example 1, the width of the cap insulation film CP2A in the X axis direction, namely, the gate length direction is equal to the width of the control gate electrode CGA in the X axis direction, namely, the gate length direction. Namely, the side surface SC1A of the cap insulation film CP2A on the control gate electrode CGB side is not set back from the side surface SG1A of the control gate electrode CGA on the control gate electrode CGB side toward the memory gate electrode MGA side.

Whereas, the width of the cap insulation film CP2B in the X axis direction, namely, the gate length direction is equal to the width of the control gate electrode CGB in the X axis direction, namely, the gate length direction. Namely, the side surface SC1B of the cap insulation film CP2B on the control gate electrode CGA side is not set back from the side surface SG1B of the control gate electrode CGB on the control gate electrode CGA side toward the memory gate electrode MGB side.

As shown in FIG. 27, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR100. The bottom part of the trench part GR100 is set as the main surface 1a of the semiconductor substrate 1. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR100 becomes equal to the sum of the thickness TH1 and the thickness TH2. Further, the width in the X axis direction, namely, the gate length direction at the upper end of the trench part GR100 is referred to as a width WD100.

With such a structure, the width WD100 is substantially equal to the distance WD0 between the side surface SG1A of the control gate electrode CGA and the side surface SG1B of the control gate electrode CGB. For this reason, the width WD100 can not be set smaller than the distance WD0 between the side surface SG1A of the control gate electrode CGA and the side surface SG1B of the control gate electrode CGB. Namely, the width WD100 is limited by the distance WD0.

For example, with a trend toward a larger capacity of a nonvolatile memory, miniaturization of a memory cell has been pursued. This results in a reduction of the gate length of the control gate electrode included in the memory cell. Therefore, there is caused a reduction of the distance in the X axis direction, namely, the gate length direction between the control gate electrode CGA and the control gate electrode CGB respectively included in two memory cells MCA and MCB adjacent to each other along the X axis direction, namely, the gate length direction. On the other hand, when the thickness TH1 of the control gate electrode CGA or CGB is reduced, ions become more likely to penetrate through the control gate electrode CGA or CGB in ion implantation using the control gate electrode CGA or CGB as a mask. For this reason, the thickness TH1 of the control gate electrode CGA or CGB cannot be reduced with ease. Accordingly, the ratio of the thickness TH1 to the gate length of the control gate electrode CGA or CGB, namely, the aspect ratio increases. Thus, in the trench part GR100, the ratio of the depth of the trench part GR100, namely, the sum of the thickness TH1 and the thickness TH2 to the distance WD0, in other words, the aspect ratio increases.

The width WD100 and the distance WD0 of the trench part GR100 are each, for example, about 150 to 200 nm. Whereas, when the thickness TH1 is set at, for example, about 80 to 100 nm, and the thickness TH2 is set at, for example, about 50 to 100 nm, the depth of the trench part GR100 is, for example, about 130 to 200 nm. Incidentally, with the sidewall spacers SWA and SWB formed at the side surfaces of the trench part GR100, the width of the trench part GR100 further becomes smaller than the depth of the trench part GR100.

When, with the trench part GR100 having such a high aspect ratio formed, the interlayer insulation film 15 is formed over the semiconductor substrate 1, it becomes difficult to fill the trench part GR100. When the interlayer insulation film 15 is formed by, for example, a CVD method, the raw materials become less likely to reach the inside of the trench part GR100, namely, between the sidewall spacer SWA and the sidewall spacer SWB. For this reason, it becomes difficult to fill the trench part GR100. As a result, as shown in FIG. 25, a cavity CV may be formed in a portion of the interlayer insulation film 15 in the inside of the trench part GR100, namely, between the sidewall spacer SWA and the sidewall spacer SWB. Namely, the cavity CV may be formed in a portion of the interlayer insulation film 15 between the control gate electrode CGA and the control gate electrode CGB.

When the cavity CV is thus formed, the contact hole CNT1 formed in the step of forming the contact hole CNT1 described by reference to FIG. 23 in First Embodiment and the cavity CV may be connected to each other, namely, may communicate with each other. Further, as shown in FIG. 26, the contact hole CNT2 formed over the active region AR2 and the cavity CV may be connected to each other, namely, may communicate with each other.

For this reason, as shown in FIG. 26, when the plug PG1 is formed over the active region AR1, and the plug PG2 is formed over the active region AR2, the main conductive film MCF1 and the like forming the plug PG1 and the plug PG2 may also be formed in the inside of the cavity CV. Then, the formed plug PG1 and plug PG2 are electrically coupled with each other through the main conductive film MCF1 and the like formed in the inside of the cavity CV. This establishes an electrical short circuit between the plug PG1 and the plug PG2, resulting in the degradation of the performances of the semiconductor device.

Alternatively, even when a plug is not formed between the control gate electrode CGA and the control gate electrode CGB, in other steps, the conductive film and the like are formed in the inside of the cavity CV. Accordingly, the memory cell is electrically short-circuited with other portions, resulting in the degradation of the performances of the semiconductor device.

The following procedure is also conceivable: there is formed the interlayer insulation film 15 formed of a silicon oxide film by, for example, a high density plasma CVD (HDP-CVD) method excellent in step coverage. This improves the filling property of the trench part GR100 when the interlayer insulation film 15 is formed. As a result, the formation of the cavity CV is prevented. However, the interlayer insulation film 15 excellent in filling property formed by the HDP-CVD method may be increased in moisture content. As a result, for example, the reduction of the insulation property degrades the performances of the semiconductor device.

Main Features and Effects of the Present Embodiment

In the semiconductor device of the present First Embodiment, the end EP1A at the top surface of the cap insulation film CP2A on the control gate electrode CGB side is situated closer to the memory gate electrode MGA side than the side surface SG1A of the control gate electrode CGA on the control gate electrode CGB side. Whereas, the end EP1B at the top surface of the cap insulation film CP2B on the control gate electrode CGA side is situated closer to the memory gate electrode MGB side than the side surface SG1B of the control gate electrode CGB on the control gate electrode CGA side.

With such a structure, the width WD1 at the top end of the trench part GR1 (see FIG. 3) is larger than the width WD0 between the side surface SG1A of the control gate electrode CGA and the side surface SG1B of the control gate electrode CGB (see FIG. 3). Accordingly, the width WD1 can be set larger than when along the X axis direction, namely, the gate length direction, the end EP1A is situated at the same position as that of the side surface SG1A, and the end EP1B is situated at the same position as that of the side surface SG1B.

Further, the distance between the portion of the sidewall spacer SWA formed at the side surface SC1A of the cap insulation film CP2A via the insulation film 10 and the portion of the sidewall spacer SWB formed at the side surface SC1B of the cap insulation film CP2B via the insulation film 10 is larger than that of Comparative Example 1.

For this reason, when the interlayer insulation film 15 is formed by, for example, a CVD method, the raw materials of the interlayer insulation film 15 become more likely to reach between the sidewall spacer SWA and the sidewall spacer SWB. This can prevent or suppress the formation of the cavity CV (see FIG. 25) in the portion of the interlayer insulation film 15 between the sidewall spacer SWA and the sidewall spacer SWB. Namely, while keeping constant the distance WD0 between the control gate electrode CGA and the control gate electrode CGB, the cavity CV can be prevented or suppressed from being formed in the portion of the interlayer insulation film 15 between the control gate electrode CGA and the control gate electrode CGB.

Therefore, as shown in FIG. 2, when the plug PG1 and the plug PG2 are each formed between the control gate electrode CGA and the control gate electrode CGB over the active region AR1 and over the active region AR2, respectively, the plug PG1 and the plug PG2 can be prevented or suppressed from being electrically short-circuited. For this reason, it is possible to improve the performances of the semiconductor device.

Alternatively, even when a plug is not formed between the control gate electrode CGA and the control gate electrode CGB, a cavity CV is not formed in the interlayer insulation film 15. This can prevent or suppress the occurrence of the following: a conductive film or the like is formed in the inside of the cavity CV, so that the memory cell is electrically short-circuited with other portions. For this reason, it is possible to improve the performances of the semiconductor device.

Further, in order to improve the filling property of the trench part GR1 for forming the interlayer insulation film 15, it is not necessary to form the interlayer insulation film 15 formed of a silicon oxide film by, for example, a high density plasma CVD (HDP-CVD) method excellent in step coverage. Therefore, it is possible to prevent or suppress the increase in moisture content in the interlayer insulation film 15. This can improve the performances of the semiconductor device.

Further, in the present First Embodiment, the width of the cap insulation film CP2A in the X axis direction, namely, the gate length direction is smaller than the width of the control gate electrode CGA in the X axis direction, namely, the gate length direction. Namely, the side surface SC1A of the cap insulation film CP2A on the control gate electrode CGB side is set back from the side surface SG1A of the control gate electrode CGA on the control gate electrode CGB side toward the memory gate electrode MGA side. Whereas, the side surface SC2A of the cap insulation film CP2A on the memory gate electrode MGA side is set back from the side surface SG2A of the control gate electrode CGA on the memory gate electrode MGA side toward the control gate electrode CGB side. Then, the memory gate electrode MGA is formed at the side surface SC2A of the cap insulation film CP2A on the memory gate electrode MGA side, and the side surface SG2A of the control gate electrode CGA on the memory gate electrode MGA side via the gate insulation film GI2A.

Further, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B on the control gate electrode CGA side is set back from the side surface SG1B of the control gate electrode CGB on the control gate electrode CGA side toward the memory gate electrode MGB side. Whereas, the side surface SC2B of the cap insulation film CP2B on the memory gate electrode MGB side is set back from the side surface SG2B of the control gate electrode CGB on the memory gate electrode MGB side toward the control gate electrode CGA side. Then, the memory gate electrode MGB is formed at the side surface SC2B of the cap insulation film CP2B on the memory gate electrode MGB side and the side surface SG2B of the control gate electrode CGB on the memory gate electrode MGB side via the gate insulation film GI2B. At this step, a portion of the top surface of the memory gate electrode MGA is formed in such a manner as to cover a portion of the control gate electrode CGA (namely, extends over a portion of the control gate electrode CGA). A portion of the top surface of the memory gate electrode MGB is formed in such a manner as to cover a portion of the control gate electrode CGB (namely, extends over a portion of the control gate electrode CGB).

Accordingly, a portion of the silicide layer 13 formed over the memory gate electrode MGA is formed in such a manner as to cover a portion of the control gate electrode CGA (namely, extend over a portion of the control gate electrode CGA). A portion of the silicide layer 13 formed over the memory gate electrode MGB is formed in such a manner as to cover a portion of the control gate electrode CGB (namely, extend over a portion of the control gate electrode CGB). As a result, the area of the top surface of the memory gate electrode MGA and the area of the top surface of the memory gate electrode MGB increase. This facilitates the formation of the metal silicide layers 13 over the top surface of the memory gate electrode MGA and the top surface of the memory gate electrode MGB. Further, there is caused an increase in the area of the metal silicide layers 13 formed over the top surface of the memory gate electrode MGA and the top surface of the memory gate electrode MGB.

Therefore, there can be reduced the electrical resistance between the plug (not shown) electrically coupled with the memory gate electrode MGA and the memory gate electrode MGA, and the electrical resistance between the plug (not shown) electrically coupled with the memory gate electrode MGB and the memory gate electrode MGB.

Incidentally, in the present First Embodiment, a description has been given to the case where the memory cell MCA and the memory cell MCB have a nearly symmetrical structure across the plug PG1. However, it is also acceptable that any one of the memory cell MCA and the memory cell MCB has the same structure as the structure of the memory cell in the semiconductor device of the present First Embodiment, and that the other has the same structure as the structure of the memory cell of the semiconductor device of Comparative Example 1. Also in such a case, it is possible to suppress the formation of the cavity CV in a portion of the interlayer insulation film 15 between the control gate electrode CGA and the control gate electrode CGB. This produces more advantageous effects than in Comparative Example 1.

Second Embodiment

For the semiconductor device of First Embodiment, after forming the control gate electrode CGA, the cap insulation film CP2A is slimmed, resulting in the formation of the cap insulation film CP2A having a smaller width than the width of the control gate electrode CGA. In contrast, in a semiconductor device of Second Embodiment, after forming the cap insulation film CP2A having a smaller width than that of the control gate electrode CGA, there is formed the control gate electrode CGA having a larger width than that of the cap insulation film CP2A.

<Structure of Semiconductor Device>

Figure 28:
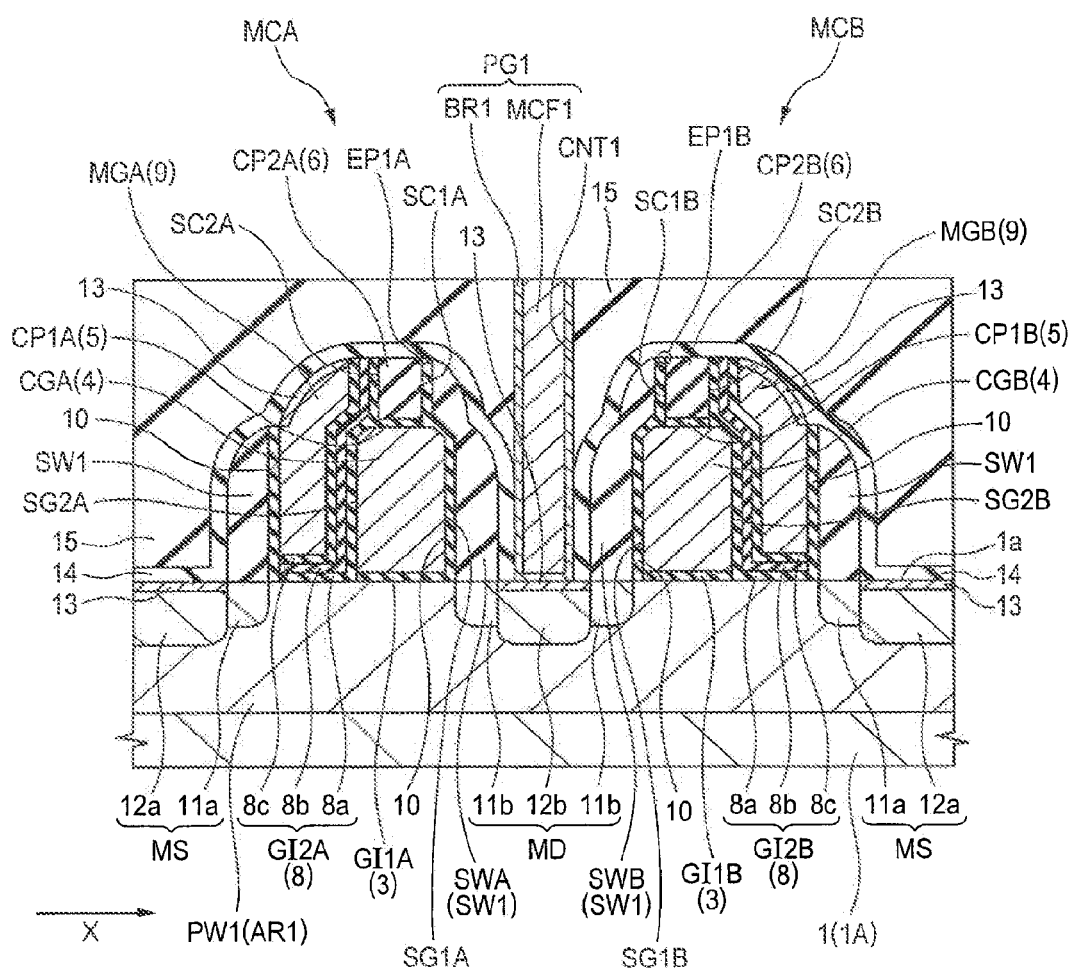
FIG. 28 is an essential part cross sectional view of a semiconductor device of Second Embodiment.

FIG. 28 is an essential part cross sectional view of the semiconductor device of Second Embodiment. FIG. 28 is, as with FIG. 1, a cross sectional view corresponding to the cross sectional view along line A-A of FIG. 2.

Respective portions of the semiconductor device of the present Second Embodiment other than the control gate electrodes CGA and CGB, and the cap insulation films CP2A and CP2B are the same as respective portions of the semiconductor device of First Embodiment other than the control gate electrodes CGA and CGB, and the cap insulation films CP2A and CP2B. Therefore, respective portions of the semiconductor device of the present Second Embodiment other than the control gate electrodes CGA and CGB, and the cap insulation films CP2A and CP2B will not be described.

Also in the present Second Embodiment, as with First Embodiment, in the main surface 1a, the end EP1A at the top surface of the cap insulation film CP2A on the control gate electrode CGB side is set back from the side surface SG1A of the control gate electrode CGA on the control gate electrode CGB side toward the memory gate electrode MGA side. Whereas, in the main surface 1a, the end EP1B at the top surface of the cap insulation film CP2B on the control gate electrode CGA side is set back from the side surface SG1B of the control gate electrode CGB on the control gate electrode CGA side toward the memory gate electrode MGB side.

Further, also in the present Second Embodiment, as with First Embodiment, the width of the cap insulation film CP2A in the X axis direction, namely, the gate length direction is smaller than the width of the control gate electrode CGA in the X axis direction, namely, the gate length direction. Namely, the side surface SC1A of the cap insulation film CP2A on the control gate electrode CGB side is set back from the side surface SG1A of the control gate electrode CGA on the control gate electrode CGB side toward the memory gate electrode MGA side. Whereas, the side surface SC2A of the cap insulation film CP2A on the memory gate electrode MGA side is set back from the side surface SG2A of the control gate electrode CGA on the memory gate electrode MGA side toward the control gate electrode CGB side. Then, the memory gate electrode MGA is formed at the side surface SC2A of the cap insulation film CP2A on the memory gate electrode MGA side, and the side surface SG2A of the control gate electrode CGA on the memory gate electrode MGA side via the gate insulation film GI2A.

Whereas, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B on the control gate electrode CGA side is set back from the side surface SG1B of the control gate electrode CGB on the control gate electrode CGA side toward the memory gate electrode MGB side. Whereas, the side surface SC2B of the cap insulation film CP2B on the memory gate electrode MGB side is set back from the side surface SG2B of the control gate electrode CGB on the memory gate electrode MGB side toward the control gate electrode CGA side. Then, the memory gate electrode MGB is formed at the side surface SC2B of the cap insulation film CP2B on the memory gate electrode MGB side and the side surface SG2B of the control gate electrode CGB on the memory gate electrode MGB side via the gate insulation film GI2B.

Further, in the present Second Embodiment, the end on the control gate electrode CGB side and the end on the memory gate electrode MGA side at the top surface of the control gate electrode CGA are both chamfered. Whereas, the end on the control gate electrode CGA side, and the end on the memory gate electrode MGB side at the top surface of the control gate electrode CGB are both chamfered. Namely, the corner part between the top surface of the control gate electrode CGA and the side surface SG1A of the control gate electrode CGA on the control gate electrode CGB side is chamfered; and the corner part between the top surface of the control gate electrode CGA and the side surface SG2A of the control gate electrode CGA on the memory gate electrode MGA side is chamfered. Whereas, the corner part between the top surface of the control gate electrode CGB and the side surface SG1B of the control gate electrode CGB on the control gate electrode CGA side is chamfered; and the corner part between the top surface of the control gate electrode CGB and the side surface SG2B of the control gate electrode CGB on the memory gate electrode MGB side is chamfered.

Further, the operation of the memory cell MCA and the operation of the memory cell MCB in the semiconductor device of the present Second Embodiment are also the same as the operation of the memory cell MCA in the semiconductor device of First Embodiment, and hence will not be described.

<Method for Manufacturing a Semiconductor Device>

Then, a description will be given to a method for manufacturing the semiconductor device of the present Second Embodiment.

FIGS. 29 to 35 are each an essential part cross sectional view of the semiconductor device of Second Embodiment during a manufacturing step. FIGS. 29 to 35 each show the same cross section as the cross section shown in FIG. 28, and are each a cross sectional view corresponding a cross sectional view along line A-A of FIG. 2.

Figure 29:
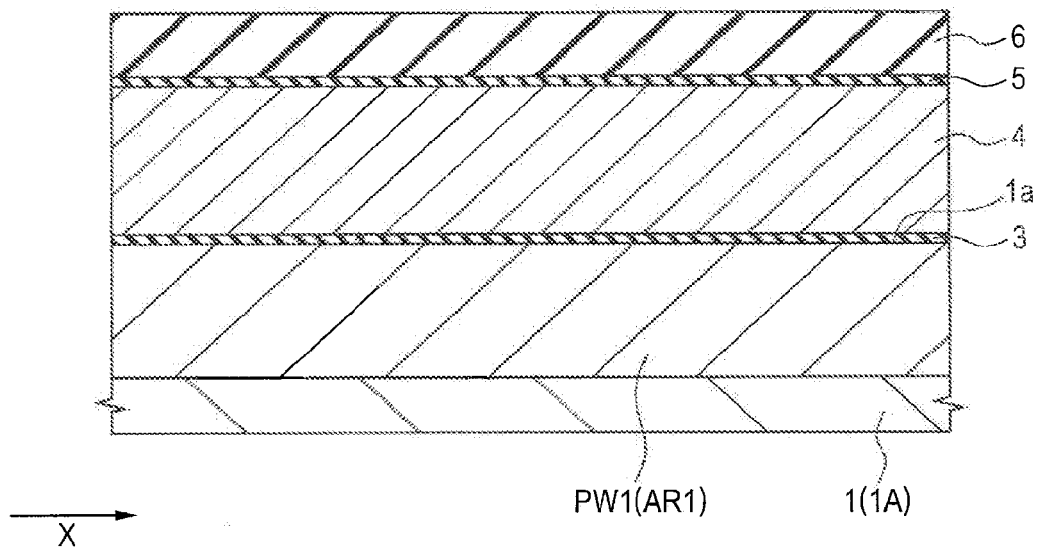
FIG. 29 is an essential part cross sectional view of the semiconductor device of Second Embodiment during a manufacturing step.

First, the step described by reference to FIG. 7 in First Embodiment is performed, thereby to provide a semiconductor substrate 1. Then, the same step as the step described by reference to FIG. 8 is performed. As a result, as shown in FIG. 29, entirely over the main surface 1a of the semiconductor substrate 1, an insulation film 3, a conductive film 4, an insulation film 5, and an insulation film 6 are sequentially formed from the bottom.

However, in the present Second Embodiment, the step described by reference to FIG. 11 in First Embodiment, namely, slimming of the cap insulation film CP2A and the cap insulation film CP2B is not performed. Therefore, the thickness of the insulation film 6 is roughly equal to the thickness TH2 of the cap insulation film CP2A or CP2B described later by reference to FIG. 34. The thickness TH2 can be set at, for example, about 50 to 100 nm.

Then, the insulation film 6, the insulation film 5, the conductive film 4, and the insulation film 3 are patterned by etching such as dry etching.

Figure 30:
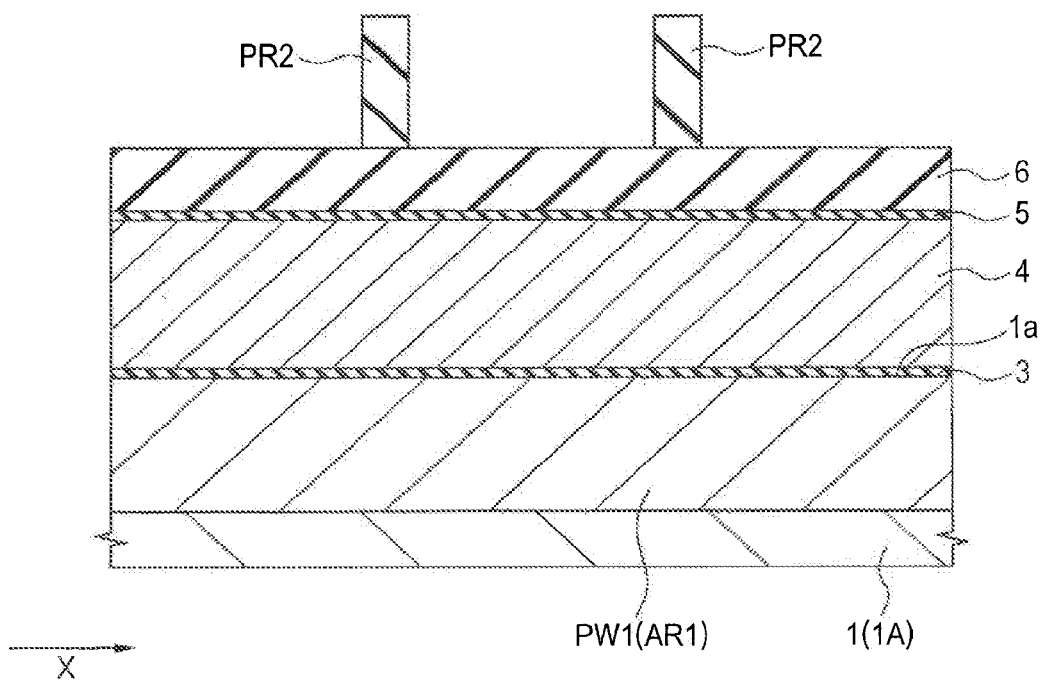
FIG. 30 is an essential part cross sectional view of the semiconductor device of Second Embodiment during a manufacturing step.

First, as shown in FIG. 30, in a region in which the cap insulation film CP2A and the cap insulation film CP2B (see FIG. 31 described later) are to be formed, over the insulation film 6, a photoresist pattern PR2 is formed using a photolithography method.

Figure 31:
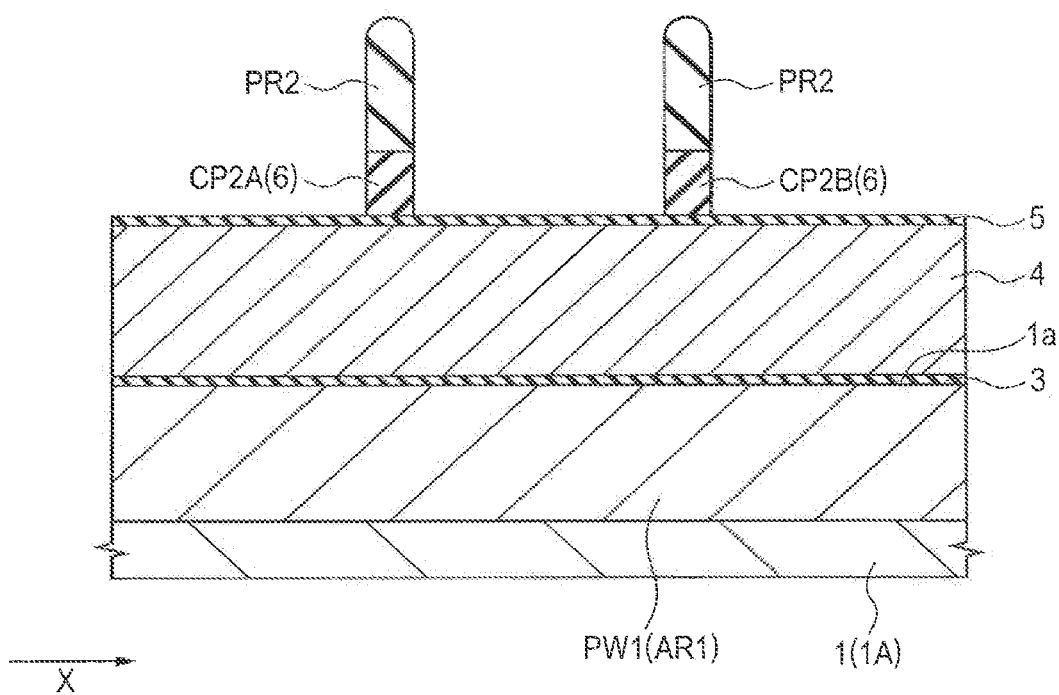
FIG. 31 is an essential part cross sectional view of the semiconductor device of Second Embodiment during a manufacturing step.

Then, using the photoresist pattern PR2 as an etching mask, the insulation film 6 is etched by, for example, dry etching, and is patterned. As a result, as shown in FIG. 31, over the main surface 1a of the semiconductor substrate 1, there are formed the cap insulation film CP2A formed of the insulation film 6 and the cap insulation film CP2B formed of the insulation film 6 spaced in the X axis direction, namely, the gate length direction.

At this step, as with the case described by reference to FIG. 2 in First Embodiment, the cap insulation film CP2A and the cap insulation film CP2B are formed in such a manner as to extend along the Y axis direction through over the active region AR1, over the element isolation region IR1, and over the active region AR2.

In the step of etching the insulation film 6, the insulation film 6 is overetched. Namely, when the insulation film 6 formed of, for example, a silicon nitride film is etched, etching is not stopped at the interface between the insulation film 6 and the insulation film 5. The insulation film 5 formed of, for example, a silicon oxide film is etched. Further, the conductive film 4 formed of, for example, a silicon film is etched to a given depth. At this step, there are formed the cap insulation film CP1A formed of the insulation film 5, and the cap insulation film CP1B formed of the insulation film 5.

Figure 32:
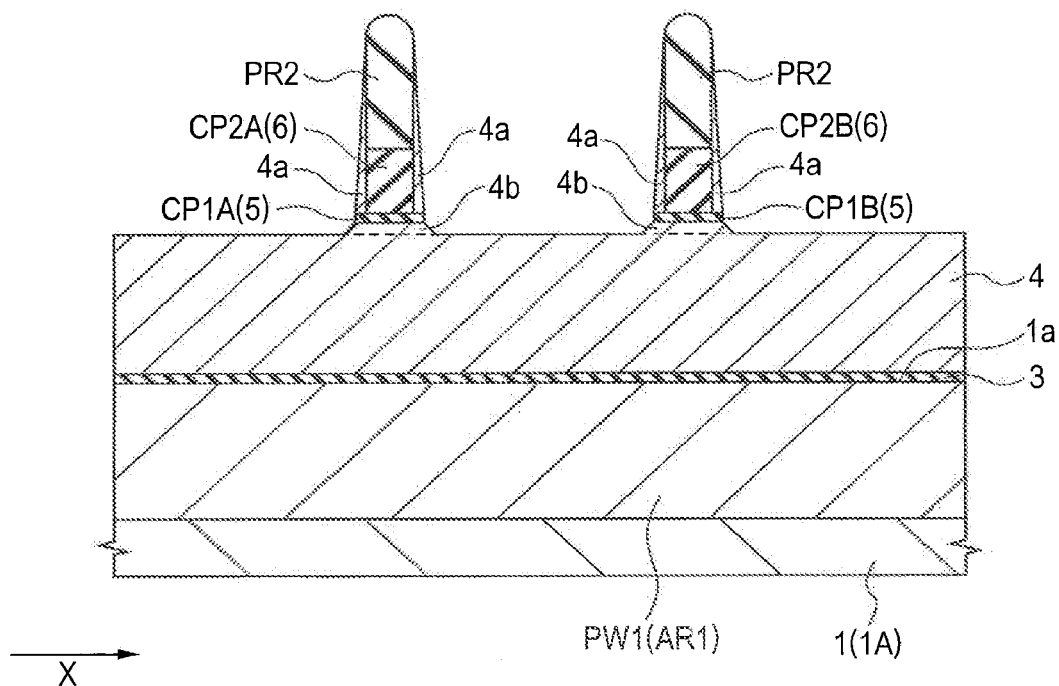
FIG. 32 is an essential part cross sectional view of the semiconductor device of Second Embodiment during a manufacturing step.

Using an etching gas including, for example, a sulfur hexafluoride ($SF_6$) gas, a trifluoromethane x($CHF_3$) gas, and an argon (Ar) gas, etching of the insulation film 6 is started. Then, during etching of the insulation film 6, the etching gas is changed to an etching gas including, for example, a perfluorocyclobutane ($C_4F_8$) gas, and an argon (Ar) gas. Thus, the insulation film 5 is etched, and the conductive film 4 is etched to a given depth. At this step, as shown in FIG. 32, a reaction product 4a is deposited at the side surface of the cap insulation film CP2A, the side surface of the cap insulation film CP2B, and the side surface of the photoresist pattern PR2. At this step, the side surface of the pattern 4b of the conductive film 4 formed by etching to a given depth is inclined. Thus, the width of the pattern 4b increases with an increase in depth from the top surface of the conductive film 4.

Figure 33:
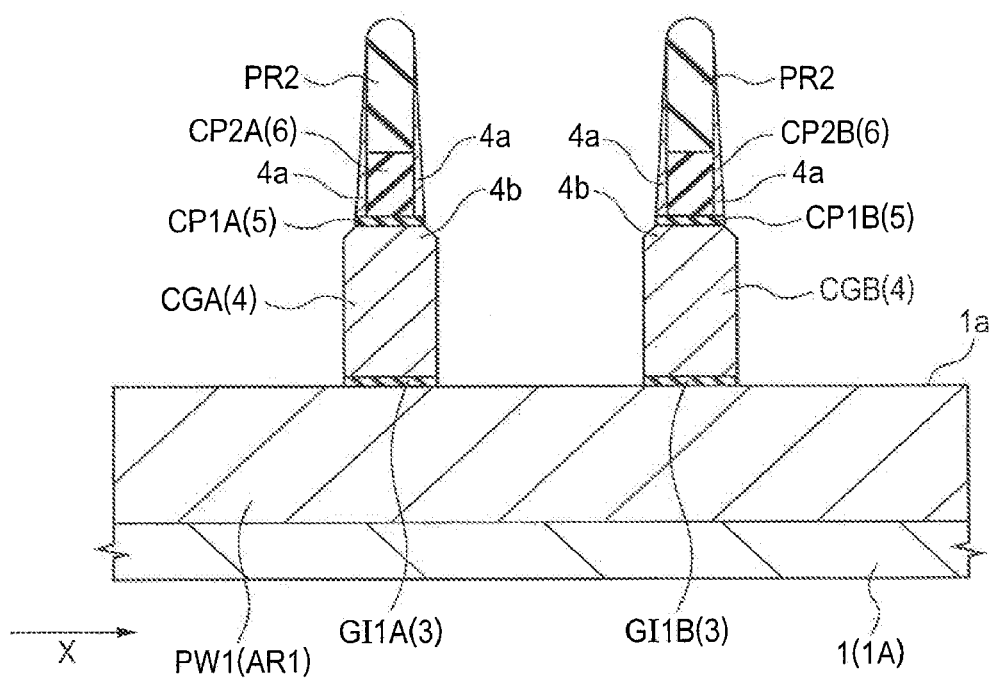
FIG. 33 is an essential part cross sectional view of the semiconductor device of Second Embodiment during a manufacturing step.

Then, the etching gas is changed to an etching gas including, for example, an oxygen ($O_2$) gas, a hydrogen bromide (HBr) gas, and a methane tetrafluoride ($CF_4$) gas. Thus, the conductive film 4 is etched. As a result, as shown in FIG. 33, there are formed a control gate electrode CGA formed of the conductive film 4, and a control gate electrode CGB formed of the conductive film 4. Further, the insulation film 3 is also etched. As a result, there are formed a gate insulation film GI1A formed of the insulation film 3, and a gate insulation film GI1B formed of the insulation film 3.

At this step, the reaction product 4a and the pattern 4b formed by the overetching of the conductive film 4 serve as an etching mask. Accordingly, the width of the control gate electrode CGA in the X axis direction, namely, the gate length direction becomes larger than the width of the cap insulation film CP2A in the X axis direction, namely, the gate length direction. The width of the control gate electrode CGB in the X axis direction, namely, the gate length direction becomes larger than the width of the cap insulation film CP2B in the X axis direction, namely, the gate length direction.

Figure 34:
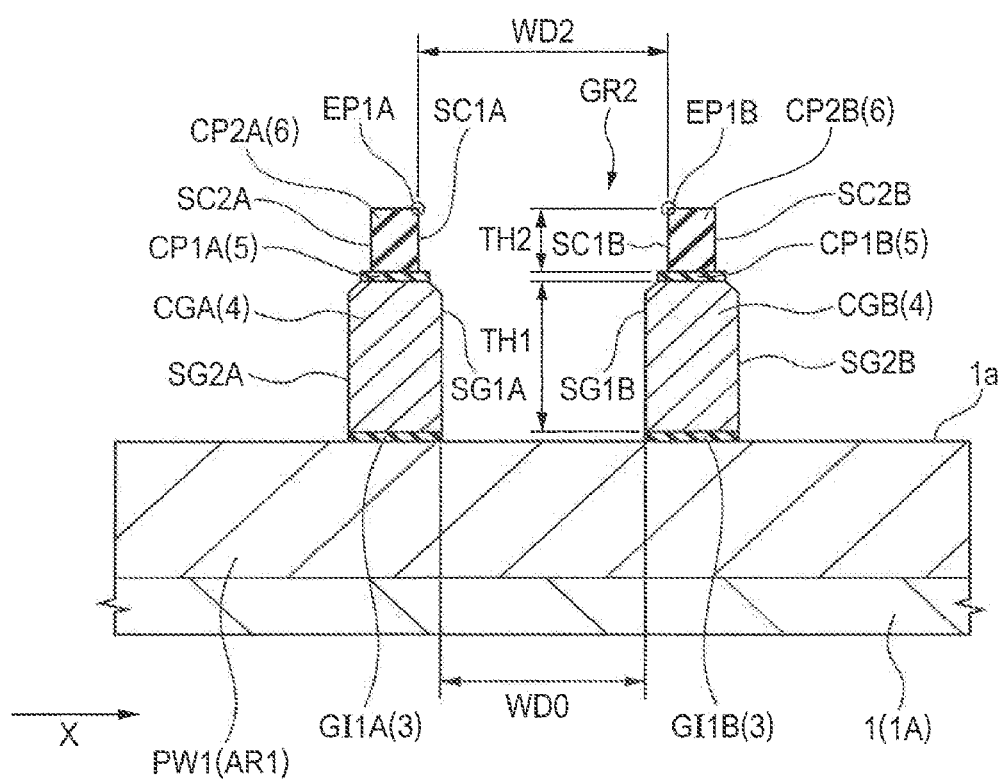
FIG. 34 is an essential part cross sectional view of the semiconductor device of Second Embodiment during a manufacturing step.

Then, by the adjustment of the etching conditions such as an increase in bias voltage to be applied to the semiconductor substrate 1 or a change in flow rate of the oxygen ($O_2$) gas, the photoresist pattern PR2 and the reaction product 4a are ashed or removed. Thus, over the main surface 1a of the semiconductor substrate 1, the insulation film 6, the insulation film 5, the conductive film 4, and the insulation film 3 are patterned. As a result, as shown in FIG. 34, over the main surface 1a of the semiconductor substrate 1, there are formed the control gate electrode CGA and the control gate electrode CGB each formed of the conductive film 4, spaced in the X axis direction, namely, the gate length direction. Further, there are formed a gate insulation film GI1A formed of the insulation film 3 between the control gate electrode CGA and the semiconductor substrate 1, and a gate insulation film GI1B formed of the insulation film 3 between the control gate electrode CGB and the semiconductor substrate 1. Then, there is formed the cap insulation film CP2A formed of the insulation film 6 over the control gate electrode CGA, and there is formed the cap insulation film CP2B formed of the insulation film 6 over the control gate electrode CGB. Further, there is formed the cap insulation film CP1A formed of the insulation film 5 between the control gate electrode CGA and the cap insulation film CP2A, and there is formed a cap insulation film CP1B formed of the insulation film 5 between the control gate electrode CGB and the cap insulation film CP2B.

As shown in FIG. 34, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR2. At the bottom part of the trench part GR2, the main surface 1a of the semiconductor substrate 1 is exposed. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR2 becomes equal to the sum of the thickness TH1 and the thickness TH2.

Further, the width in the X axis direction, namely, the gate length direction at the upper end of the trench part GR2 is referred to as a width WD2. At this step, as with First Embodiment, the width WD2 is larger than the distance WD0.

Further, as with the case described by reference to FIG. 2 in First Embodiment, the control gate electrode CGA and the control gate electrode CGB are formed in such a manner as to extend along the Y axis direction through over the active region AR1, over the element isolation region IR1, and over the active region AR2. Whereas, the cap insulation film CP2A and the cap insulation film CP2B are formed in such a manner as to extend along the Y axis direction through over the active region AR1, over the element isolation region IR1, and over the active region AR2.

Figure 35:
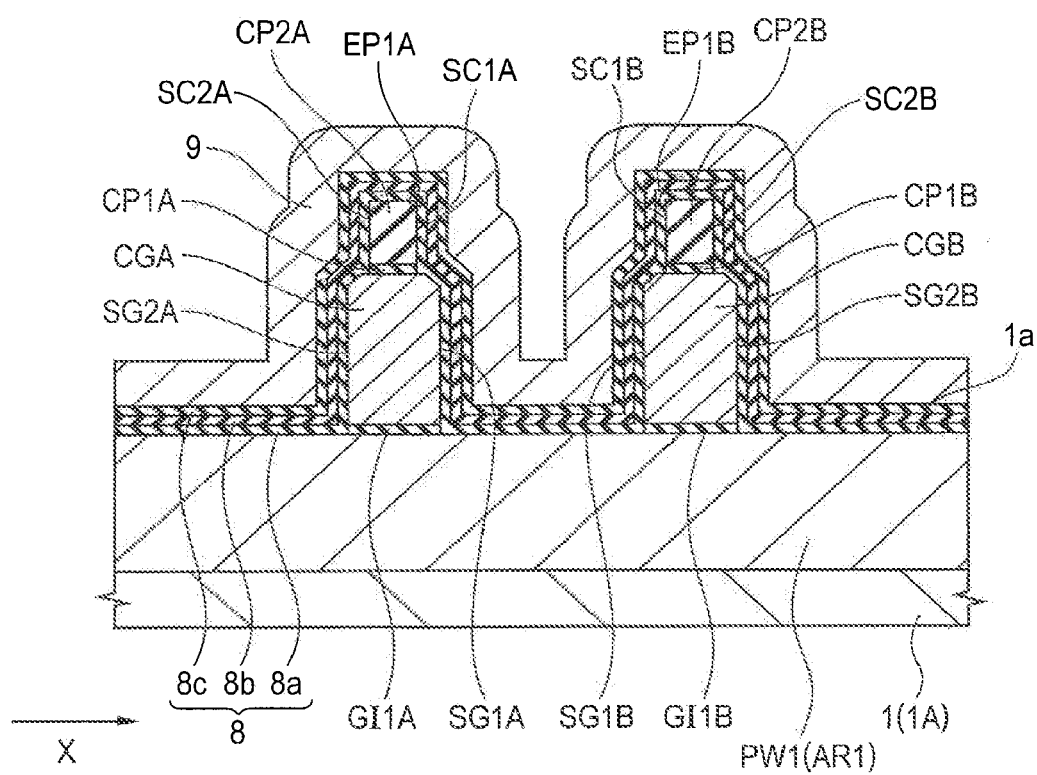
FIG. 35 is an essential part cross sectional view of the semiconductor device of Second Embodiment during a manufacturing step.

Then, the same steps as the steps described by reference to FIG. 12 in First Embodiment are performed. As a result, entirely over the main surface 1a of the semiconductor substrate 1, there is formed an insulation film 8 for the gate insulation film of the memory transistor. Then, the same steps as the steps described by reference to FIG. 13 in First Embodiment are performed. As a result, as shown in FIG. 35, entirely over the main surface 1a of the semiconductor substrate 1, in other words, over the insulation film 8, there is formed a conductive film 9.

Then, the same steps as the steps described by reference to FIGS. 14 to 24 in First Embodiment are performed. As a result, there is manufactured the semiconductor device of the present Second Embodiment described previously by reference to FIG. 28.

Main Features and Effects of the Present Embodiment

The semiconductor device of the present Second Embodiment also has the same features as the features of the semiconductor device of First Embodiment. With such a structure, the semiconductor device of the present Second Embodiment also has the same effects as the effects of the semiconductor device of First Embodiment.

Further, in the present Second Embodiment, as distinct from First Embodiment, the corner part between the top surface of the control gate electrode CGA and the side surface SG1A of the control gate electrode CGA on the control gate electrode CGB side is chamfered; and the corner part between the top surface of the control gate electrode CGA and the side surface SG2A of the control gate electrode CGA on the memory gate electrode MGA side is chamfered. Whereas, the corner part between the top surface of the control gate electrode CGB and the side surface SG1B of the control gate electrode CGB on the control gate electrode CGA side is chamfered; and the corner part between the top surface of the control gate electrode CGB and the side surface SG2B of the control gate electrode CGB on the memory gate electrode MGB side is chamfered.

With such a configuration, when the steps described by reference to FIG. 35 are performed, thereby to form the insulation film 8, the coverage and the uniformity of the thickness of the insulation film 8 can be improved. Therefore, for example, it is possible to readily improve the insulation property between the control gate electrode CGA and the memory gate electrode MGA, and the insulation property between the control gate electrode CGB and the memory gate electrode MGB. This can more improve the performances of the semiconductor device.

Incidentally, also in the present Second Embodiment, the more advantageous effects than those of Comparative Example 1 are produced as with First Embodiment, even when any one of the memory cells MCA and MCB has the same structure as the structure of the memory cell in the semiconductor device of the present Second Embodiment, and the other has the same structure as the structure of the memory cell in the semiconductor device of Comparative Example 1.

Third Embodiment

In the semiconductor device of First Embodiment, one side surface SC1A of the cap insulation film CP2A is set back from one side surface SG1A of the control gate electrode CGA, and the other side surface SC2A of the cap insulation film CP2A is set back from the other side surface SG2A of the control gate electrode CGA. In contrast, in a semiconductor device of Third Embodiment, one side surface SC1A of the cap insulation film CP2A is set back from one side surface SG1A of the control gate electrode CGA, but the other side surface SC2A of the cap insulation film CP2A is not set back from the other side surface SG2A of the control gate electrode CGA.

<Structure of Semiconductor Device>

Figure 36:
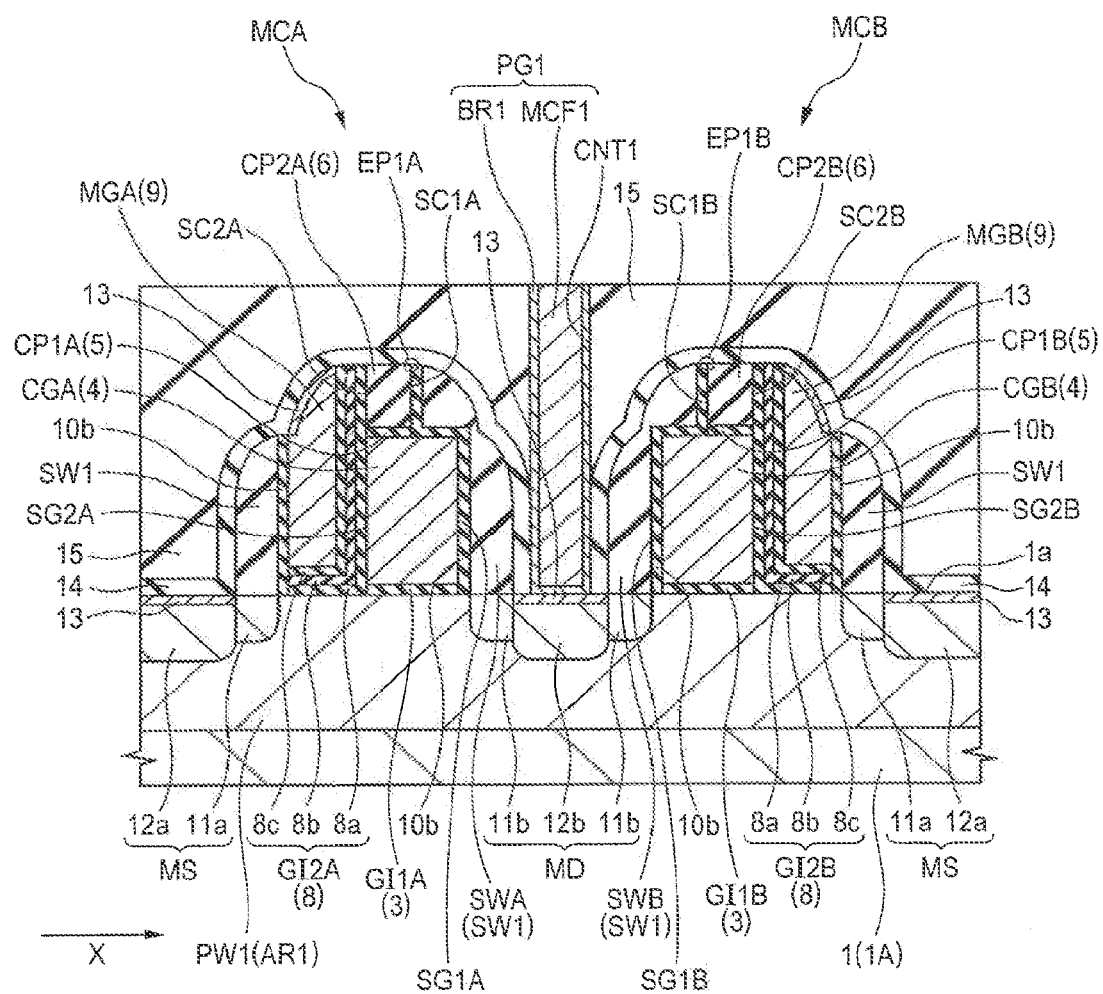
FIG. 36 is an essential part cross sectional view of a semiconductor device of Third Embodiment.

FIG. 36 is an essential part cross sectional view of a semiconductor device of Third Embodiment. FIG. 36 is, as with FIG. 1, a cross sectional view corresponding to a cross sectional view along line A-A of FIG. 2.

Respective portions of the semiconductor device of the present Third Embodiment other than the cap insulation films CP2A and CP2B, and the side wall spacers SW1 are the same as respective portions of the semiconductor device of First Embodiment other than the cap insulation films CP2A and CP2B, and the sidewall spacers SW1. Therefore, respective portions of the semiconductor device of the present Third Embodiment other than the cap insulation films CP2A and CP2B, and the side wall spacers SW1 will not be described.

Also in the present Third Embodiment, as with First Embodiment, in the main surface 1a, the end EP1A at the top surface of the cap insulation film CP2A on the control gate electrode CGB side is situated closer to the memory gate electrode MGA side than the side surface SG1A of the control gate electrode CGA on the control gate electrode CGB side. Whereas, in the main surface 1a, the end EP1B at the top surface of the cap insulation film CP2B on the control gate electrode CGA side is situated closer to the memory gate electrode MGB side than the side surface SG1B of the control gate electrode CGB on the control gate electrode CGA side.

Further, also in the present Third Embodiment, as with First Embodiment, the width of the cap insulation film CP2A in the X axis direction, namely, the gate length direction is smaller than the width of the control gate electrode CGA in the X axis direction, namely, the gate length direction. Namely, the side surface SC1A of the cap insulation film CP2A on the control gate electrode CGB side is set back from the side surface SG1A of the control gate electrode CGA on the control gate electrode CGB side toward the memory gate electrode MGA side. Whereas, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B on the control gate electrode CGA side is set back from the side surface SG1B of the control gate electrode CGB on the control gate electrode CGA side toward the memory gate electrode MGB side.

However, in the present Third Embodiment, as distinct from First Embodiment, the side surface SC2A of the cap insulation film CP2A on the memory gate electrode MGA side is not set back from the side surface SG2A of the control gate electrode CGA on the memory gate electrode MGA side toward the control gate electrode CGB side. Whereas, the side surface SC2B of the cap insulation film CP2B on the memory gate electrode MGB side is not set back from the side surface SG2B of the control gate electrode CGB on the memory gate electrode MGB side toward the control gate electrode CGA side.

For example, when the width of the control gate electrode CGA in the X axis direction in the present Third Embodiment is equal to the width of the control gate electrode CGA in the X axis direction in First Embodiment, the set-back amount of the side surface SC1A of the cap insulation film CP2A in the present Third Embodiment can be set larger than the set-back amount of the side surface SC1A of the cap insulation film CP2A in First Embodiment. Whereas, for example, when the width of the control gate electrode CGB in the X axis direction in the present Third Embodiment is equal to the width of the control gate electrode CGB in the X axis direction in First Embodiment, the set-back amount of the side surface SC1B of the cap insulation film CP2B in the present Third Embodiment can be set larger than the set-back amount of the side surface SC1B of the cap insulation film CP2B in First Embodiment.

Therefore, as compared with First Embodiment, it is possible to more prevent a cavity from being formed in a portion of the interlayer insulation film 15 between the control gate electrode CGA and the control gate electrode CGB. Then, as compared with First Embodiment, it is possible to more prevent the occurrence of the following: in the formed cavity, a barrier conductive film BR1 or a main conductive film MCF1 forming the plug PG1 and the plug PG2 (see FIG. 2) is formed, resulting in an electrical short circuit between the plug PG1 and the plug PG2.

Incidentally, the shape of the sidewall spacer SW1 will be described in conjunction with the method for manufacturing a semiconductor device described later.

Further, the operation of the memory cell MCA and the operation of the memory cell MCB in the semiconductor device of the present Third Embodiment are also the same as the operation of the memory cell MCA of the semiconductor device of First Embodiment, and hence will not be described.

<Method for Manufacturing a Semiconductor Device>

Then, a description will be given to a method for manufacturing a semiconductor device of the present Third Embodiment.

FIGS. 37 to 45 are each an essential part cross sectional view of the semiconductor device of Third Embodiment during a manufacturing step. FIGS. 37 to 45 each show the same cross section as the cross section shown in FIG. 36, and is a cross sectional view corresponding to the cross sectional view along line A-A of FIG. 2.

First, the steps described by reference to FIGS. 7 to 10 in First Embodiment are performed, thereby to provide a semiconductor substrate 1. Then, there are performed the steps up to the formation of the insulation film 7 at the side surfaces SG1A and SG2A of the control gate electrode CGA, and at the side surfaces SG1B and SG2B of the control gate electrode CGB.

Figure 37:
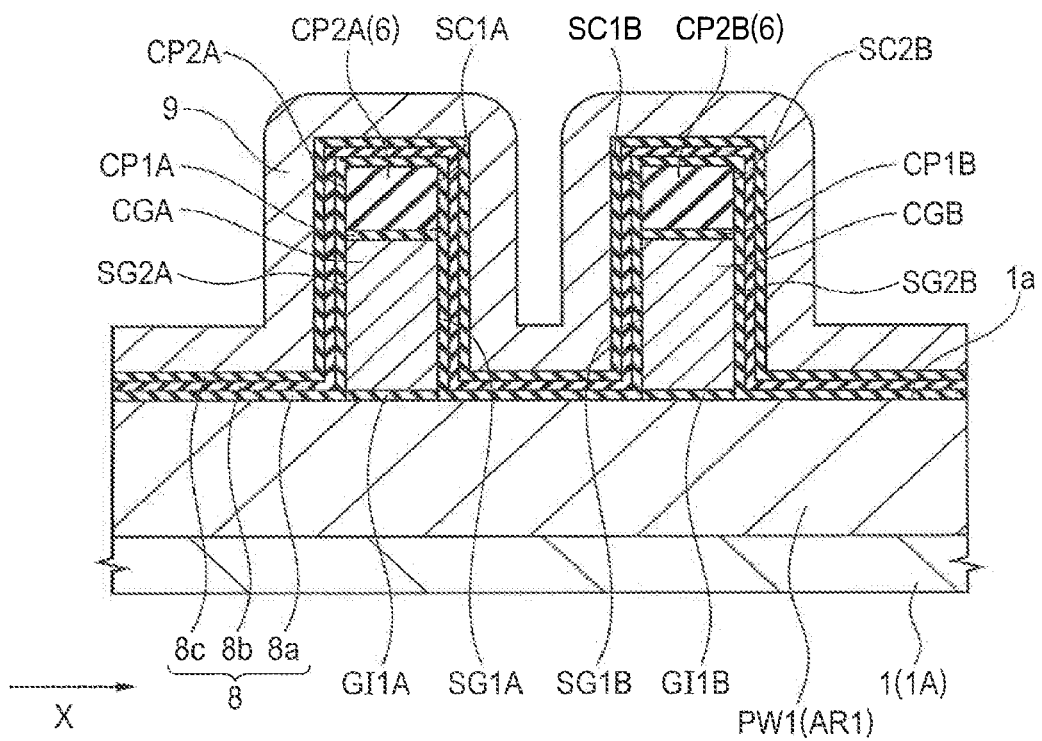
FIG. 37 is an essential part cross sectional view of the semiconductor device of Third Embodiment during a manufacturing step.

Then, the step described by reference to FIG. 11 in First Embodiment, namely, the step of slimming the cap insulation film CP2A and the cap insulation film CP2B is not performed, and the same step as the step described by reference to FIG. 12 in First Embodiment is performed. As a result, entirely over the main surface 1a of the semiconductor substrate 1, there is formed an insulation film 8 for the gate insulation film of a memory transistor. Then, the same step as the step described by reference to FIG. 13 in First Embodiment is performed. As a result, as shown in FIG. 37, a conductive film 9 is formed entirely over the main surface 1a of the semiconductor substrate 1, in other words, over the insulation film 8.

Figure 38:
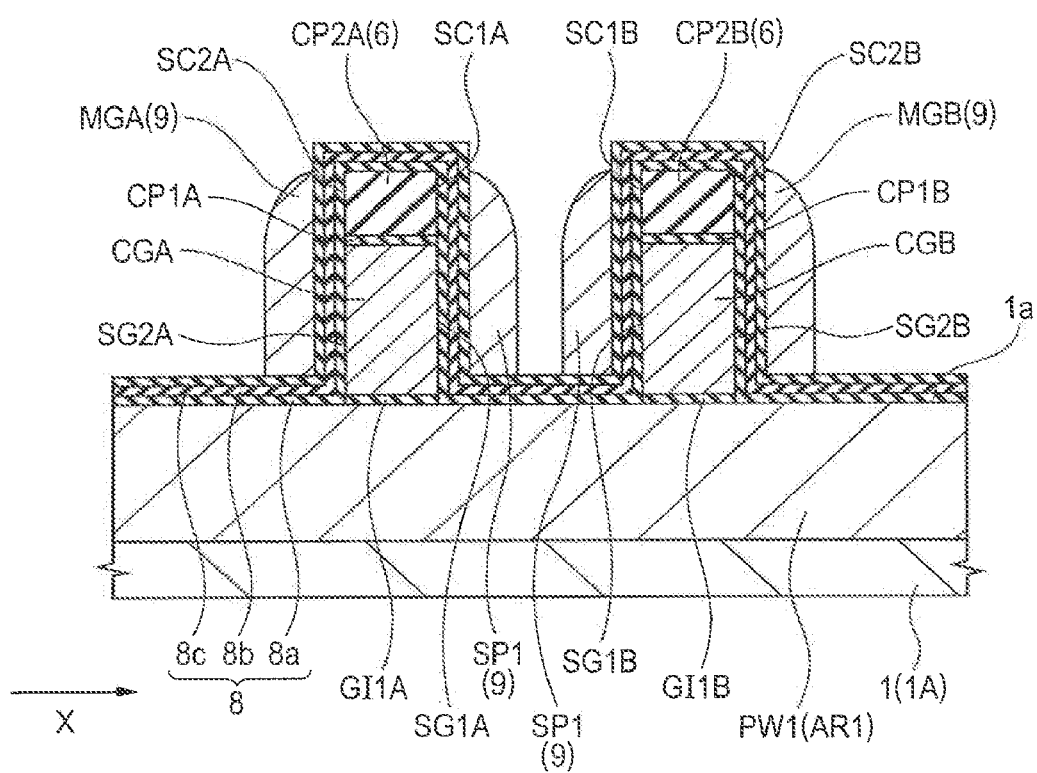
FIG. 38 is an essential part cross sectional view of the semiconductor device of Third Embodiment during a manufacturing step.

Then, the same step as the step described by reference to FIG. 14 in First Embodiment is performed. As a result, as shown in FIG. 38, there are formed a memory gate electrode MGA, a memory gate electrode MGB, and spacers SP1.

Figure 39:
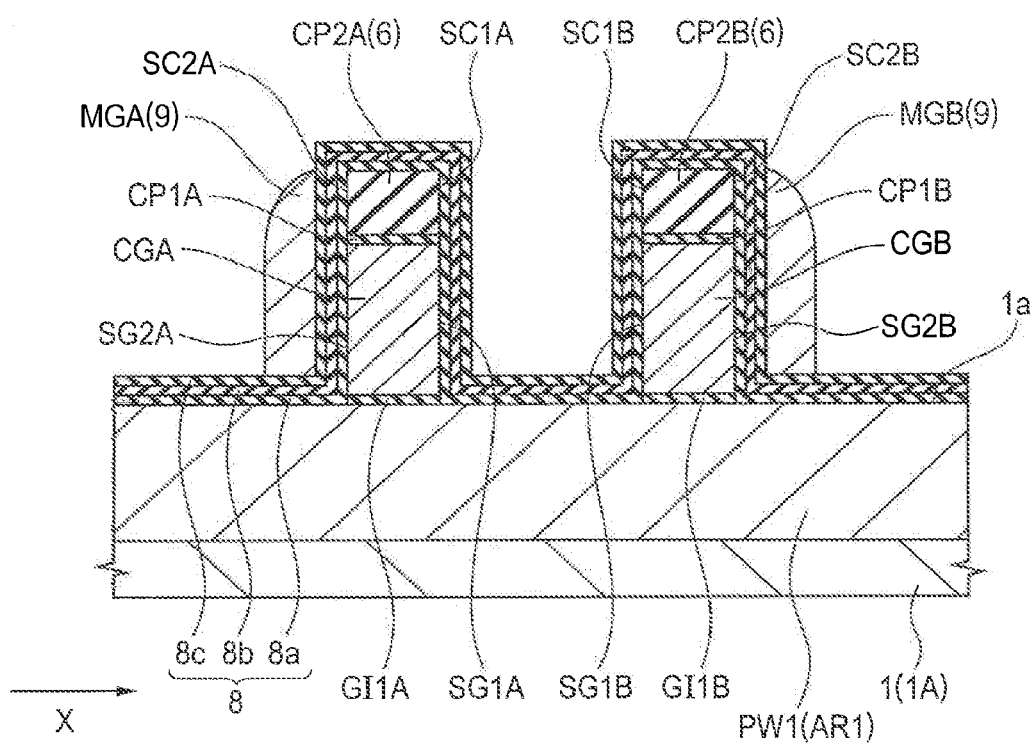
FIG. 39 is an essential part cross sectional view of the semiconductor device of Third Embodiment during a manufacturing step.

Then, the same step as the step described by reference to FIGS. 15 and 16 in First Embodiment is performed. As a result, as shown in FIG. 39, the memory gate electrode MGA and the memory gate electrode MGB are left, and the spacers SP1 are removed.

Figure 40:
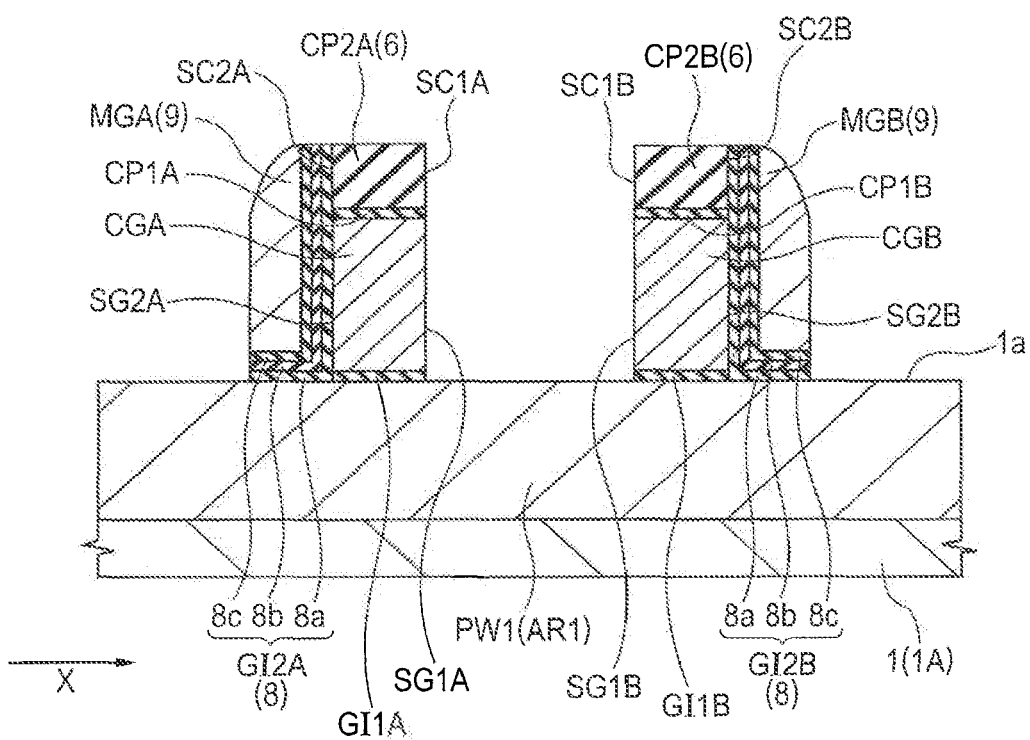
FIG. 40 is an essential part cross sectional view of the semiconductor device of Third Embodiment during a manufacturing step.

Then, the same step as the step described by reference to FIG. 17 in First Embodiment is performed. As a result, as shown in FIG. 40, the portions of the insulation film 8 exposed without being covered with the memory gate electrode MGA and the memory gate electrode MGB are removed by etching such as wet etching.

Figure 41:
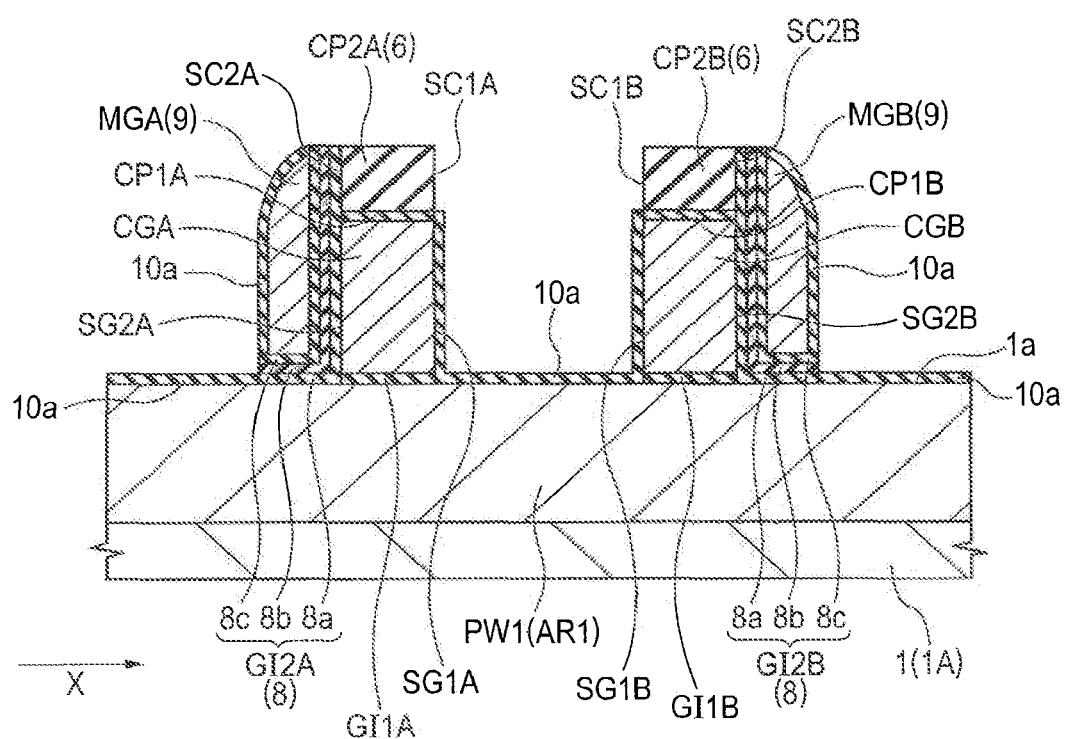
FIG. 41 is an essential part cross sectional view of the semiconductor device of Third Embodiment during a manufacturing step.

Then, as shown in FIG. 41, the insulation film 10a is formed at the side surface of the control gate electrode CGA, the side surface and the top surface of the memory gate electrode MGA, and the side surface of the control gate electrode CGB, and the side surface and the top surface of the memory gate electrode MGB. As the step of forming the insulation film 10a, there can be performed the same step as the step of forming the insulation film 10 of the steps described by reference to FIG. 18 in First Embodiment.

Figure 42:
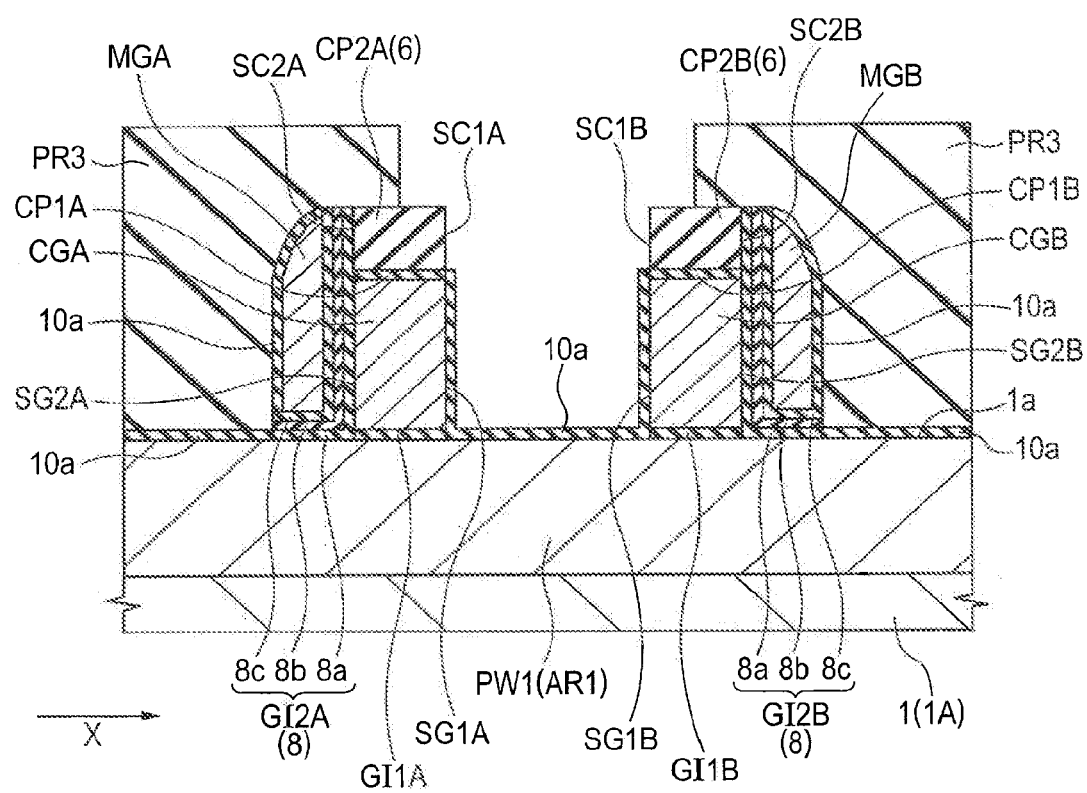
FIG. 42 is an essential part cross sectional view of the semiconductor device of Third Embodiment during a manufacturing step.

Then, as shown in FIG. 42, using a photolithography technology, a photoresist pattern PR3 is formed over the semiconductor substrate 1. The photoresist pattern PR3 is such a photoresist pattern as to cover the memory gate electrode MGA and the memory gate electrode MGB, and as to expose the portion of the cap insulation film CP2A on the control gate electrode CGB side, and the portion of the cap insulation film CP2B on the control gate electrode CGA side.

Figure 43:
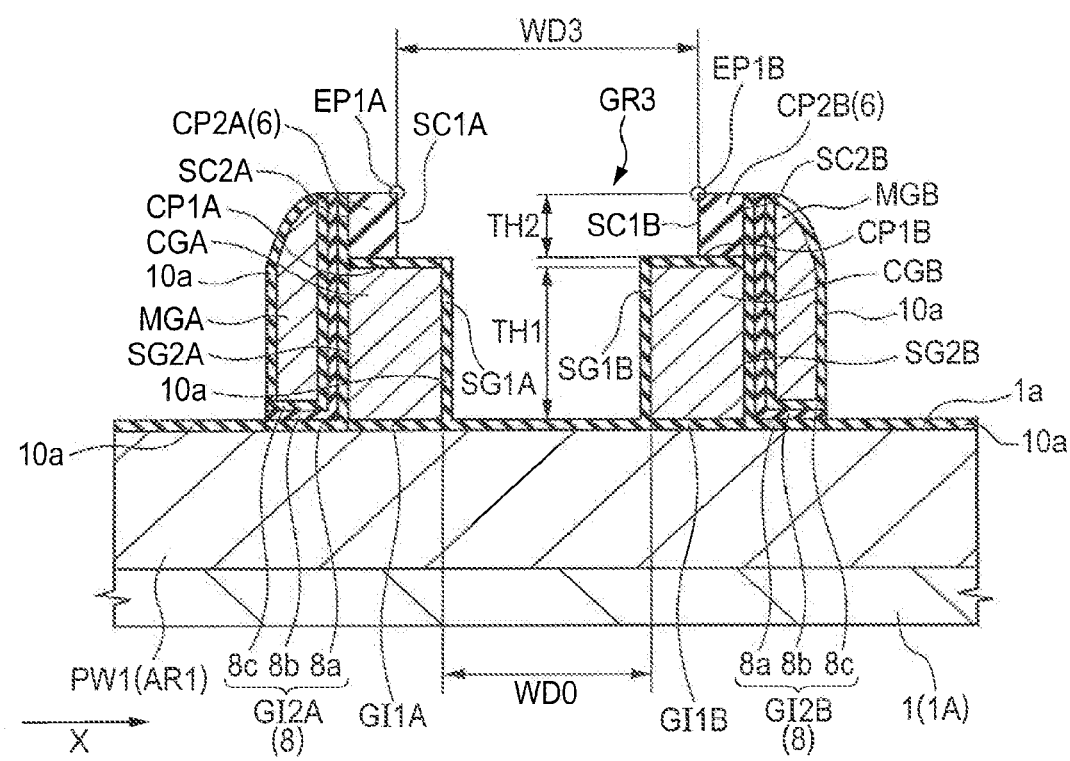
FIG. 43 is an essential part cross sectional view of the semiconductor device of Third Embodiment during a manufacturing step.

Then, dry etching using the photoresist pattern PR3 as an etching mask is performed. By the dry etching, the portion of the cap insulation film CP2A on the control gate electrode CGB side is etched and removed, and the portion of the cap insulation film CP2B on the control gate electrode CGA side is etched and removed. Then, the photoresist pattern PR3 is removed. As a result, as shown in FIG. 43, the side surface SC1A of the cap insulation film CP2A on the control gate electrode CGB side is set back from the side surface SG1A of the control gate electrode CGA on the control gate electrode CGB side toward the memory gate electrode MGA side. Whereas, the side surface SC1B of the cap insulation film CP2B on the control gate electrode CGA side is set back from the side surface SG1B of the control gate electrode CGB on the control gate electrode CGA side toward the memory gate electrode MGB side.

As shown in FIG. 43, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR3. The bottom part of the trench part GR3 is the main surface 1a of the semiconductor substrate 1 including the insulation film 10a formed at the top surface thereof. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR3 becomes equal to the sum of the thickness TH1 and the thickness TH2. Further, the width in the X axis direction, namely, the gate length direction at the upper end of the trench part GR3 is referred to as a width WD3.

In the present Third Embodiment, the distance by which the side surface SC1A of the cap insulation film CP2A is set back from the side surface SG1A of the control gate electrode CGA, namely, the set-back amount can be set at, for example, about 50 nm. Further, the distance by which the side surface SC1B of the cap insulation film CP2B is set back from the side surface SG1B of the control gate electrode CGB, namely, the set-back amount can be set at, for example, about 50 nm. The set-back amount corresponds to half the distance between the width WD3 and the distance WD0 shown in FIG. 43. Namely, the distance between the width WD3 and the distance WD0 shown in FIG. 43 can be set at, for example, about 100 nm.

For example, when the width of the control gate electrode CGA in the X axis direction in the present Third Embodiment is equal to the width of the control gate electrode CGA in the X axis direction in First Embodiment, the width WD3 at the top end of the trench part GR3 can be set larger than the width WD1 at the top end of the trench part GR1 in First Embodiment. Whereas, for example, when the width of the control gate electrode CGB in the X axis direction in the present Third Embodiment is equal to the width of the control gate electrode CGB in the X axis direction in First Embodiment, the width WD3 at the top end of the trench part GR3 can be set larger than the width WD1 at the top end of the trench part GR1 in First Embodiment.

With the method for manufacturing the semiconductor device of the present Third Embodiment, as the photomask for forming the photoresist pattern PR3, there can be used a photomask having the same mask pattern as the mask pattern of the photomask for use in the step described by reference to FIG. 39. Therefore, it is possible to reduce the number of photomasks for use in the manufacturing steps of the semiconductor device. This can reduce the manufacturing cost of the semiconductor device.

Figure 44:
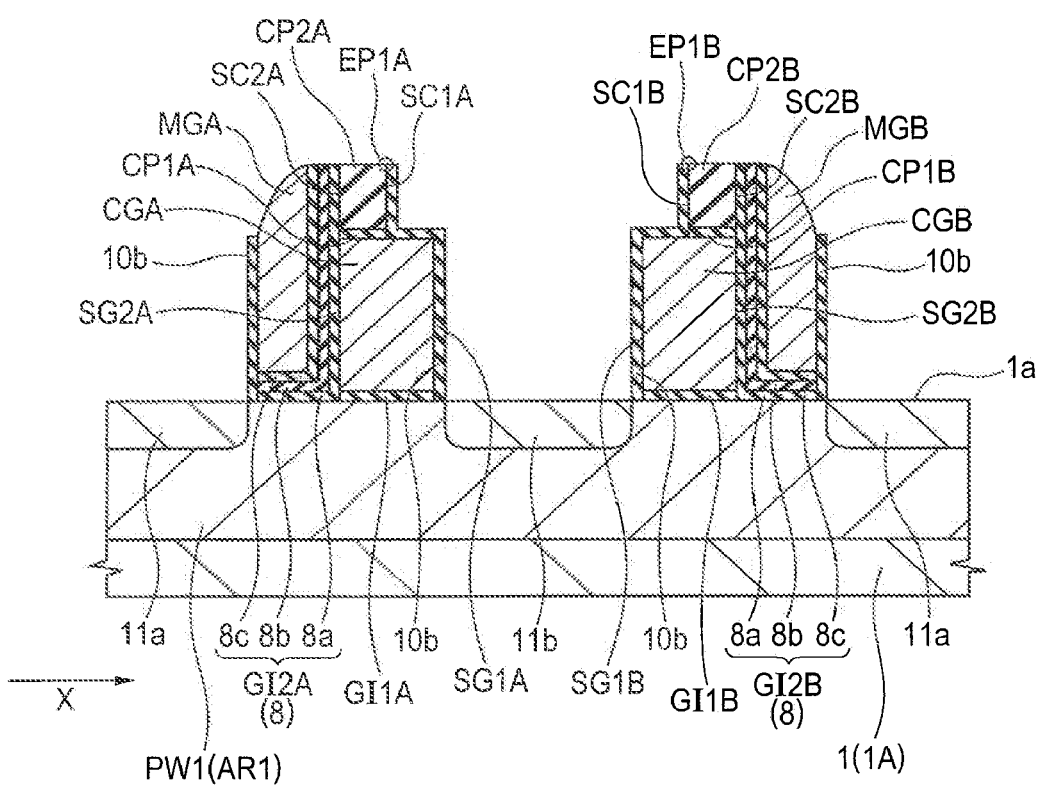
FIG. 44 is an essential part cross sectional view of the semiconductor device of Third Embodiment during a manufacturing step.

Then, the same steps as the steps described by reference to FIG. 18 in First Embodiment are performed. As a result, as shown in FIG. 44, an insulation film 10b is formed at the side surface SG1A of the control gate electrode CGA, the side surface of the memory gate electrode MGA, the side surface SG1B of the control gate electrode CGB, and the side surface of the memory gate electrode MGB. As the step of forming the insulation film 10b, there can be performed the same step as the step of forming the insulation film 10 of the steps described by reference to FIG. 18 in First Embodiment. Further, n⁻ type semiconductor regions 11a and 11b are formed. At this step, the insulation film 10a is removed at the top surface of the memory gate electrode MGA, and the top surface of the memory gate electrode MGB. Incidentally, the insulation film 10a can also be left at the top surface of the memory gate electrode MGA, and the top surface of the memory gate electrode MGB.

Figure 45:
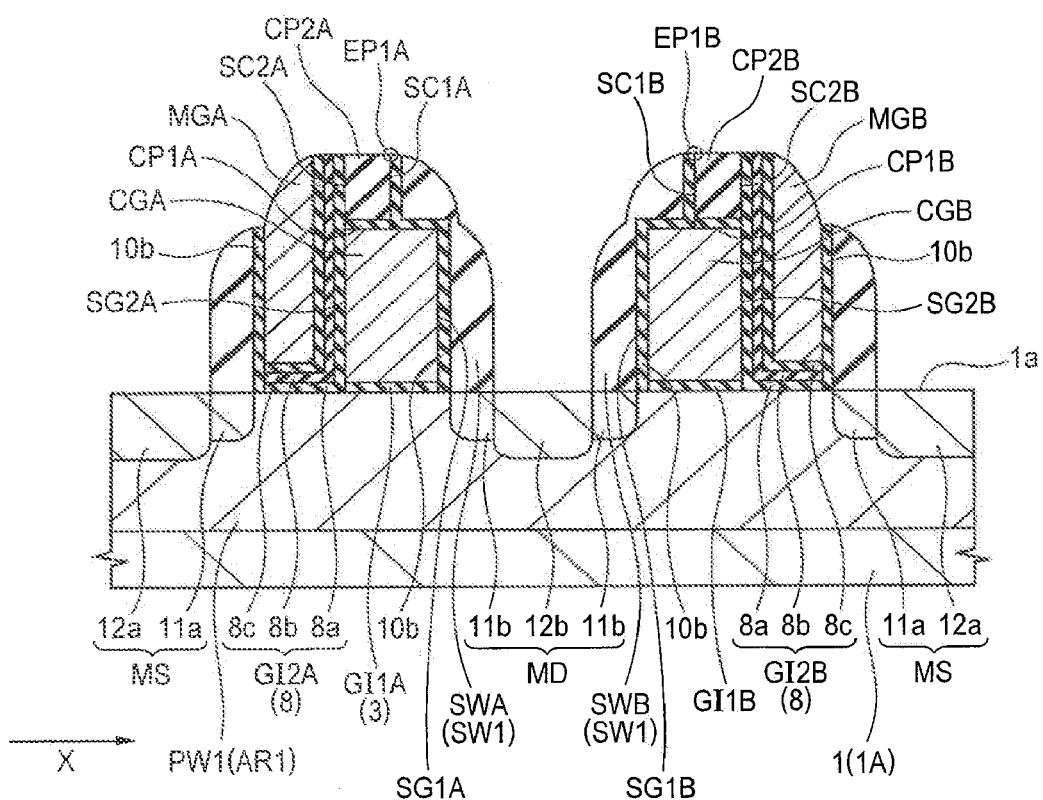
FIG. 45 is an essential part cross sectional view of the semiconductor device of Third Embodiment during a manufacturing step.

Then, the same steps as the steps described by reference to FIG. 19 in First Embodiment are performed. As a result, as shown in FIG. 45, sidewall spacers SW1 are formed at the side surface SG1A of the control gate electrode CGA, the side surface SC1A of the cap insulation film CP2A, and the side surface of the memory gate electrode MGA opposite to the control gate electrode CGA side. Whereas, sidewall spacers SW1 are formed at the side surface SG1B of the control gate electrode CGB, the side surface SC1B of the cap insulation film CP2B, and the side surface of the memory gate electrode MGB opposite to the control gate electrode CGB side.

Incidentally, as shown in FIG. 45, the sidewall spacers SW1 respectively formed at the side surface SG1A of the control gate electrode CGA, and the side surface SC1A of the cap insulation film CP2A via the insulation films 10b are sidewall spacers SWA. Whereas, the sidewall spacers SW1 respectively formed at the side surface SG1B of the control gate electrode CGB, and the side surface SC1B of the cap insulation film CP2B via the insulation films 10b are sidewall spacers SWB.

In the present Third Embodiment, the width WD3 (see FIG. 43) at the top end of the trench part GR3 can be set larger than the width WD1 at the top end of the trench part GR1 in First Embodiment. Therefore, the distance between the sidewall spacer SW1 formed at the side surface SC1A of the cap insulation film CP2A and the sidewall spacer SW1 formed at the side surface SC1B of the cap insulation film CP2B in the X axis direction becomes still larger than that in First Embodiment.

Then, the same steps as the steps described by reference to FIGS. 20 to 24 in First Embodiment are performed, thereby to manufacture the semiconductor device of the present Third Embodiment described by reference to FIG. 36.

Main Features and Effects of the Present Embodiment

The semiconductor device of the present Third Embodiment has the same features as the features of the semiconductor device of First Embodiment, except that the side surface SC2A of the cap insulation film CP2A is not set back from the side surface SG2A of the control gate electrode CGA, and that the side surface SC2B of the cap insulation film CP2B is not set back from the side surface SG2B of the control gate electrode CGB.

With such a structure, the semiconductor device of the present Third Embodiment also has the same effects as the effects of the semiconductor device of First Embodiment.

However, in the present Third Embodiment, the side surface SC2A of the cap insulation film CP2A is not set back from the side surface SG2A of the control gate electrode CGA, and the side surface SC2B of the cap insulation film CP2B is not set back from the side surface SG2B of the control gate electrode CGB. For this reason, as compared with Comparative Example 1 described in First Embodiment, the present Third Embodiment does not have an effect of reducing the electrical resistance between the plug (not shown) electrically coupled with the memory gate electrode MGA and the memory gate electrode MGA, and the electrical resistance between the plug (not shown) electrically coupled with the memory gate electrode MGB and the memory gate electrode MGB.

On the other hand, for example, when the width of the control gate electrode CGA in the X axis direction in the present Third Embodiment is equal to the width of the control gate electrode CGA in the X axis direction in First Embodiment, the set-back amount of the side surface SC1A of the cap insulation film CP2A in the present Third Embodiment can be set larger than the set-back amount of the side surface SC1A of the cap insulation film CP2A in First Embodiment. Whereas, for example, when the width of the control gate electrode CGB in the X axis direction in the present Third Embodiment is equal to the width of the control gate electrode CGB in the X axis direction in First Embodiment, the set-back amount of the side surface SC1B of the cap insulation film CP2B in the present Third Embodiment can be set larger than the set-back amount of the side surface SC1B of the cap insulation film CP2B in First Embodiment.

Therefore, as compared with First Embodiment, it is possible to more prevent the plug PG1 and the plug PG2 (see FIG. 2) from being electrically short-circuited.

Further, with the method for manufacturing the semiconductor device of the present Third Embodiment, as the photomask for forming the photoresist pattern PR3, there can be used a photomask having the same mask pattern as the mask pattern of the photomask for use in the step described by reference to FIG. 39. Therefore, it is possible to reduce the number of photomasks for use in the manufacturing steps of the semiconductor device. This can reduce the manufacturing cost of the semiconductor device.

Incidentally, also in the present Third Embodiment, even when, as with First Embodiment, any one of the memory cells MCA and MCB has the same structure as the structure of the memory cell of the semiconductor device of the present Third Embodiment, and the other has the same structure as the structure of the memory cell of the semiconductor device of Comparative Example 1, there are produced more advantageous effects than in Comparative Example.

Fourth Embodiment

In the semiconductor device of First Embodiment, the side surface SC1A of the cap insulation film CP2A is set back from the side surface SG1A of the control gate electrode CGA, and the side surface SC1B of the cap insulation film CP2B is set back from the side surface SG1B of the control gate electrode CGB. In contrast, in a semiconductor device of Fourth Embodiment, the portion of the upper layer part of the cap insulation film CP2A on the control gate electrode CGB side is removed, and the portion of the upper layer part of the cap insulation film CP2B on the control gate electrode CGA side is removed.

<Structure of Semiconductor Device>

Figure 46:
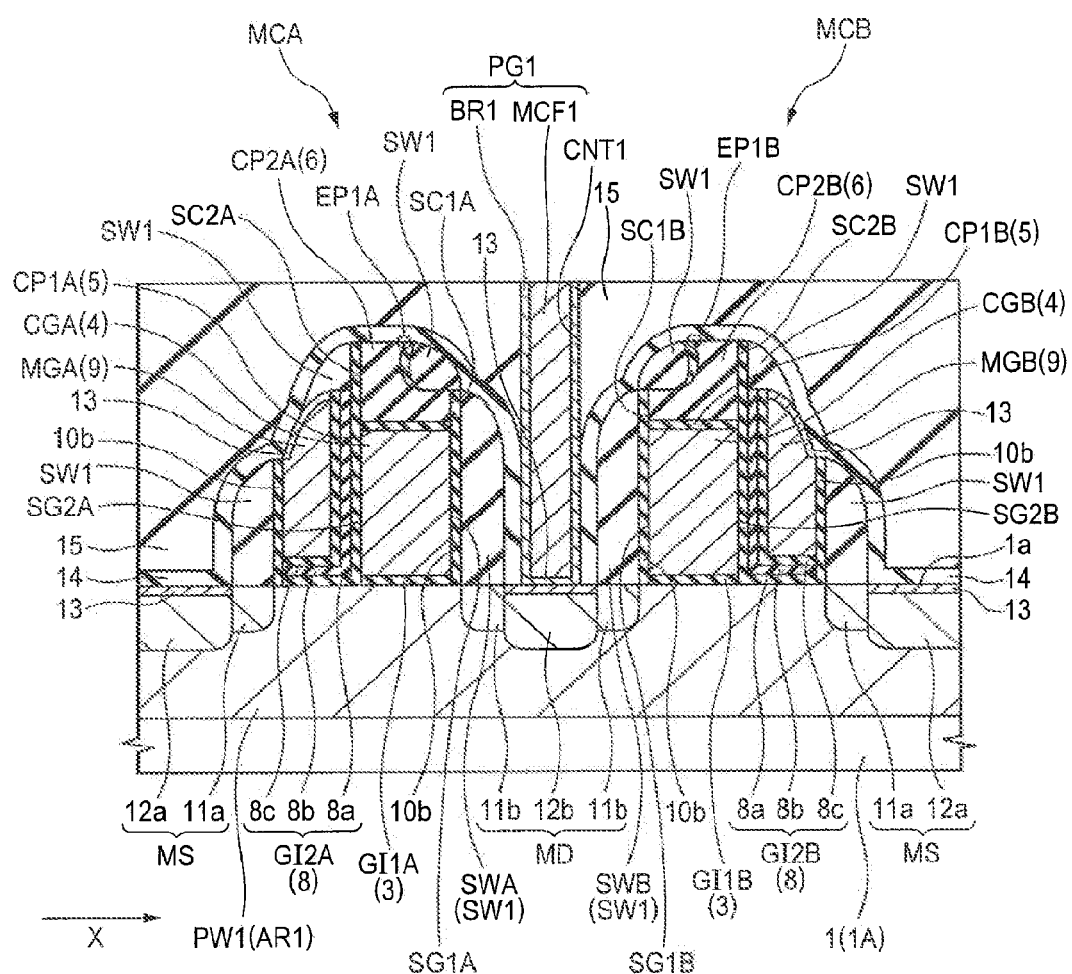
FIG. 46 is an essential part cross sectional view of a semiconductor device of Fourth Embodiment.

FIG. 46 is an essential part cross sectional view of the semiconductor device of Fourth Embodiment. FIG. 46 is, as with FIG. 1, a cross sectional view corresponding to the cross sectional view along line A-A of FIG. 2.

Respective portions of the semiconductor device of the present Fourth Embodiment other than the cap insulation films CP2A and CP2B, the memory gate electrodes MGA and MGB, and the sidewall spacers SW1 are the same as respective portions of the semiconductor device of First Embodiment. Therefore, respective portions of the semiconductor device of the present Fourth Embodiment other than the cap insulation films CP2A and CP2B, the memory gate electrodes MGA and MGB, and the sidewall spacers SW1 will not be described.

Also in the present Fourth Embodiment, as with First Embodiment, in the main surface 1a, the end EP1A at the top surface of the cap insulation film CP2A on the control gate electrode CGB side is situated closer to the memory gate electrode MGA side than the side surface SG1A of the control gate electrode CGA on the control gate electrode CGB side. Whereas, in the main surface 1a, the end EP1B at the top surface of the cap insulation film CP2B on the control gate electrode CGA side is situated closer to the memory gate electrode MGB side than the side surface SG1B of the control gate electrode CGB on the control gate electrode CGA side.

However, in the present Fourth Embodiment, as distinct from First Embodiment, the portion of the upper layer part of the cap insulation film CP2A on the control gate electrode CGB side is removed. Namely, the corner part between the top surface of the cap insulation film CP2A and the side surface SC1A of the cap insulation film CP2A on the control gate electrode CGB side is removed. However, at the lower layer part of the cap insulation film CP2A, the side surface SC1A of the cap insulation film CP2A on the control gate electrode CGB side is not set back from the side surface SG1A of the control gate electrode CGA on the control gate electrode CGB side toward the memory gate electrode MGA side.

Whereas, the portion of the upper layer part of the cap insulation film CP2B on the control gate electrode CGA side is removed. Namely, the corner part between the top surface of the cap insulation film CP2B and the side surface SC1B of the cap insulation film CP2B on the control gate electrode CGA side is removed. However, at the lower layer part of the cap insulation film CP2B, the side surface SC1B of the cap insulation film CP2B on the control gate electrode CGA side is not set back from the side surface SG1B of the control gate electrode CGB on the control gate electrode CGA side toward the memory gate electrode MGB side.

Further, in the present Fourth Embodiment, as with Third Embodiment, the side surface SC2A of the cap insulation film CP2A on the memory gate electrode MGA side is not set back from the side surface SG2A of the control gate electrode CGA on the memory gate electrode MGA side toward the control gate electrode CGB side. Whereas, the side surface SC2B of the cap insulation film CP2B on the memory gate electrode MGB side is not set back from the side surface SG2B of the control gate electrode CGB on the memory gate electrode MGB side toward the control gate electrode CGA side.

Incidentally, the sidewall spacers SW1 including the sidewall spacers SWA and SWB are, as with First Embodiment, formed at the side surfaces of the control gate electrodes CGA and CGB, the side surfaces of the cap insulation films CP2A and CP2B, and the side surfaces of the memory gate electrodes MGA and MGB.

Whereas, in the present Fourth Embodiment, the height position at the top end of the memory gate electrode MGA is lower than the height position of the top surface of the cap insulation film CP2A, and the height position at the top end of the memory gate electrode MGB is lower than the height position of the top surface of the cap insulation film CP2B. For this reason, the sidewall spacers SW1 are also formed at the side surface SC2A of the upper layer part of the cap insulation film CP2A on the memory gate electrode MGA side, and the side surface SC2B of the upper layer part of the cap insulation film CP2B on the memory gate electrode MGB side.

Whereas, the operation of the memory cell MCA and the operation of the memory cell MCB in the semiconductor device of the present Fourth Embodiment are also the same as the operation of the memory cell MCA in the semiconductor device of First Embodiment, and hence will not be described.

<Method for Manufacturing a Semiconductor Device>

Then, a description will be given to a method for manufacturing the semiconductor device of the present Fourth Embodiment.

FIGS. 47 to 56 are each an essential part cross sectional view of the semiconductor device of Fourth Embodiment during a manufacturing step. FIG. 47 to 56 each show the same cross section as the cross section shown in FIG. 46, and is a cross sectional view corresponding to the cross sectional view along line A-A of FIG. 2.

Figure 47:
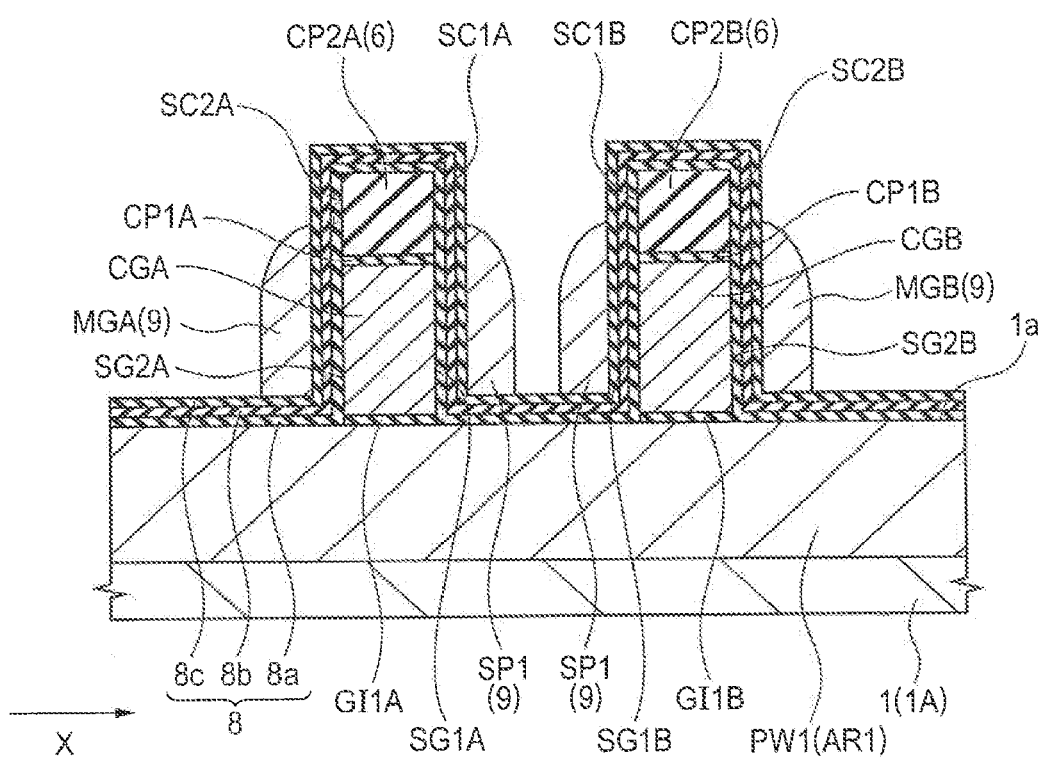
FIG. 47 is an essential part cross sectional view of the semiconductor device of Fourth Embodiment during a manufacturing step.

First, the same steps as the steps described by reference to FIG. 38 in Third Embodiment are performed. As a result, as shown in FIG. 47, there are formed a memory gate electrode MGA, a memory gate electrode MGB, and spacers SP1.

In the present Fourth Embodiment, as distinct from Third Embodiment, the conductive film 9 is etched back so that the thickness of the conductive film 9 to be etched back in the etching back step is larger than the thickness of the conductive film 9. For example, the height position at the top end of the conductive film 9 left at the opposite side surfaces of the control gate electrode CGA, and the opposite side surfaces of the control gate electrode CGB via the insulation film 8 is set at, for example, the height position of each center of the cap insulation film CP2A and the cap insulation film CP2B in the thickness direction. As a result, in a step described later by reference to FIG. 53, the portion of the upper layer part of the cap insulation film CP2A on the control gate electrode CGB side can be removed, and the portion of the upper layer part of the cap insulation film CP2B on the control gate electrode CGA side can be removed.

Figure 48:
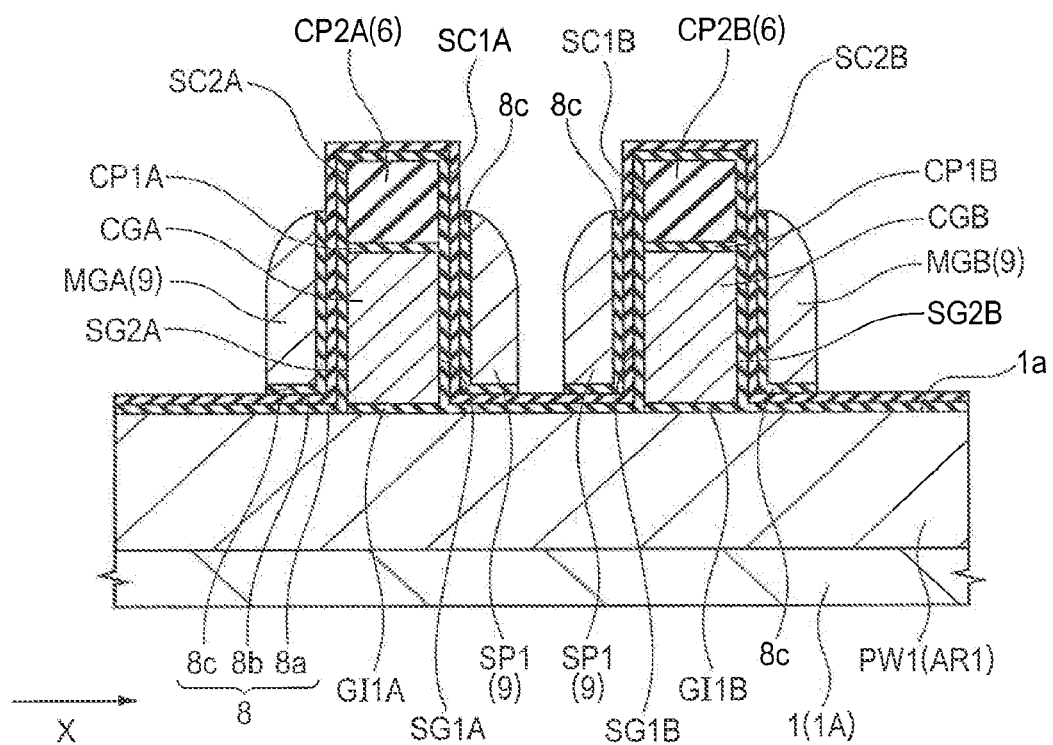
FIG. 48 is an essential part cross sectional view of the semiconductor device of Fourth Embodiment during a manufacturing step.

Then, as shown in FIG. 48, the portions of the silicon oxide film 8c not covered with the memory gate electrodes MGA and MGB, and the spacers SP1 are removed. By wet etching using, for example, a hydrofluoric acid (HF) aqueous solution, or the like, the portions of the silicon oxide film 8c not covered with the memory gate electrodes MGA and MGB, and the spacers SP1 are removed. As a result, the portions of the silicon nitride film 8b not covered with the memory gate electrodes MGA and MGB, and the spacers SP1 are exposed.

In other words, at the top surface and portions of the side surfaces of the cap insulation film CP2A, the silicon oxide film 8c is etched and removed, so that the silicon nitride film 8b is exposed. Whereas, at the top surface and portions of the side surfaces of the cap insulation film CP2B, the silicon oxide film 8c is etched and removed, so that the silicon nitride film 8b is exposed.

Incidentally, the portions of the silicon oxide film 8c not covered with the memory gate electrodes MGA and MGB, and the spacers SP1 are not required to be fully removed. Even when the silicon oxide film 8c is left very thinly, the device can be allowed to function as with the case where the silicon oxide film 8c has been fully removed in a step described later by reference to FIG. 49.

Figure 49:
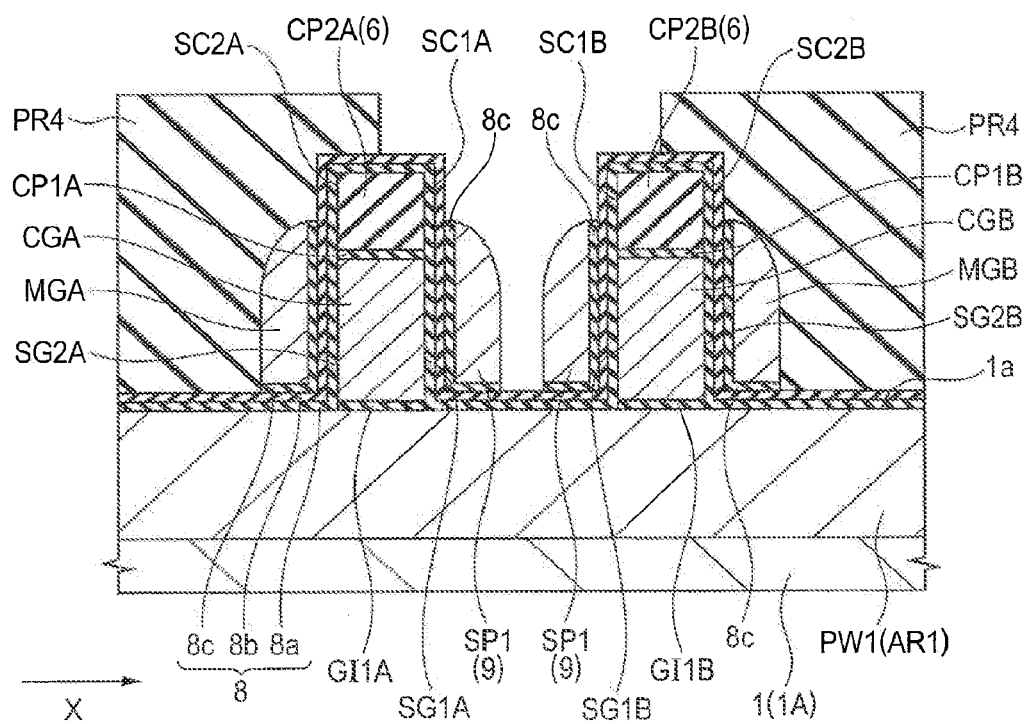
FIG. 49 is an essential part cross sectional view of the semiconductor device of Fourth Embodiment during a manufacturing step.

Then, as shown in FIG. 49, using a photolithography technology, a photoresist pattern PR4 is formed over the semiconductor substrate 1. The photoresist pattern PR4 is such a photoresist pattern as to cover the memory gate electrode MGA, the memory gate electrode MGB, the portion of the cap insulation film CP2A on the memory gate electrode MGA side, and the portion of the cap insulation film CP2B on the memory gate electrode MGB side. Further, the photoresist pattern PR4 is such a photoresist pattern as to expose the portion of the cap insulation film CP2A on the control gate electrode CGB side, and the portion of the cap insulation film CP2B on the control gate electrode CGA side.

Figure 50:
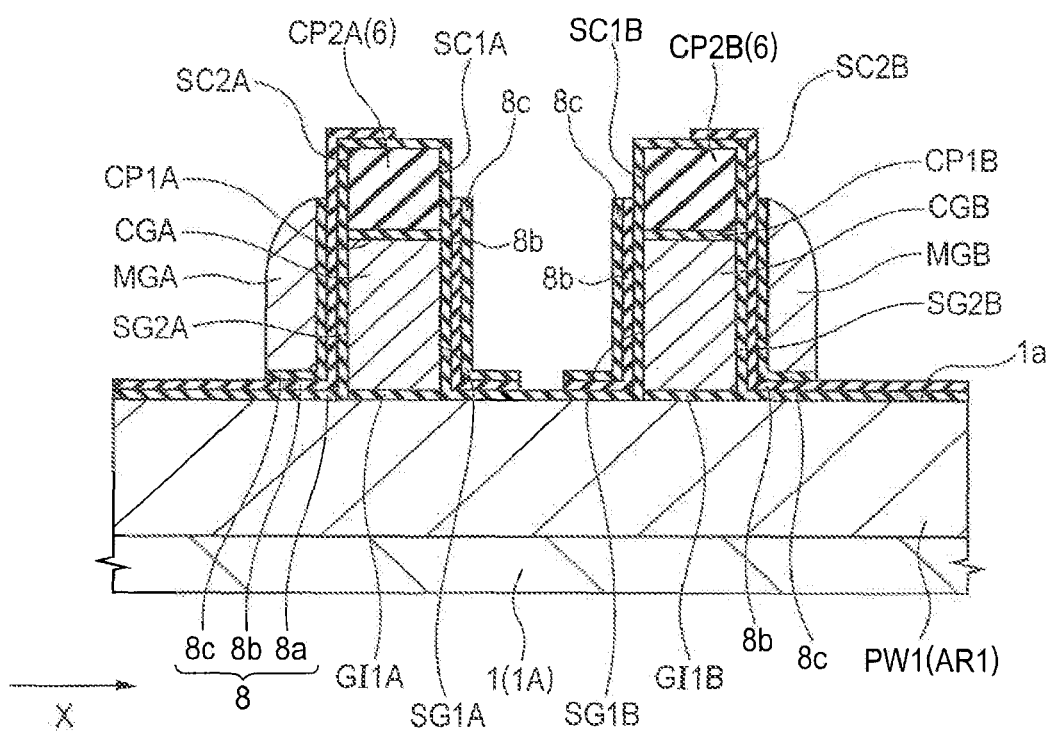
FIG. 50 is an essential part cross sectional view of the semiconductor device of Fourth Embodiment during a manufacturing step.

Then, by dry etching using the formed photoresist pattern PR4 as an etching mask, the spacers SP1 are removed. Then, the photoresist pattern PR4 is removed. As a result, as shown in FIG. 50, the spacers SP1 are removed. However, the memory gate electrode MGA and the memory gate electrode MGB were covered with the photoresist pattern PR4, and hence has been left without being etched.

In the present Fourth Embodiment, in the step described by reference to FIG. 49, the portions of the silicon oxide film 8c not covered with the memory gate electrode MGA, the memory gate electrode MGB, and the spacers SP1 are removed, and the silicon nitride film 8b is exposed. Accordingly, as shown in FIG. 50, when the spacers SP1 formed of, for example, a silicon film are etched and removed, the exposed portions of the silicon nitride film 8b are etched and removed. As a result, the silicon oxide film 8a is exposed.

Namely, at the top surface and the side surface at the portion of the upper layer part of the cap insulation film CP2A on the control gate electrode CGB side, the silicon nitride film 8b is etched and removed. As a result, the silicon oxide film 8a is exposed. Whereas, at the top surface and the side surface at the portion of the upper layer part of the cap insulation film CP2B on the control gate electrode CGA side, the silicon nitride film 8b is etched and removed. As a result, the silicon oxide film 8a is exposed.

Figure 51:
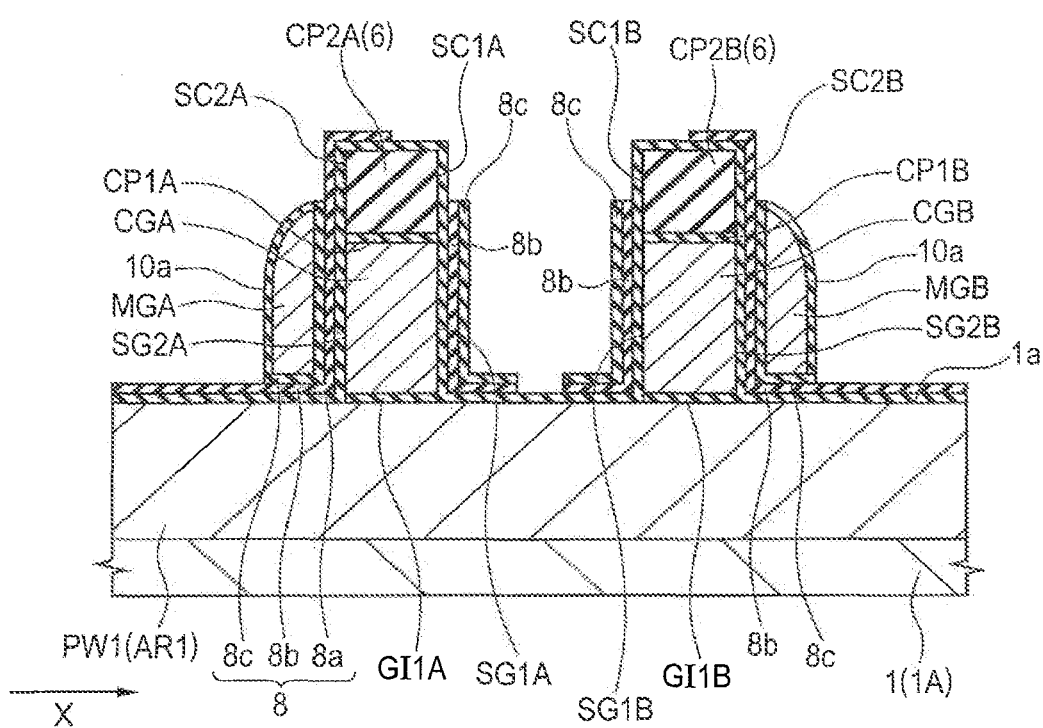
FIG. 51 is an essential part cross sectional view of the semiconductor device of Fourth Embodiment during a manufacturing step.

Then, the same steps as the steps described by reference to FIG. 41 in Third Embodiment are performed. As a result, as shown in FIG. 51, insulation films 10a are formed at the side surface and the top surface of the memory gate electrode MGA, and the side surface and the top surface of the memory gate electrode MGB. As the step of forming the insulation film 10a, there can be performed the same step as the step of forming the insulation film 10 of the steps described by reference to FIG. 18 in First Embodiment.

Figure 52:
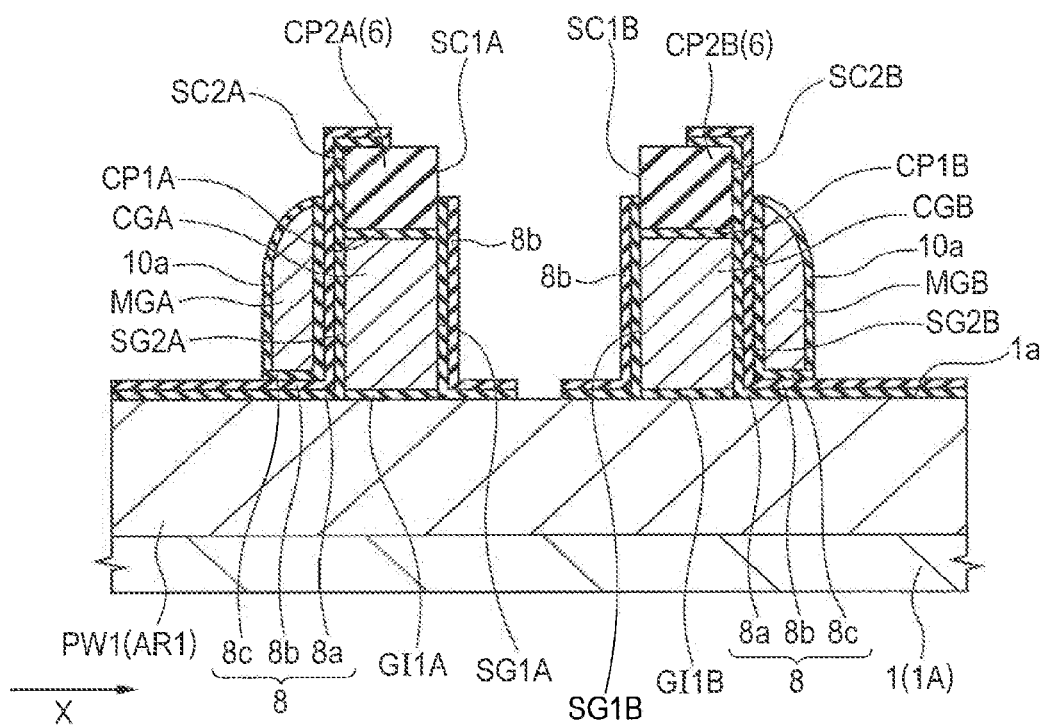
FIG. 52 is an essential part cross sectional view of the semiconductor device of Fourth Embodiment during a manufacturing step.

Then, as shown in FIG. 52, the portion of the silicon oxide film 8a not covered with the silicon nitride film 8b is removed. For example, by dry etching or wet etching using a hydrofluoric acid (HF) aqueous solution, the portion of the silicon oxide film 8a not covered with the silicon nitride film 8b is removed. As a result, the portion of the upper layer part of the cap insulation film CP2A on the control gate electrode CGB side is exposed, and the portion of the upper layer part of the cap insulation film CP2B on the control gate electrode CGA side is exposed. Namely, the corner part between the top surface of the cap insulation film CP2A and the side surface SC1A of the, cap insulation film CP2A on the control gate electrode CGB side is exposed, and the corner part between the top surface of the cap insulation film CP2B and the side surface SC1B of the cap insulation film CP2B on the control gate electrode CGA side is exposed.

Incidentally, as shown in FIG. 52, by adjusting the etching conditions, it is possible to leave the insulation films 10a formed at the side surface and the top surface of the memory gate electrode MGA, and the side surface and the top surface of the memory gate electrode MGB.

Figure 53:
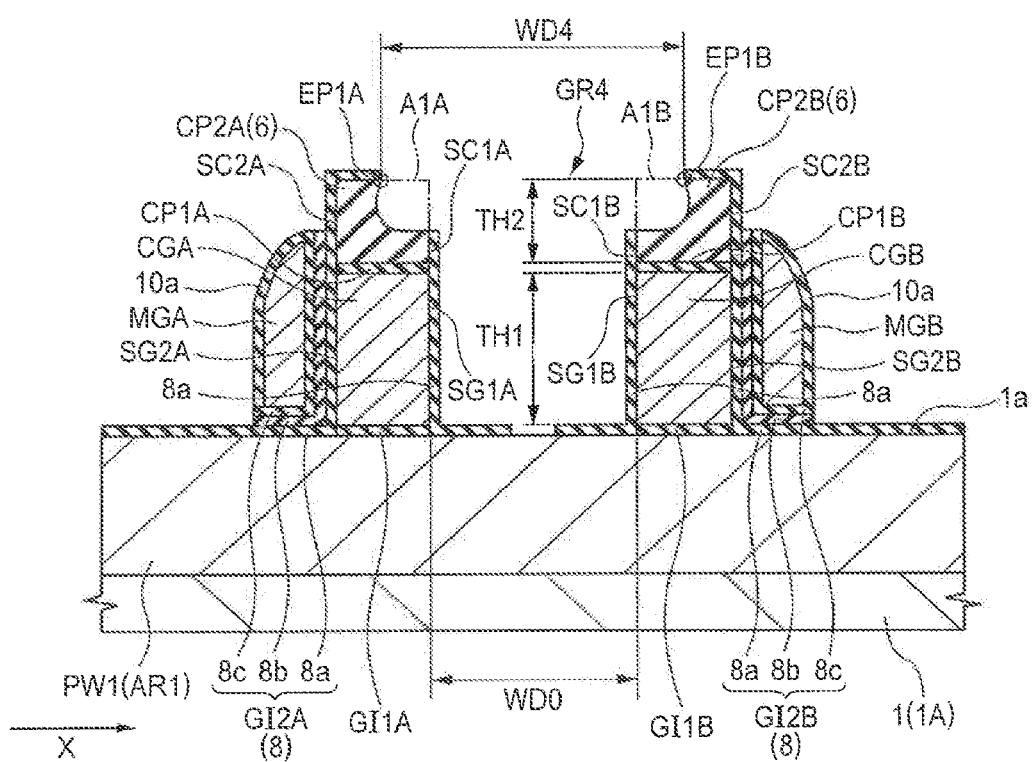
FIG. 53 is an essential part cross sectional view of the semiconductor device of Fourth Embodiment during a manufacturing step.

Then, as shown in FIG. 53, the portion of the upper layer part of the cap insulation film CP2A on the control gate electrode CGB side, and the portion of the upper layer part of the cap insulation film CP2B on the control gate electrode CGA side are etched and removed. Namely, the corner part A1A between the top surface of the cap insulation film CP2A and the side surface SC1A of the cap insulation film CP2A on the control gate electrode CGB side is etched and removed. The corner part A1B between the top surface of the cap insulation film CP2B and the side surface SC1B of the cap insulation film CP2B on the control gate electrode CGA side is etched and removed. For etching of the cap insulation film CP2A and the cap insulation film CP2B, there can be performed the same step as the step of slimming using a hot phosphoric acid described by reference to FIG. 11 in First Embodiment.

As shown in FIG. 53, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR4. The bottom part of the trench part GR4 is the main surface 1a of the semiconductor substrate 1 including the silicon oxide film 8a left at a part of the top surface thereof. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR4 becomes equal to the sum of the thickness TH1 and the thickness TH2. Further, the width in the X axis direction, namely, the gate length direction at the upper end of the trench part GR4 is referred to as a width WD4.

At this step, the width WD4 at the top end of the trench part GR4 can be set larger than the width WD100 at the top end of the trench part GR100 in Comparative Example 1.

Incidentally, when portions of the cap insulation film CP2A and the cap insulation film CP2B are etched and removed, the portions of the silicon nitride film 8b not covered with the memory gate electrode MGA and the memory gate electrode MGB are removed. Accordingly, the portions of the silicon oxide film 8a not covered with the memory gate electrode MGA and the memory gate electrode MGB are exposed.

Figure 54:
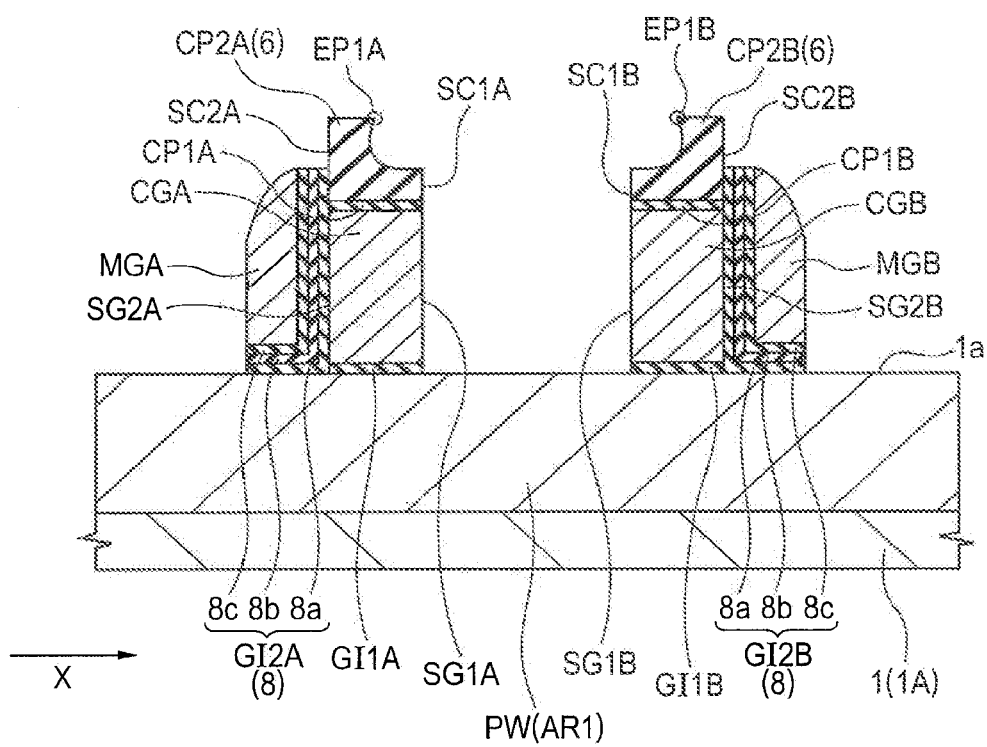
FIG. 54 is an essential part cross sectional view of the semiconductor device of Fourth Embodiment during a manufacturing step.

Then, as shown in FIG. 54, the portions of the silicon oxide film 8a not covered with the memory gate electrode MGA and the memory gate electrode MGB are removed. For example, by dry etching or wet etching using a hydrofluoric acid (HF) aqueous solution, the portions of the silicon oxide film 8a not covered with the memory gate electrode MGA and the memory gate electrode MGB are removed. At this step, the insulation films 10a can be removed at the side surface and the top surface of the memory gate electrode MGA, and the side surface and the top surface of the memory gate electrode MGB.

Figure 55:
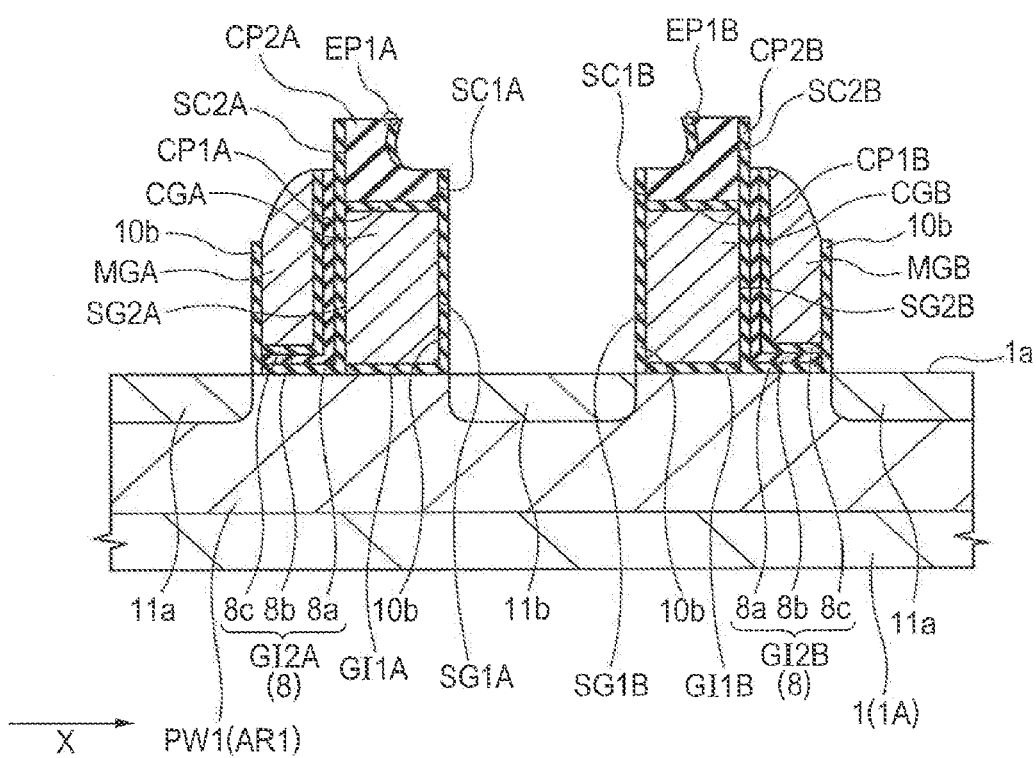
FIG. 55 is an essential part cross sectional view of the semiconductor device of Fourth Embodiment during a manufacturing step.

Then, the same steps as the steps described by reference to FIG. 18 in First Embodiment are performed. As a result, as shown in FIG. 55, insulation films 10b are formed at the side surface SG1A of the control gate electrode CGA, the side surface of the memory gate electrode MGA, and the side surface SG1B of the control gate electrode CGB, and the side surface of the memory gate electrode MGB. Further, n⁻ type semiconductor regions 11a and 11b are formed.

Figure 56:
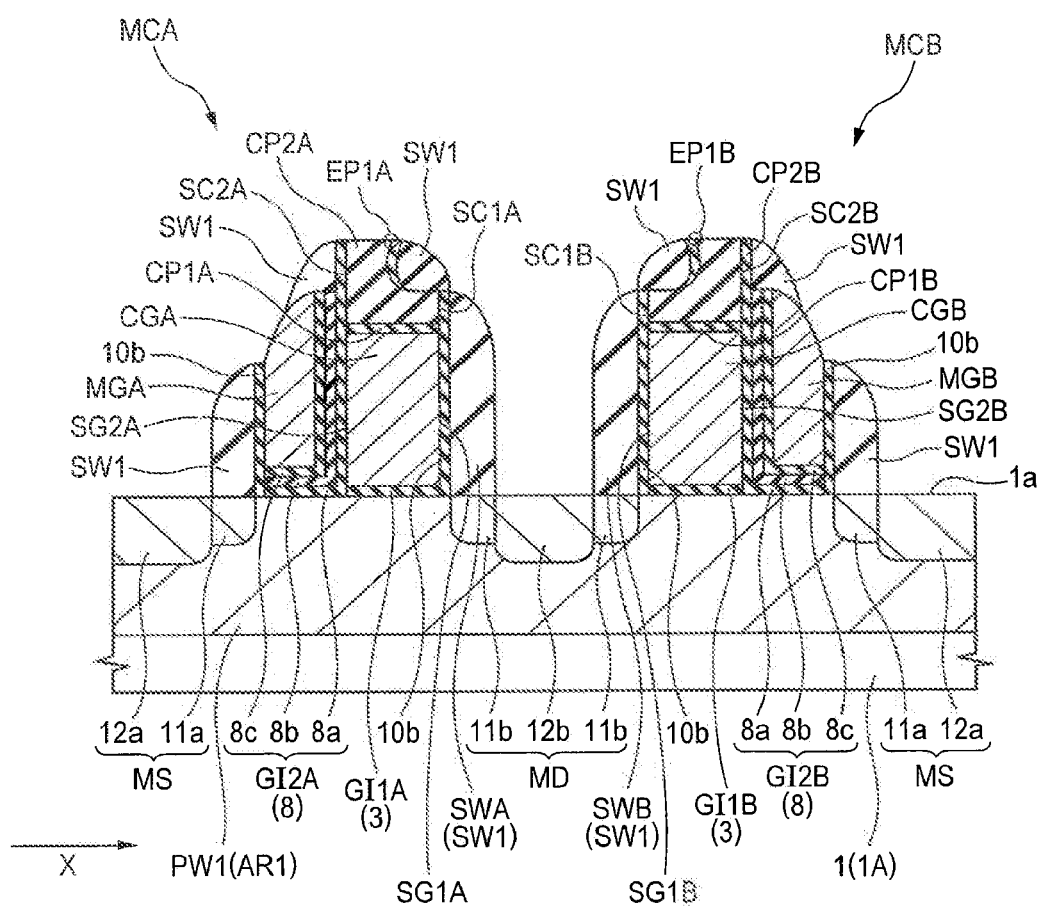
FIG. 56 is an essential part cross sectional view of the semiconductor device of Fourth Embodiment during a manufacturing step.

Then, the same steps as the steps described by reference to FIG. 19 in First Embodiment are performed. As a result, as shown in FIG. 56, the sidewall spacers SW1 are formed at the side surface SG1A of the control gate electrode CGA, the side surface SC1A of the cap insulation film CP2A, and the side surface of the memory gate electrode MGA opposite to the control gate electrode CGA side. Whereas, the sidewall spacers SW1 are formed at the side surface SG1B of the control gate electrode CGB, the side surface SC1B of the cap insulation film CP2B, and the side surface of the memory gate electrode MGB opposite to the control gate electrode CGB side.

Incidentally, as shown in FIG. 56, the sidewall spacer SW1 formed at the side surface SG1A of the control gate electrode CGA, and the side surface SC1A of the cap insulation film CP2A via the insulation film 10b is a sidewall spacer SWA. Whereas, the sidewall spacer SW1 formed at the side surface SG1B of the control gate electrode CGB, and the side surface SC1B of the cap insulation film CP2B via the insulation film 10b is a sidewall spacer SWB.

Then, the same steps as the steps described by reference to FIGS. 20 to 24 in First Embodiment are performed. As a result, there is manufactured the semiconductor device of the present Fourth Embodiment described previously be reference to FIG. 46.

Main Features and Effects of the Present Embodiment

The semiconductor device of the present Fourth Embodiment also has the same features as the features of the semiconductor device of First Embodiment, except that the side surface SC2A of the cap insulation film CP2A is not set back from the side surface SG2A of the control gate electrode CGA, and that the side surface SC2B of the cap insulation film CP2B is not set back from the side surface SG2B of the control gate electrode CGB.

In addition to such features, in the present Fourth Embodiment, the corner part between the top surface of the cap insulation film CP2A and the side surface SC1A of the cap insulation film CP2A on the control gate electrode CGB side is removed, and the corner part between the top surface of the cap insulation film CP2B and the side surface SC1B of the cap insulation film CP2B on the control gate electrode CGA side is removed.

Herein, a consideration will be given to the case where the width of the control gate electrode CGA in the X axis direction in the present Fourth Embodiment is equal to the width of the control gate electrode CGA in the X axis direction in First Embodiment. In such a case, the set-back amount of the side surface SC1A at the lower layer part of the cap insulation film CP2A in the present Fourth Embodiment is smaller than the set-back amount of the side surface SC1A of the cap insulation film CP2A in First Embodiment. However, the set-back amount of the side surface SC1A at the upper layer part of the cap insulation film CP2A in the present Fourth Embodiment is larger than the set-back amount of the side surface SC1A of the cap insulation film CP2A in First Embodiment.

Further, a consideration will be given to the case where the width of the control gate electrode CGB in the X axis direction in the present Fourth Embodiment is equal to the width of the control gate electrode CGB in the X axis direction in First Embodiment. In such a case, the set-back amount of the side surface SC1B at the lower layer part of the cap insulation film CP2B in the present Fourth Embodiment is smaller than the set-back amount of the side surface SC1B of the cap insulation film CP2B in First Embodiment. However, the set-back amount of the side surface SC1B at the upper layer part of the cap insulation film CP2B in the present Fourth Embodiment is larger than the set-back amount of the side surface SC1B of the cap insulation film CP2B in First Embodiment.

Therefore, the effect of preventing the formation of the cavity in the interlayer insulation film 15 of the semiconductor device of the present Fourth Embodiment is roughly comparable to the effect of preventing the formation of the cavity in the interlayer insulation film 15 in the semiconductor device of First Embodiment. In other words, the semiconductor device of the present Fourth Embodiment also has the same effects as the effects of the semiconductor device of First Embodiment.

However, in the present Fourth Embodiment, the side surface SC2A of the cap insulation film CP2A is not set back from the side surface SG2A of the control gate electrode CGA, and the side surface SC2B of the cap insulation film CP2B is not set back from the side surface SG2B of the control gate electrode CGB. For this reason, as compared with Comparative Example 1 described in First Embodiment, the present Fourth Embodiment does not has an effect of reducing the electrical resistance between the plug (not shown) electrically coupled with the memory gate electrode MGA and the memory gate electrode MGA, and the electrical resistance between the plug (not shown) electrically coupled with the memory gate electrode MGB and the memory gate electrode MGB.

Incidentally, the present Fourth Embodiment also has more advantageous effects than those of Comparative Example 1, even when, as with First Embodiment, any one of the memory cells MCA and MCB has the same structure as the structure of the memory cell of the semiconductor device in the present Fourth Embodiment, and the other has the same structure as the structure of the memory cell of the semiconductor device of Comparative Example 1.

Fifth Embodiment

In the semiconductor device of First Embodiment, the side surface SC1A of the cap insulation film CP2A, the side surface SG1A of the control gate electrode CGA, the side surface SC1B of the cap insulation film CP2B, and the side surface SG1B of the control gate electrode CGB are planes normal to the main surface 1a of the semiconductor substrate 1. In contrast, in a semiconductor device of Fifth Embodiment, the side surface SC1A of the cap insulation film CP2A, the side surface SG1A of the control gate electrode CGA, the side surface SC1B of the cap insulation film CP2B, and the side surface SG1B of the control gate electrode CGB are inclined from the plane normal to the main surface 1a of the semiconductor substrate 1.

<Structure of Semiconductor Device>

Figure 57:
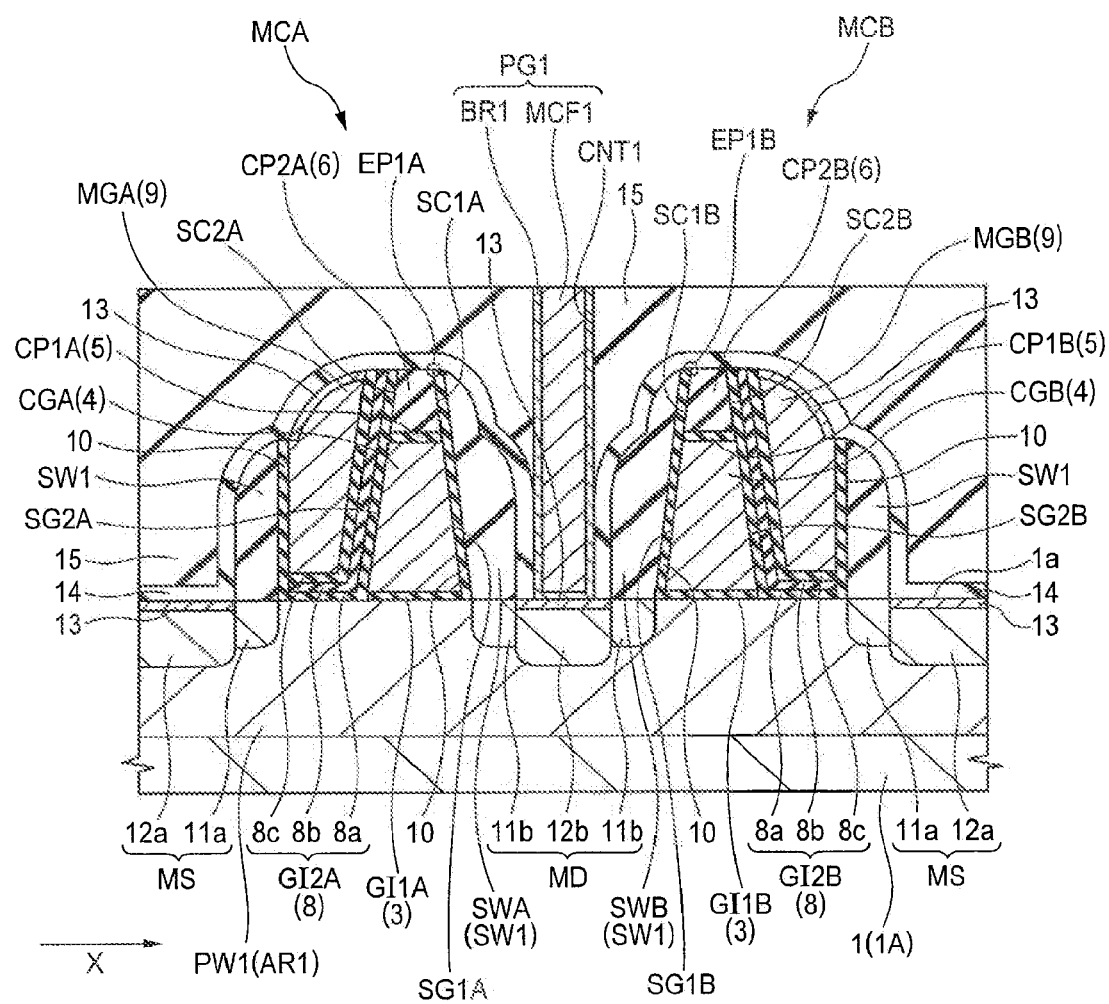
FIG. 57 is an essential part cross sectional view of a semiconductor device of Fifth Embodiment.

FIG. 57 is an essential part cross sectional view of the semiconductor device of Fifth Embodiment. FIG. 57 is, as with FIG. 1, a cross sectional view corresponding to the cross sectional view along line A-A of FIG. 2.

Respective portions of the semiconductor device of the present Fifth Embodiment other than the control gate electrodes CGA and CGB, and the cap insulation films CP2A and CP2B are the same as respective portions of the semiconductor device of First Embodiment other than the control gate electrodes CGA and CGB, and the cap insulation films CP2A and CP2B. Therefore, respective portions of the semiconductor device of the present Fifth Embodiment other than the control gate electrodes CGA and CGB, and the cap insulation films CP2A and CP2B will not be described.

Also in the present Fifth Embodiment, as with First Embodiment, in the main surface 1a, the end EP1A at the top surface of the cap insulation film CP2A on the control gate electrode CGB side is situated closer to the memory gate electrode MGA side than the side surface SG1A of the control gate electrode CGA on the control gate electrode CGB side. Whereas, in the main surface 1a, the end EP1B at the top surface of the cap insulation film CP2B on the control gate electrode CGA side is situated closer to the memory gate electrode MGB side than the side surface SG1B of the control gate electrode CGB on the control gate electrode CGA side.

However, in the present Fifth Embodiment, as distinct from First Embodiment, the side surface SC1A of the cap insulation film CP2A on the control gate electrode CGB side and the side surface SG1A of the control gate electrode CGA on the control gate electrode CGB side are inclined from a plane normal to the main surface 1a of the semiconductor substrate 1. Whereas, the side surface SC1B of the cap insulation film CP2B on the control gate electrode CGA side and the side surface SG1B of the control gate electrode CGB on the control gate electrode CGA side are inclined from a plane normal to the main surface 1a of the semiconductor substrate 1.

Specifically, the side surface SC1A of the cap insulation film CP2A is inclined so that the end at the top surface of the cap insulation film CP2A on the control gate electrode CGB side is situated closer to the memory gate electrode MGA side than the end at the bottom surface of the cap insulation film CP2A on the control gate electrode CGB side. Along the X axis direction, the end at the bottom surface of the cap insulation film CP2A on the control gate electrode CGB side is situated at nearly the same position as that of the end at the top surface of the control gate electrode CGA on the control gate electrode CGB side. The side surface SG1A of the control gate electrode CGA is inclined so that the end at the top surface of the control gate electrode CGA on the control gate electrode CGB side is situated closer to the memory gate electrode MGA side than the end at the bottom surface of the control gate electrode CGA on the control gate electrode CGB side.

Further, the side surface SC1B of the cap insulation film CP2B is inclined so that the end at the top surface of the cap insulation film CP2B on the control gate electrode CGA side is situated closer to the memory gate electrode MGB side than the end at the bottom surface of the cap insulation film CP2B on the control gate electrode CGA side. Along the X axis direction, the end at the bottom surface of the cap insulation film CP2B on the control gate electrode CGA side is situated at nearly the same position as that of the end at the top surface of the control gate electrode CGB on the control gate electrode CGA side. The side surface SG1B of the control gate electrode CGB is inclined so that the end at the top surface of the control gate electrode CGB on the control gate electrode CGA side is situated closer to the memory gate electrode MGB side than the end at the bottom surface of the control gate electrode CGB on the control gate electrode CGA side.

Incidentally, in the present Fifth Embodiment, the side surface SC2A of the cap insulation film CP2A on the memory gate electrode MGA side, and the side surface SG2A of the control gate electrode CGA on the memory gate electrode MGA side are also inclined from a plane normal to the main surface 1a of the semiconductor substrate 1. Whereas, the side surface SC2B of the cap insulation film CP2B on the memory gate electrode MGB side, and the side surface SG2B of the control gate electrode CGB on the memory gate electrode MGB side are also inclined from a plane normal to the main surface 1a of semiconductor substrate 1.

Therefore, a step is not formed between the side surface of the cap insulation film CP2A and the side surface of the control gate electrode CGA, and a step is not formed between the side surface of the cap insulation film CP2B and the side surface of the control gate electrode CGB.

Further, the operation of the memory cell MCA and the operation of the memory cell MCB of the semiconductor device in the present Fifth Embodiment are also the same as the operation of the memory cell MCA of the semiconductor device of First Embodiment, and hence will not be described.

<Method for Manufacturing a Semiconductor Device>

Then, a description will be given to a method for manufacturing a semiconductor device of the present Fifth Embodiment.

Figure 58:
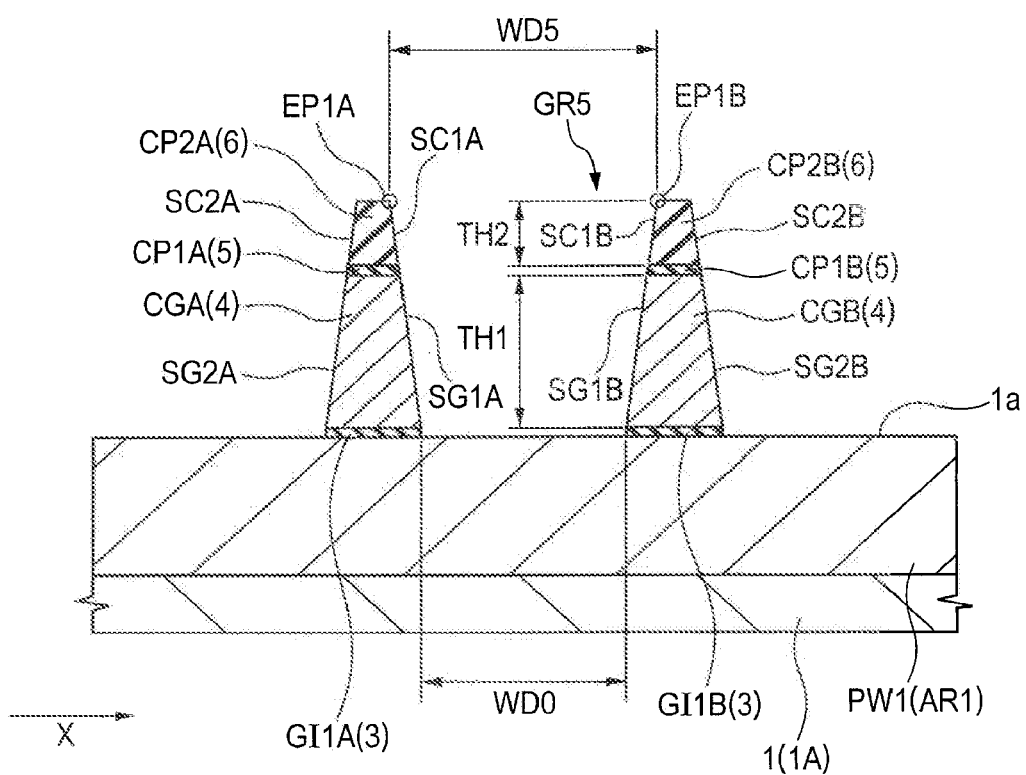
FIG. 58 is an essential part cross sectional view of the semiconductor device of Fifth Embodiment during a manufacturing step.
Figure 59:
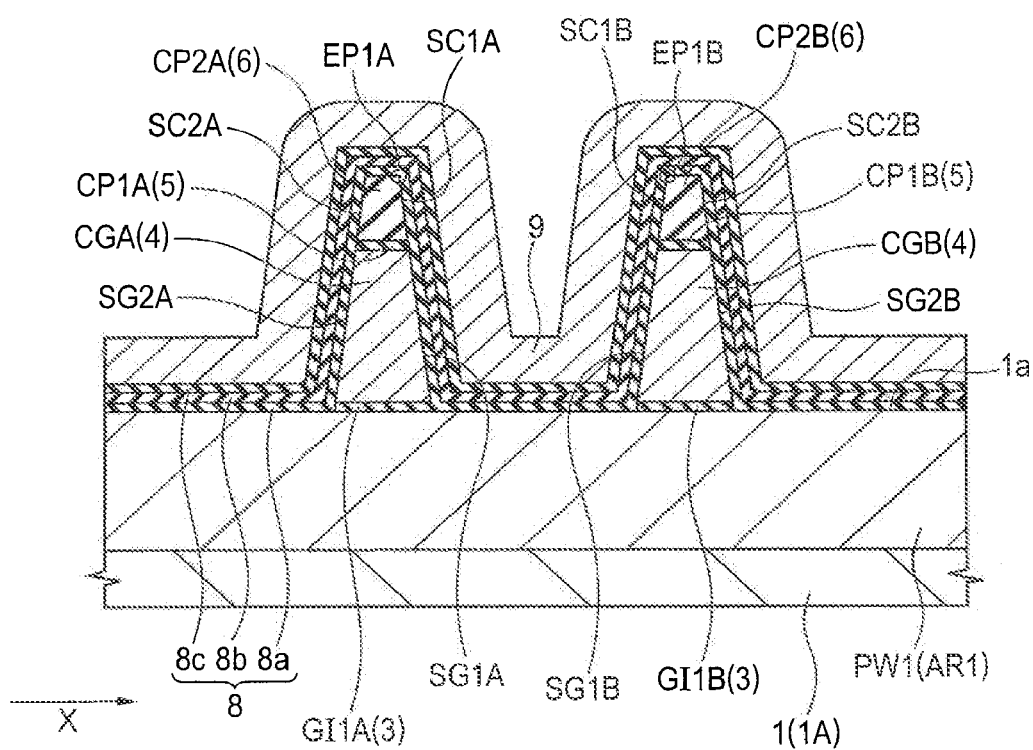
FIG. 59 is an essential part cross sectional view of the semiconductor device of Fifth Embodiment during a manufacturing step.

FIGS. 58 and 59 are each an essential part cross sectional view of the semiconductor device of Fifth Embodiment during a manufacturing step. FIGS. 58 and 59 each show the same cross section as the cross section shown in FIG. 57, and is a cross sectional view corresponding to the cross sectional view along line A-A of FIG. 2.

First, the steps up to the step described by reference to FIG. 30 in Second Embodiment are performed. As a result, in a region in which the cap insulation film CP2A and the cap insulation film CP2B are to be formed, a photoresist pattern PR2 is formed over the insulation film 6 using a photolithography method.

Then, using the photoresist pattern PR2 as an etching mask, the insulation film 6, the insulation film 5, the conductive film 4, and the insulation film 3 are etched by, for example, dry etching, and patterned. As a result, as shown in FIG. 58, there are formed the cap insulation films CP2A and CP2B, the cap insulation films CP1A and CP1B, the control gate electrodes CGA and CGB, and the gate insulation films GI1A and GI1B.

In the step of etching the insulation film 6, the insulation film 5, the conductive film 4, and the insulation film 3, in the same manner as the method described by reference to FIG. 32 in Second Embodiment, there is used an etching gas including, for example, a perfluorocyclobutane ($C_4F_8$) gas and an argon (Ar) gas. As a result, the cap insulation film CP2A and the control gate electrode CGA increase in width in the X axis direction with an increase in depth from the top surface of the cap insulation film CP2A, namely, from the top side toward the bottom side. Whereas, the cap insulation film CP2B and the control gate electrode CGB increase in width in the X axis direction with an increase in depth from the top surface of the cap insulation film CP2B, namely, from the top side toward the bottom side. Therefore, the side surface SC1A of the cap insulation film CP2A on the control gate electrode CGB side, and the side surface SG1A of the control gate electrode CGA on the control gate electrode CGB side are inclined from a plane normal to the main surface 1a of the semiconductor substrate 1. Whereas, the side surface SC1B of the cap insulation film CP2B on the control gate electrode CGA side, and the side surface SG1B of the control gate electrode CGB on the control gate electrode CGA side are inclined from a plane normal to the main surface 1a of the semiconductor substrate 1.

Alternatively, the following is also acceptable: the width of the photoresist pattern PR2 in the X axis direction is set nearly equal to each width at the bottom surfaces of the control gate electrodes CGA and CGB in the X axis direction, and etching is performed using isotropic etching such as wet etching. Even in the case using such a method, the side surface SC1A of the cap insulation film CP2A, the side surface SG1A of the control gate electrode CGA, the side surface SC1B of the cap insulation film CP2B, and the side surface SG1B of the control gate electrode CGB can be set inclined from a plane normal to the main surface 1a of the semiconductor substrate 1.

At this step, as with the case described by reference to FIG. 2 in First Embodiment, the control gate electrode CGA and the control gate electrode CGB are formed in such a manner as to extend along the Y axis direction through over the active region AR1, over the element isolation region IR1, and over the active region AR2. Whereas, the cap insulation film CP2A and the cap insulation film CP2B are formed in such a manner as to extend along the Y axis direction through over the active region AR1, over the element isolation region IR1, and over the active region AR2.

As shown in FIG. 58, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR5. At the bottom part of the trench part GR5, the main surface 1a of the semiconductor substrate 1 is exposed. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR5 becomes equal to the sum of the thickness TH1 and the thickness TH2. Further, the width in the X axis direction, namely, the gate length direction at the upper end of the trench part GR5 is referred to as a width WD5.

At this step, the width WD5 at the upper end of the trench part GR5 can be set larger than the width WD100 at the upper end of the trench part GR100 in Comparative Example 1.

Then, the same steps as the steps described by reference to FIG. 12 in First Embodiment are performed. As a result, entirely over the main surface 1a of the semiconductor substrate 1, there is formed an insulation film 8 for the gate insulation film of the memory transistor. Then, the same steps as the steps described by reference to FIG. 13 in First Embodiment are performed. As a result, as shown in FIG. 59, entirely over the main surface 1a of the semiconductor substrate 1, in other words, over the insulation film 8, there is formed a conductive film 9.

Then, the same steps as the steps described by reference to FIGS. 14 to 24 in First Embodiment are performed. As a result, there is manufactured the semiconductor device of the present Fifth Embodiment described previously by reference to FIG. 57.

Main Features and Effects of the Present Embodiment

The semiconductor device of the present Fifth Embodiment also has the same features as the features of the semiconductor device of First Embodiment. With such a structure, the semiconductor device of the present Fifth Embodiment also has the same effects as the effects of the semiconductor device of First Embodiment.

Further, in the present Fifth Embodiment, as distinct from First Embodiment, a step is not formed between the side surface of the cap insulation film CP2A and the side surface of the control gate electrode CGA, and a step is not formed between the side surface of the cap insulation film CP2B and the side surface of the control gate electrode CGB.

With such a configuration, when the steps described by reference to FIG. 59 are performed, thereby to form the insulation film 8, the coverage and the uniformity of the thickness of the insulation film 8 can be improved. Therefore, for example, it is possible to readily improve the insulation property between the control gate electrode CGA and the memory gate electrode MGA, and the insulation property between the control gate electrode CGB and the memory gate electrode MGB. This can more improve the performances of the semiconductor device.

Incidentally, also in the present Fifth Embodiment, the more advantageous effects than those of Comparative Example 1 are produced as with First Embodiment, even when any one of the memory cells MCA and MCB has the same structure as the structure of the memory cell in the semiconductor device of the present Fifth Embodiment, and the other has the same structure as the structure of the memory cell in the semiconductor device of Comparative Example 1.

Sixth Embodiment

In the semiconductor device of First Embodiment, the side surface SC1A of the cap insulation film CP2A is set back from one side surface SG1A of the control gate electrode CGA. In addition to this, in a semiconductor device of Sixth Embodiment, a sidewall spacer SW2 different from the sidewall spacer SW1 is formed over the control gate electrode CGA, and at the side surface SC1A of the cap insulation film CP2A.

<Structure of Semiconductor Device>

Figure 60:
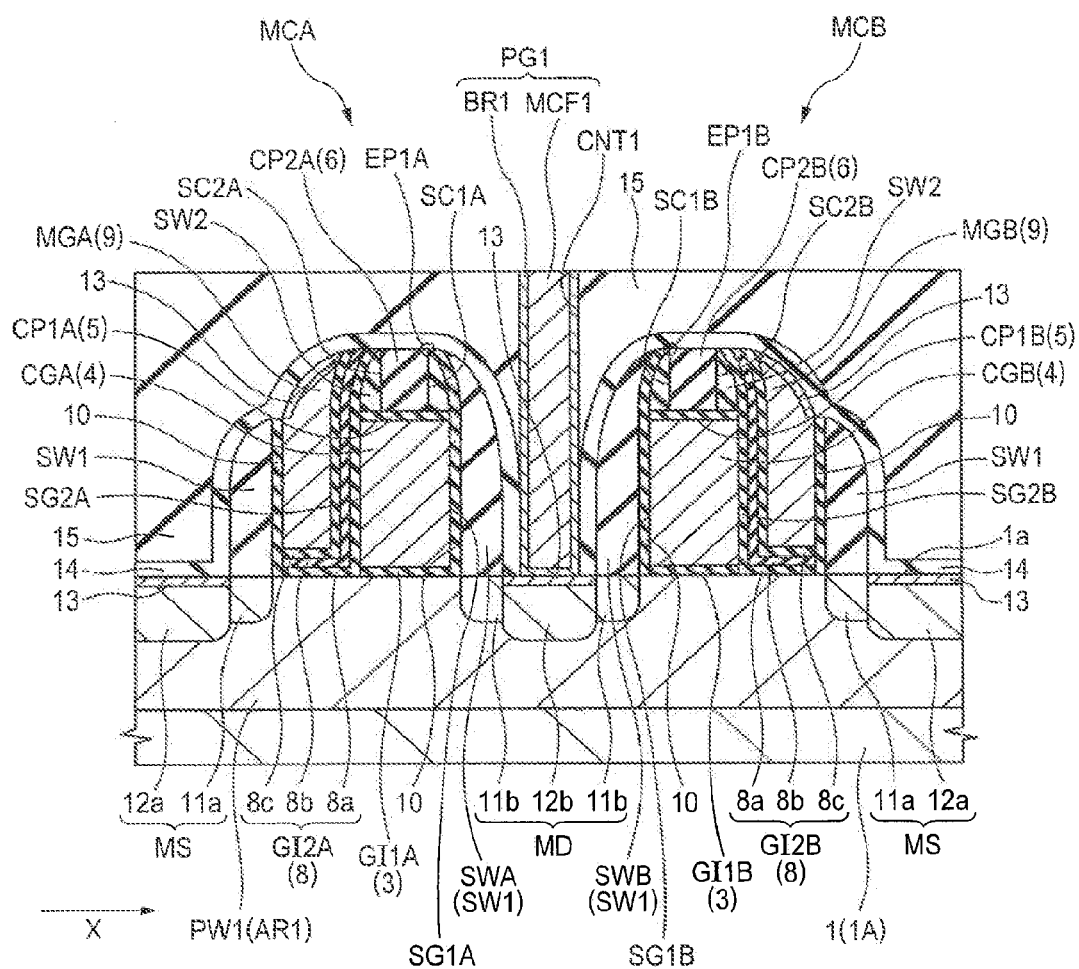
FIG. 60 is an essential part cross sectional view of a semiconductor device of Sixth Embodiment.

FIG. 60 is an essential part cross sectional view of the semiconductor device of Sixth Embodiment. FIG. 60 is, as with FIG. 1, a cross sectional view corresponding to the cross sectional view along line A-A of FIG. 2.

Respective portions of the semiconductor device of the present Sixth Embodiment other than the sidewall spacers SW2 are the same as respective portions of the semiconductor device of First Embodiment. Therefore, respective portions of the semiconductor device of the present Sixth Embodiment other than the sidewall spacers SW2 will not be described.

Also in the present Sixth Embodiment, as with First Embodiment, in the main surface 1a, the end EP1A at the top surface of the cap insulation film CP2A on the control gate electrode CGB side is situated closer to the memory gate electrode MGA side than the side surface SG1A of the control gate electrode CGA on the control gate electrode CGB side. Whereas, in the main surface 1a, the end EP1B at the top surface of the cap insulation film CP2B on the control gate electrode CGA side is situated closer to the memory gate electrode MGB side than the side surface SG1B of the control gate electrode CGB on the control gate electrode CGA side.

Also in the present Sixth Embodiment, as with First Embodiment, the width of the cap insulation film CP2A in the X axis direction, namely, the gate length direction is smaller than the width of the control gate electrode CGA in the X axis direction, namely, the gate length direction. Namely, the side surface SC1A of the cap insulation film CP2A on the control gate electrode CGB side is set back from the side surface SG1A of the control gate electrode CGA on the control gate electrode CGB side toward the memory gate electrode MGA side. Whereas, the side surface SC2A of the cap insulation film CP2A on the memory gate electrode MGA side is set back from the side surface SG2A of the control gate electrode CGA on the memory gate electrode MGA side toward the control gate electrode CGB side.

Whereas, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B on the control gate electrode CGA side is set back from the side surface SG1B of the control gate electrode CGB on the control gate electrode CGA side toward the memory gate electrode MGB side. Whereas, the side surface SC2B of the cap insulation film CP2B on the memory gate electrode MGB side is set back from the side surface SG2B of the control gate electrode CGB on the memory gate electrode MGB side toward the control gate electrode CGA side.

On the other hand, in the present Sixth Embodiment, the sidewall spacer SW2 is formed over the control gate electrode CGA, and at the side surface SC1A of the cap insulation film CP2A on the control gate electrode CGB side. Whereas, the sidewall spacer SW2 is formed over the control gate electrode CGB, and at the side surface SC1B of the cap insulation film CP2B on the control gate electrode CGA side.

Further, the sidewall spacer SW2 is also formed over the control gate electrode CGA, and at the side surface SC2A of the cap insulation film CP2A on the memory gate electrode MGA side. Still further, the sidewall spacer SW2 is also formed over the control gate electrode CGB, and at the side surface SC2B of the cap insulation film CP2B on the memory gate electrode MGB side.

The sidewall spacer SW2 is, as with the sidewall spacer SW1, formed of an insulation film such as a silicon oxide film, a silicon nitride film, or a lamination film thereof.

Further, as with First Embodiment, the sidewall spacer SW1 formed at the side surface SG1A of the control gate electrode CGA on the control gate electrode CGB side is referred to as a sidewall spacer SWA. Whereas, the sidewall spacer SW1 formed at the side surface SG1B of the control gate electrode CGB on the control gate electrode CGA side is referred to as a sidewall spacer SWB.

At this step, the sidewall spacer SWA is formed at the side surface SC1A of the cap insulation film CP2A on the control gate electrode CGB side via the sidewall spacer SW2. Whereas, the sidewall spacer SWB is formed at the side surface SC1B of the cap insulation film CP2B on the control gate electrode CGA side via the sidewall spacer SW2.

Further, the operation of the memory cell MCA and the operation of the memory cell MCB in the semiconductor device of the present Sixth Embodiment are the same as the operation of the memory cell MCA in the semiconductor device of First Embodiment, and hence will not be described.

<Method for Manufacturing a Semiconductor Device>

Then, a description will be given to a method for manufacturing the semiconductor device of the present Sixth Embodiment.

FIGS. 61 to 65 are each an essential part cross sectional view of the semiconductor device of Sixth Embodiment during a manufacturing step. FIGS. 61 to 65 each show the same cross section as the cross section shown in FIG. 60, and is a cross sectional view corresponding a cross sectional view along line A-A of FIG. 2.

Figure 61:
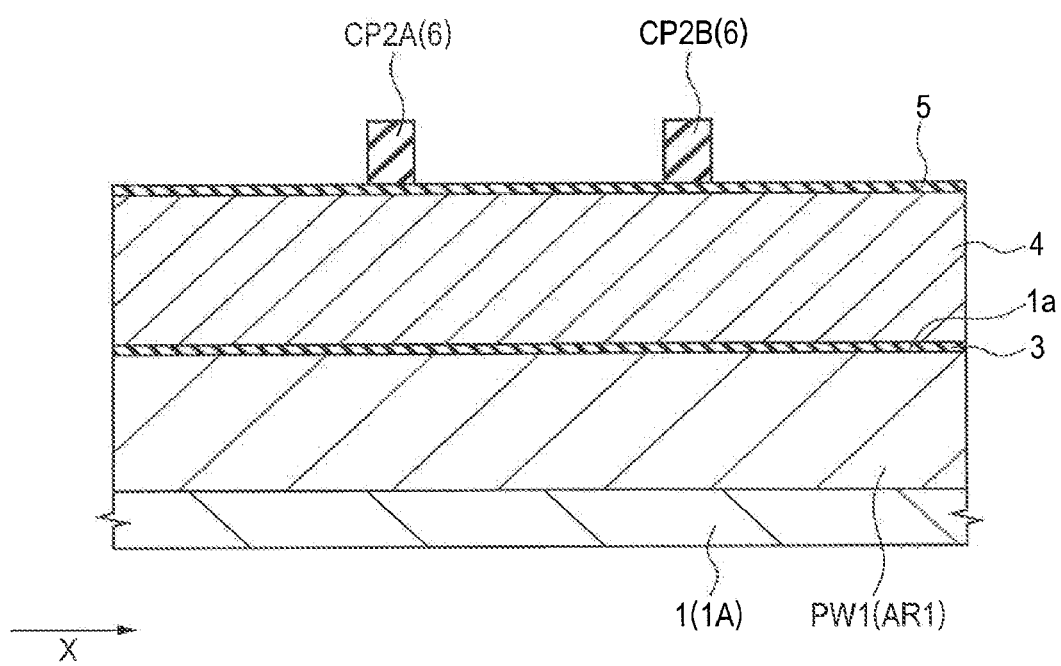
FIG. 61 is an essential part cross sectional view of the semiconductor device of Sixth Embodiment during a manufacturing step.

First, the same steps as the steps described by reference to FIG. 31 in Second Embodiment are performed. As a result, as shown in FIG. 61, there are formed the cap insulation film CP2A formed of the insulation film 6, and the cap insulation film CP2B formed of the insulation film 6.

Figure 62:
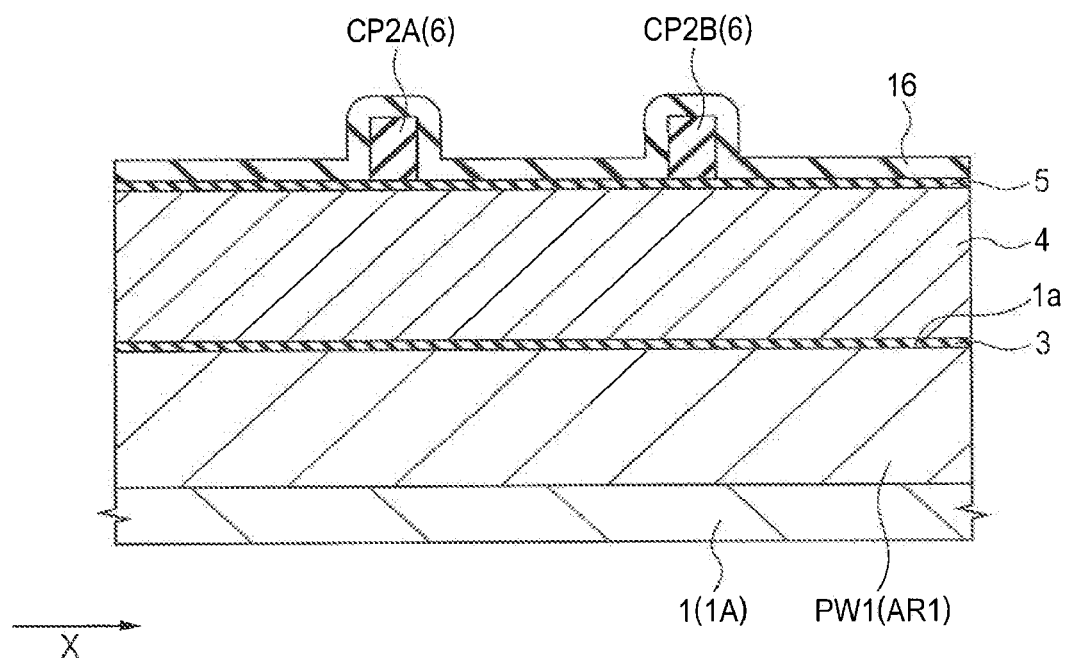
FIG. 62 is an essential part cross sectional view of the semiconductor device of Sixth Embodiment during a manufacturing step.

Then, as shown in FIG. 62, entirely over the main surface 1a of the semiconductor substrate 1, there are formed or deposited an insulation film 16 for the sidewall spacer SW2. Specifically, the insulation film 16 is formed using, for example, a CVD method at the top surface and the side surfaces of the cap insulation film CP2A, the top surface and the side surfaces of the cap insulation film CP2B, and the top surface of the insulation film 5 at a portion thereof from which the insulation film 6 has been removed. As the insulation film 16, there can be formed an insulation film such as a silicon oxide film or a silicon nitride film, or a lamination film thereof.

Figure 63:
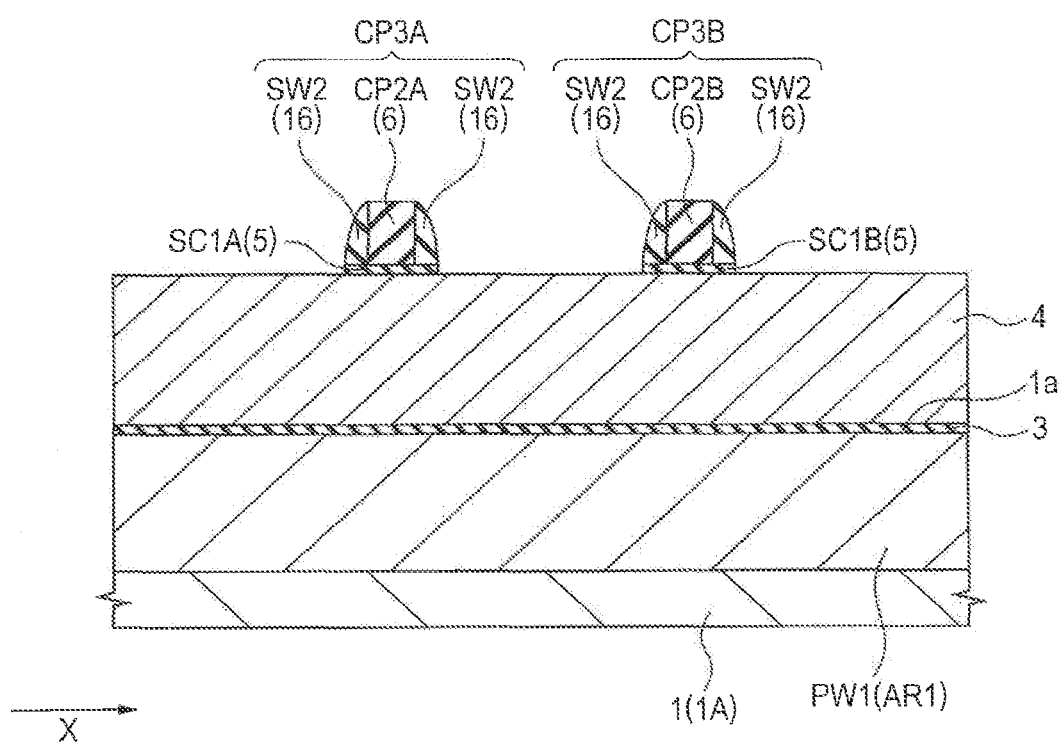
FIG. 63 is an essential part cross sectional view of the semiconductor device of Sixth Embodiment during a manufacturing step.

Then, the insulation film 16 is etched back by, for example, anisotropic etching. In this manner, the insulation film 16 is selectively left at both side surfaces of the cap insulation film CP2A and both side surfaces of the cap insulation film CP2B. As a result, as shown in FIG. 63, there are formed sidewall spacers SW2 formed of the insulation film 16. Incidentally, as shown in FIG. 63, when the insulation film 16 is etched back, portions of the insulation film 5 not covered with the sidewall spacers SW2 can be etched and removed.

At this step, there is formed a cap insulation film CP3A formed of the cap insulation film CP2A and the sidewall spacers SW2 formed at both side surfaces of the cap insulation film CP2A. Whereas, there is formed a cap insulation film CP3B formed of the cap insulation film CP2B, and the sidewall spacers SW2 formed at both side surfaces of the cap insulation film CP2B.

Then, with the cap insulation film CP3A (see FIG. 63) and the cap insulation film CP3B (see FIG. 63) as an etching mask, the conductive film 4 and the insulation film 3 are etched and patterned by, for example, dry etching. As a result, as shown in FIG. 64, there are formed control gate electrodes CGA and CGB, and gate insulation films GI1A and GI1B.

Figure 64:
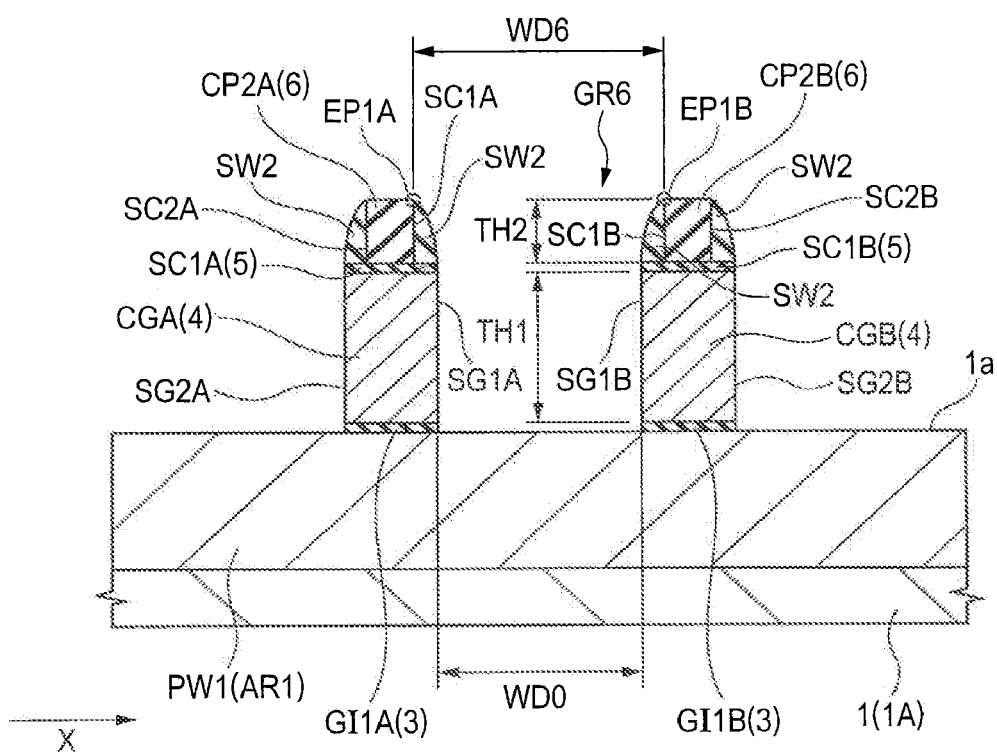
FIG. 64 is an essential part cross sectional view of the semiconductor device of Sixth Embodiment during a manufacturing step.

As shown in FIG. 64, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR6. At the bottom part of the trench part GR6, the main surface 1a of the semiconductor substrate 1 is exposed. Whereas, the distance between the side surface SG1A of the control gate electrode CGA and the side surface SG1B of the control gate electrode CGB is referred to as a distance WD0; the thickness of the control gate electrode CGA or CGB is referred to as a thickness TH1; and the thickness of the cap insulation film CP2A or CP2B is referred to as a thickness TH2. When the thickness of the cap insulation film CP1A or CP1B relative to the thickness TH1 or TH2 is negligible, the depth of the trench part GR6 becomes equal to the sum of the thickness TH1 and the thickness TH2. Further, the width in the X axis direction, namely, the gate length direction at the upper end of the trench part GR6 is referred to as a width WD6.

At this step, the width WD6 at the upper end of the trench part GR6 can be set larger than the width WD100 at the upper end of the trench part GR100 in Comparative Example 1.

Further, as with the case described by reference to FIG. 2 in First Embodiment, the control gate electrode CGA and the control gate electrode CGB are formed in such a manner as to extend along the Y axis direction through over the active region AR1, over the element isolation region IR1, and over the active region AR2. Whereas, the cap insulation film CP2A and the cap insulation film CP2B are formed in such a manner as to extend along the Y axis direction through over the active region AR1, over the element isolation region IR1, and over the active region AR2.

Figure 65:
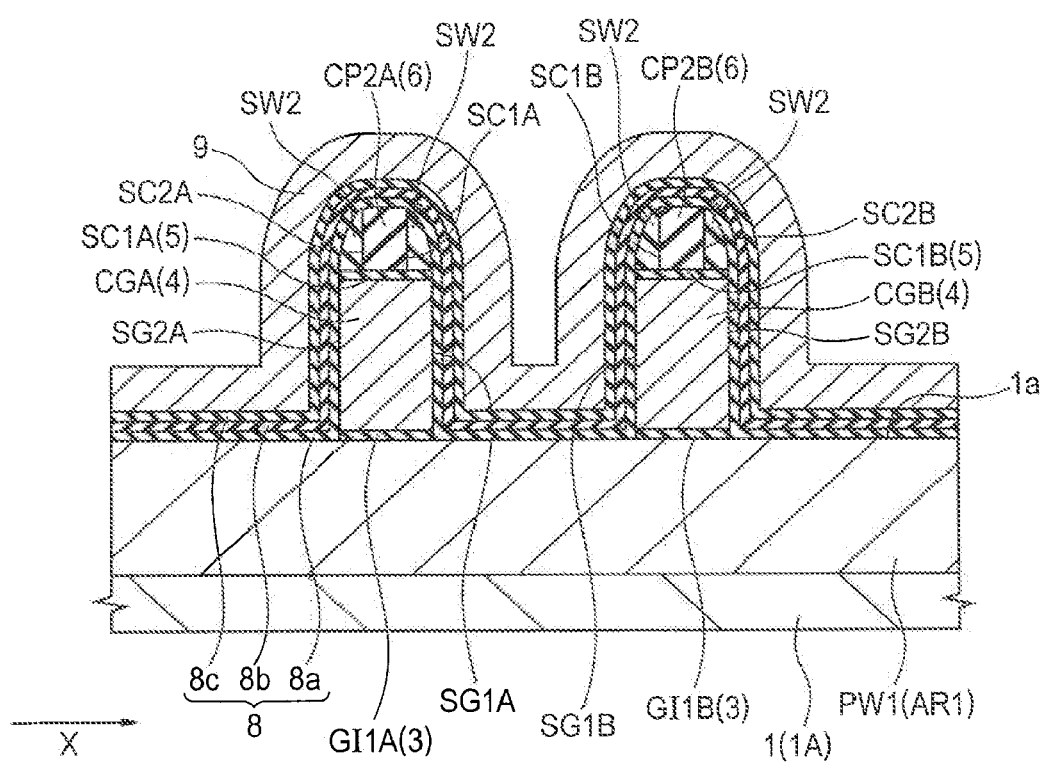
FIG. 65 is an essential part cross sectional view of the semiconductor device of Sixth Embodiment during a manufacturing step.

Then, the same steps as the steps described by reference to FIG. 12 in First Embodiment are performed. As a result, entirely over the main surface 1a of the semiconductor substrate 1, there is formed an insulation film 8 for the gate insulation film of the memory transistor. Then, the same steps as the steps described by reference to FIG. 13 in First Embodiment are performed. As a result, as shown in FIG. 65, entirely over the main surface 1a of the semiconductor substrate 1, in other words, over the insulation film 8, there is formed a conductive film 9.

Then, the same steps as the steps described by reference to FIGS. 14 to 24 in First Embodiment are performed. As a result, there is manufactured the semiconductor device of the present Sixth Embodiment described previously by reference to FIG. 60.

Main Features and Effects of the Present Embodiment

The semiconductor device of the present Sixth Embodiment also has the same features as the features of the semiconductor device of First Embodiment. With such a structure, the semiconductor device of the present Sixth Embodiment also has the same effects as the effects of the semiconductor device of First Embodiment.

However, in the present Sixth Embodiment, as distinct from First Embodiment, the sidewall spacer SW2 is formed over the control gate electrode CGA, and at the side surface SC1A of the cap insulation film CP2A on the control gate electrode CGB side. Whereas, the sidewall spacer SW2 is formed over the control gate electrode CGB, and at the side surface SC1B of the cap insulation film CP2B on the control gate electrode CGA side. The cap insulation film CP2A and the sidewall spacers SW2 formed at both side surfaces of the cap insulation film CP2A form a cap insulation film CP3A (see FIG. 63). The cap insulation film CP2B and the sidewall spacers SW2 formed at both side surfaces of the cap insulation film CP2B form a cap insulation film CP3B (see FIG. 63).

For example, when the width of the control gate electrode CGA in the X axis direction in the present Sixth Embodiment is equal to the width of the control gate electrode CGA in the X axis direction in First Embodiment, the side surface of the cap insulation film CP3A in the present Sixth Embodiment is not set back from the side surface of the cap insulation film CP2A in First Embodiment. Whereas, for example, when the width of the control gate electrode CGB in the X axis direction in the present Sixth Embodiment is equal to the width of the control gate electrode CGB in the X axis direction in First Embodiment, the side surface of the cap insulation film CP3B in the present Sixth Embodiment is not set back from the side surface of the cap insulation film CP2B in First Embodiment.

Therefore, the effect of preventing the formation of the cavity in the interlayer insulation film 15 of the semiconductor device in the present Sixth Embodiment is smaller than the effect of preventing the formation of the cavity in the interlayer insulation film 15 in the semiconductor device of First Embodiment.

However, in the present Sixth Embodiment, a step is not formed between the side surface of the cap insulation film CP3A and the side surface of the control gate electrode CGA. Similarly, a step is not formed between the side surface of the cap insulation film CP3B and the side surface of the control gate electrode CGB.

Therefore, when the steps described by reference to FIG. 65 are performed, thereby to form the insulation film 8, the coverage and the uniformity of the thickness of the insulation film 8 can be improved. Therefore, for example, it is possible to readily improve the insulation property between the control gate electrode CGA and the memory gate electrode MGA, and the insulation property between the control gate electrode CGB and the memory gate electrode MGB. This can more improve the performances of the semiconductor device.

Incidentally, also in the present Sixth Embodiment, as with First Embodiment, any one of the memory cells MCA and MCB has the same structure as the structure of the memory cell in the semiconductor device of the present Sixth Embodiment, and the other has the same structure as the structure of the memory cell of the semiconductor device of Comparative Example 1. Even this case produces more advantageous effects than those of Comparative Example 1.

Seventh Embodiment

The semiconductor device of First Embodiment had a memory cell including a split gate type cell using a MONOS film as a nonvolatile memory. In contrast, a semiconductor device of Seventh Embodiment has a memory cell including a NAND type flash memory as a nonvolatile memory.

<Structure of Semiconductor Device>

Figure 66:
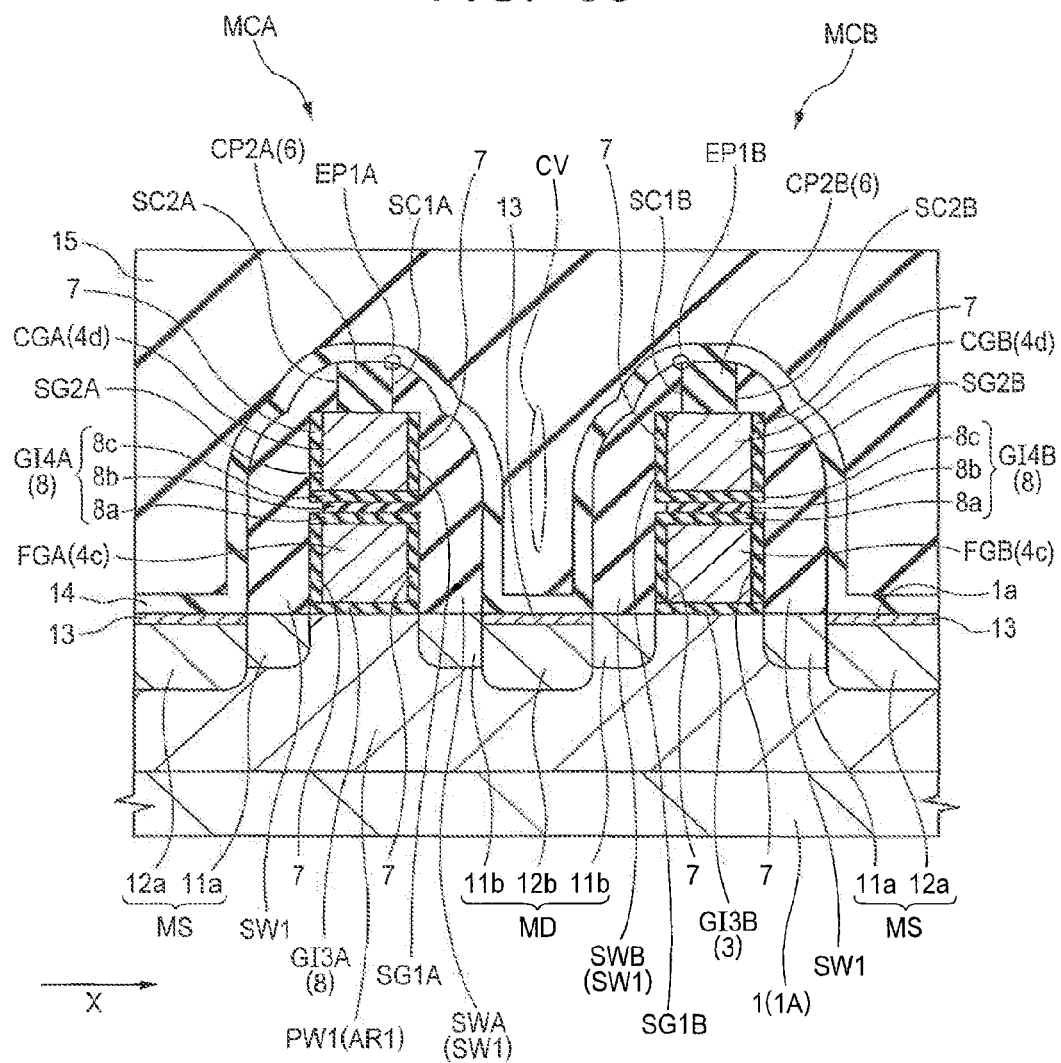
FIG. 66 is an essential part cross sectional view of a semiconductor device of Seventh Embodiment.
Figure 67:
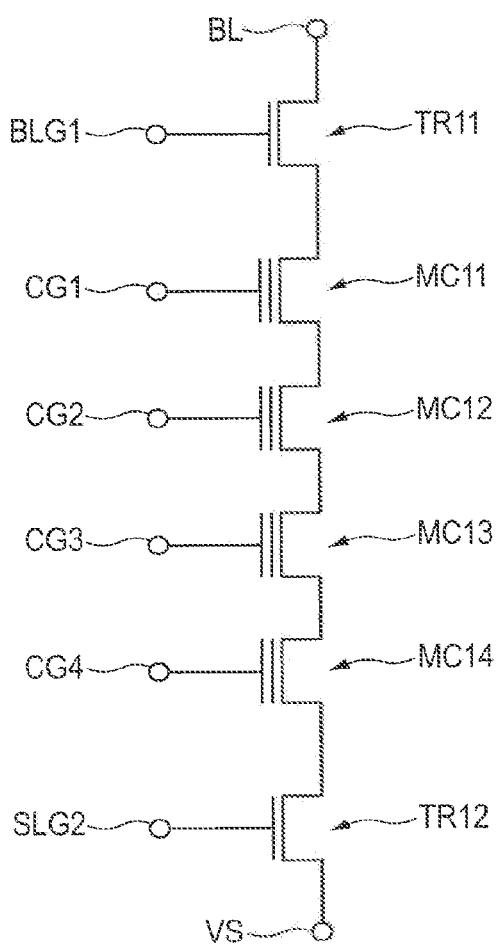
FIG. 67 is an equivalent circuit diagram of a NAND type flash memory in the semiconductor device of Seventh Embodiment.

FIG. 66 is an essential part cross sectional view of the semiconductor device of Seventh Embodiment. FIG. 67 is an equivalent circuit diagram of a NAND type flash memory in the semiconductor device of Seventh Embodiment.

As shown in FIG. 66, the semiconductor device has a semiconductor substrate 1. Further, as shown in FIG. 66, the semiconductor device has a memory cell region 1A on the main surface 1a side of the semiconductor substrate 1.

Incidentally, the semiconductor substrate 1, the active region AR1, and the p type well PW1 are the same as the semiconductor substrate 1, the active region AR1, and the p type well PW1 of the semiconductor device in First Embodiment, respectively, and hence will not be described.

As shown in FIG. 66, the memory cell MCA and the memory cell MCB are arranged nearly symmetrical across the semiconductor region MD functioning as a drain region. The memory cell MCA and the memory cell MCB are arranged side by side along the X axis direction of FIG. 66.

In the active region AR1, two memory cells MCA and MCB as nonvolatile memories are formed in the p type well PW1. The memory cells MCA and MCB are memory cells forming the NAND type flash memory.

The memory cell MCA has n type semiconductor regions MS and MD, a floating gate electrode FGA, and a control gate electrode CGA. Further, the memory cell MCA has a cap insulation film CP2A which is an insulation film formed over the control gate electrode CGA. Then, the memory cell MCA has a gate insulation film GI3A formed between the floating gate electrode FGA and the semiconductor substrate 1, and an insulation film GI4A formed between the floating gate electrode FGA and the control gate electrode CGA. Namely, the gate insulation film GI3A, the floating gate electrode FGA, the insulation film GI4A, the control gate electrode CGA, and the cap insulation film CP2A form the memory cell MCA.

The memory cell MCB has n type semiconductor regions MS and MD, a floating gate electrode FGB, and a control gate electrode CGB. Further, the memory cell MCB has a cap insulation film CP2B which is an insulation film formed over the control gate electrode CGB. Then, the memory cell MCB has a gate insulation film GI3B formed between the floating gate electrode FGB and the semiconductor substrate 1, and an insulation film GI4B formed between the floating gate electrode FGB and the control gate electrode CGB. Namely, the gate insulation film GI3B, the floating gate electrode FGB, the insulation film GI4B, the control gate electrode CGB, and the cap insulation film CP2B form the memory cell MCB.

The floating gate electrode FGA, the insulation film GI4A, the control gate electrode CGA, and the cap insulation film CP2A are formed in such a manner as to extend in a direction normal to the paper plane in FIG. 66. Whereas, the floating gate electrode FGB, the insulation film GI4B, the control gate electrode CGB, and the cap insulation film CP2B are formed in such a manner as to extend in a direction normal to the paper plane in FIG. 66. Incidentally, the control gate electrode CGA and the control gate electrode CGB are spaced along the X axis direction of FIG. 66.

The floating gate electrode FGA is formed over the p type well PW1 between the semiconductor region MD and the semiconductor region MS, namely, over the semiconductor substrate 1 via the gate insulation film GI3A. The control gate electrode CGA is formed over the floating gate electrode FGA via the insulation film GI4A.

The floating gate electrode FGB is formed over the p type well PW1 between the semiconductor region MD and the semiconductor region MS, namely, over the semiconductor substrate 1 via the gate insulation film GI3B. The control gate electrode CGB is formed over the floating gate electrode FGB via the insulation film GI4B.

The gate insulation film GI3A and the gate insulation film GI3B are each formed of an insulation film 3. The insulation film 3 can be set as the same insulation film as the insulation film 3 in First Embodiment.

The insulation film GI4A and the insulation film GI4B are each formed of an insulation film 8. Further, the insulation film 8 can be set as the same insulation film as the insulation film 8 in First Embodiment.

The floating gate electrode FGA and the floating gate electrode FGB are each formed of a conductive film 4c such as an n type polysilicon film which is a polycrystal silicon film doped with, for example, n type impurities. The control gate electrode CGA and the control gate electrode CGB are each formed of a conductive film 4d such as an n type polysilicon film which is a polycrystal silicon film doped with, for example, n type impurities. The conductive film 4c and the conductive film 4d can be each set as the same conductive film as the conductive film 4 of First Embodiment.

The cap insulation film CP2A and the cap insulation film CP2B are each an insulation film such as a silicon nitride film as in First Embodiment. The cap insulation film CP2A and the cap insulation film CP2B can be each set as an insulation film having a thickness of, for example, about 50 to 100 nm.

The semiconductor region MS, the semiconductor region MD, and the sidewall spacers SW1 can be set equal to the semiconductor region MS, the semiconductor region MD, and the sidewall spacers SW1 in First Embodiment, respectively. Whereas, the insulation film 14, the interlayer insulation film 15, the contact holes CNT1 and CNT2 (not shown), the plugs PG1 and PG2 (not shown) can be set equal to the insulation film 14, the interlayer insulation film 15, the contact holes CNT1 and CNT2 (see FIG. 2), the plugs PG1 and PG2 (see FIG. 2) in First Embodiment, respectively.

In the present Seventh Embodiment, in the main surface 1a, the end EP1A at the top surface of the cap insulation film CP2A on the control gate electrode CGB side is situated closer to the opposite side to the control gate electrode CGB side than the side surface SG1A of the control gate electrode CGA on the control gate electrode CGB side. Whereas, in the main surface 1a, the end EP1B at the top surface of the cap insulation film CP2B on the control gate electrode CGA side is situated closer to the opposite side to the control gate electrode CGA side than the side surface SG1B of the control gate electrode CGB on the control gate electrode CGA side.

Then, a description will be given to the operation of the semiconductor device of the present Seventh Embodiment.

As shown in FIG. 67, in a NAND type flash memory of the semiconductor device of the present Seventh Embodiment, a bit line side selection transistor TR11, a plurality of memory cells MC11 to MC14 coupled in series to one another, and a source line side selection transistor TR12 are coupled in series between a bit line BL and a source line VS. The bit line side selection transistor TR11 has a bit line side selection gate BLG1. The bit line side selection gate BLG1 is coupled to a transistor (not shown) of a peripheral circuit for applying a voltage for controlling the bit line side selection transistor TR11 to the bit line side selection gate BLG1. The memory cells MC11 to MC14 have control gates CG1 to CG4, respectively. The control gates CG1 to CG4 are coupled to transistors (not shown) of a peripheral circuit for applying a voltage for controlling each of the memory cells MC11 to MC14. The source line side selection transistor TR12 has a source line side selection gate SLG2. The source line side selection gate SLG2 is coupled to a transistor (not shown) of a peripheral circuit for applying a voltage for controlling the source line side selection transistor TR12 to the source line side selection gate SLG2.

Incidentally, for example, the memory cell MC11 and the memory cell MC12 of the memory cells described by reference to FIG. 67 correspond to the memory cell MCA and the memory cell MCB described by reference to FIG. 66, respectively. Further, in the present Seventh Embodiment, a description will be given to an example in which the present invention is applied to a NAND type flash memory. However, the present invention is also applicable to other flash memories than NAND type ones such as NOR type ones.

<Method for Manufacturing a Semiconductor Device>

Then, a description will be given to a method for manufacturing a semiconductor device of the present Seventh Embodiment.

FIGS. 68 to 72 are each an essential part cross sectional view of the semiconductor device of Seventh Embodiment. FIGS. 68 to 72 each show the same cross section as the cross section shown in FIG. 66.

Figure 68:
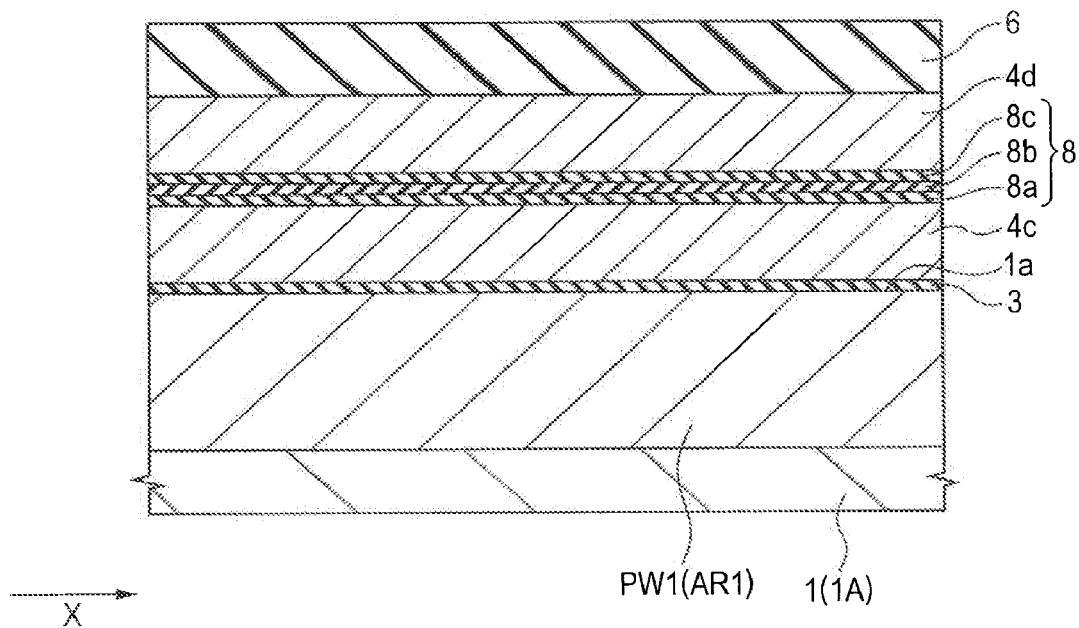
FIG. 68 is an essential part cross sectional view of the semiconductor device of Seventh Embodiment during a manufacturing step.

First, the steps described by reference to FIG. 6 in First Embodiment are performed. As a result, a semiconductor substrate 1 is provided. Then, as shown in FIG. 68, entirely over the main surface 1a of the semiconductor substrate 1, an insulation film 3, a conductive film 4c, an insulation film 8, a conductive film 4d, and an insulation film 6 are sequentially formed from the bottom.

The step of forming the insulation film 3 can be set equal to the step of forming the insulation film 3 in First Embodiment. The step of forming the conductive film 4c can be set equal to the step of forming the conductive film 4 in First Embodiment. The step of forming the insulation film 8 can be set equal to the step of forming the insulation film 8 in First Embodiment. The step of forming the conductive film 4d can be set equal to the step of forming the conductive film 4 in First Embodiment. The step of forming the insulation film 6 can be set equal to the step of forming the insulation film 6 in First Embodiment.

Then, the insulation film 6, the conductive film 4d, the insulation film 8, the conductive film 4c, and the insulation film 3 are patterned by etching such as dry etching.

First, a photoresist pattern (not shown) is formed over the insulation film 6 using a photolithography method. Then, using the photoresist pattern as an etching mask, the insulation film 6, the conductive film 4d, the insulation film 8, the conductive film 4c and the insulation film 3 are etched and patterned by, for example, dry etching. Then, the photoresist pattern is removed.

Figure 69:
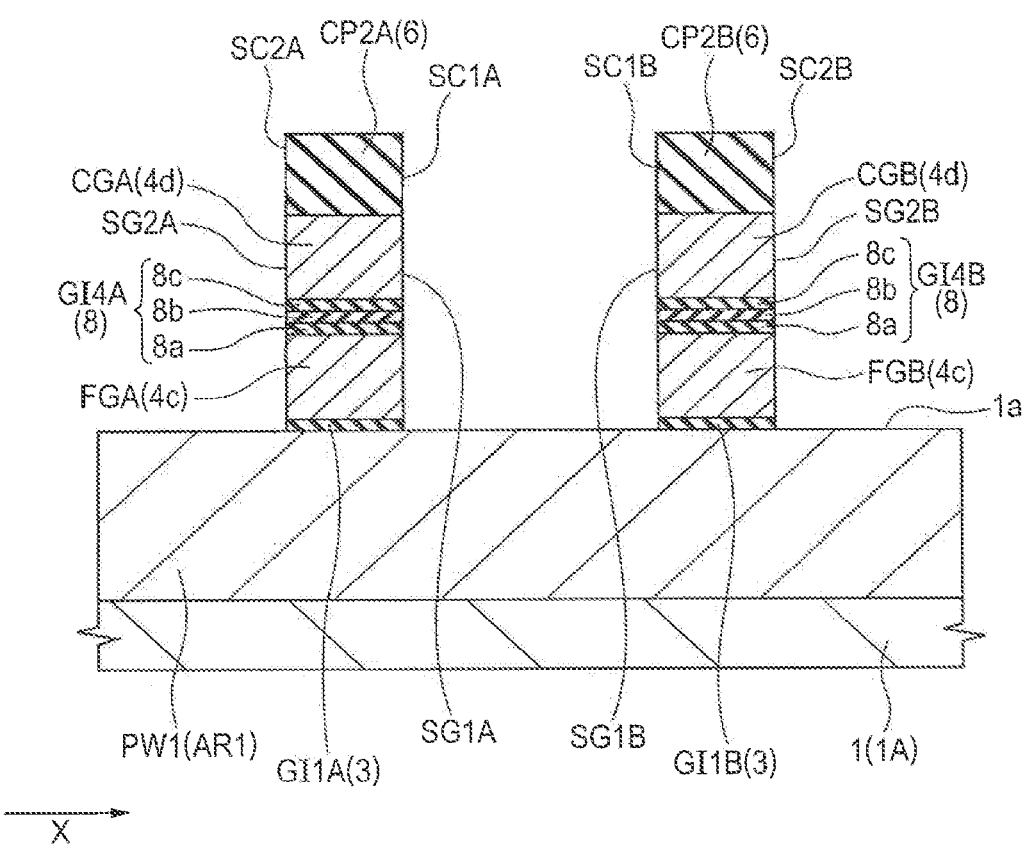
FIG. 69 is an essential part cross sectional view of the semiconductor device of Seventh Embodiment during a manufacturing step.

In this manner, the insulation film 6, the conductive film 4d, the insulation film 8, the conductive film 4c, and the insulation film 3 are patterned. As a result, as shown in FIG. 69, over the main surface 1a of the semiconductor substrate 1, there are formed a floating gate electrode FGA formed of the conductive film 4c and a floating gate electrode FGB formed of the conductive film 4c spaced in the X axis direction, namely, the gate length direction. Further, there is formed a control gate electrode CGA formed of the conductive film 4d over the floating gate electrode FGA, and there is formed a control gate electrode CGB formed of the conductive film 4d over the floating gate electrode FGB. Then, there is formed a gate insulation film GI3A formed of the insulation film 3 between the floating gate electrode FGA and the semiconductor substrate 1, and there is formed a gate insulation film GI3B formed of the insulation film 3 between the floating gate electrode FGB and the semiconductor substrate 1. Further, there is formed an insulation film GI4A formed of the insulation film 8 between the floating gate electrode FGA and the control gate electrode CGA, and there is formed an insulation film GI4B formed of the insulation film 8 between the floating gate electrode FGB and the control gate electrode CGB. Further, there is formed the cap insulation film CP2A formed of the insulation film 6 over the control gate electrode CGA, and there is formed the cap insulation film CP2B formed of the insulation film 6 over the control gate electrode CGB.

Figure 70:
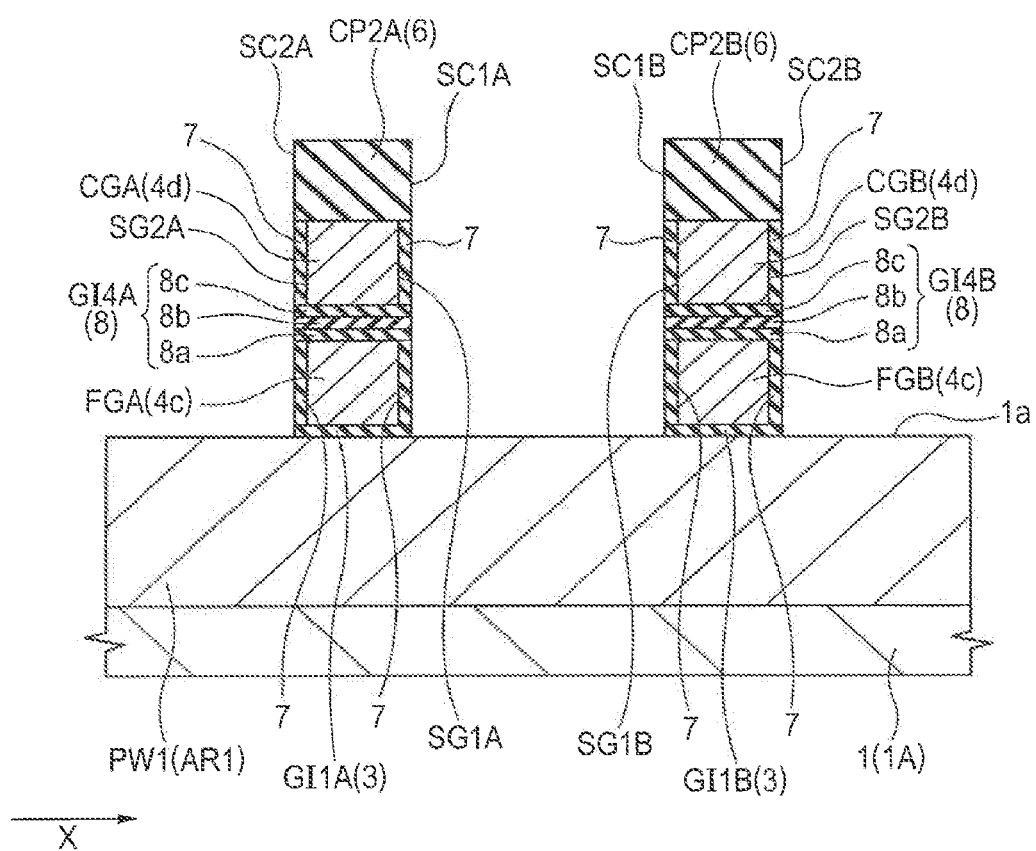
FIG. 70 is an essential part cross sectional view of the semiconductor device of Seventh Embodiment during a manufacturing step.

Then, the same steps as the steps described by reference to FIG. 10 in First Embodiment are performed. As a result, as shown in FIG. 70, insulation films 7 are formed at the side surface of the floating gate electrode FGA, the side surface of the floating gate electrode FGB, the side surfaces SG1A and SG2A of the control gate electrode CGA, and the side surfaces SG1B and SG2B of the control gate electrode CGB.

Figure 71:
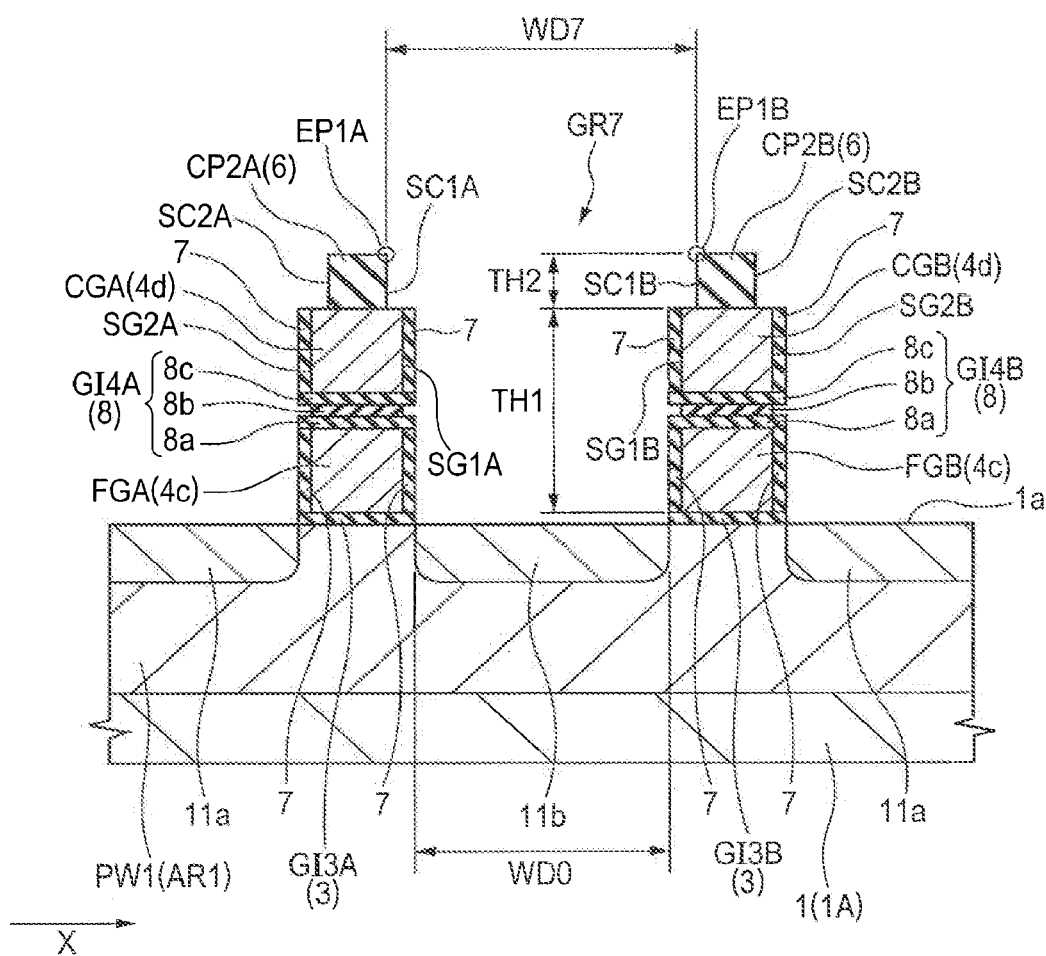
FIG. 71 is an essential part cross sectional view of the semiconductor device of Seventh Embodiment during a manufacturing step.

Then, the same steps as the steps described by reference to FIG. 11 in First Embodiment are performed. As a result, as shown in FIG. 71, the cap insulation film CP2A and the cap insulation film CP2B are slimmed by an etchant.

By performing such slimming, a portion of the cap insulation film CP2A exposed at the side surface SC1A on the control gate electrode CGB side, and a portion of the cap insulation film CP2A exposed at the side surface SC2A opposite to the control gate electrode CGB side are etched and removed. Whereas, a portion of the cap insulation film CP2B exposed at the side surface SC1B on the control gate electrode CGA side, and a portion of the cap insulation film CP2B exposed the side surface SC2B opposite to the control gate electrode CGA side are etched and removed.

As a result, the end EP1A at the top surface of the cap insulation film CP2A on the control gate electrode CGB side is set back from the side surface SG1A of the control gate electrode CGA on the control gate electrode CGB side toward the opposite side to the control gate electrode CGB side. Whereas, the end EP1B at the top surface of the cap insulation film CP2B on the control gate electrode CGA side is set back from the side surface SG1B of the control gate electrode CGB on the control gate electrode CGA side toward the opposite side to the control gate electrode CGA side.

At this step, the width of the cap insulation film CP2A in the X axis direction, namely, the gate length direction is smaller than the width of the width of the control gate electrode CGA in the X axis direction, namely, the gate length direction. Namely, the side surface SC1A of the cap insulation film CP2A is set back from the side surface SG1A of the control gate electrode CGA toward the opposite side to the control gate electrode CGB side. Whereas, the side surface SC2A of the cap insulation film CP2A is set back from the side surface SG2A of the control gate electrode CGA toward the control gate electrode CGB side.

Whereas, the width of the cap insulation film CP2B in the X axis direction, namely, the gate length direction is smaller than the width of the control gate electrode CGB in the X axis direction, namely, the gate length direction. Namely, the side surface SC1B of the cap insulation film CP2B is set back from the side surface SG1B of the control gate electrode CGB toward the opposite side to the control gate electrode CGA side. Whereas, the side surface SC2B of the cap insulation film CP2B is set back from the side surface SG2B of the control gate electrode CGB toward the control gate electrode CGA side.

Further, as shown in FIG. 71, in the present Seventh Embodiment, the trench part formed with the side surface SC1A of the cap insulation film CP2A, and the side surface SG1A of the control gate electrode CGA as one side surface, and with the side surface SC1B of the cap insulation film CP2B, and the side surface SG1B of the control gate electrode CGB as the other side surface is referred to as a trench part GR7. The bottom part of the trench part GR7 is set as the main surface 1a of the semiconductor substrate 1. Whereas, the distance between the side surface SG1A of the control gate electrode CGA and the side surface SG1B of the control gate electrode CGB is referred to as a distance WD0; the sum of the thickness of the floating gate electrode FGA or FGB, the thickness of the insulation film GI4A or GI4B, and the thickness of the control gate electrode CGA or CGB is referred to as a thickness TH1; and the thickness of the cap insulation film CP2A or CP2B is referred to as a thickness TH2. The depth of the trench part GR7 becomes equal to the sum of the thickness TH1 and the thickness TH2. Further, the width in the X axis direction, namely, the gate length direction at the upper end of the trench part GR7 is referred to as a width WD7.

At this step, the distance WD0 can be set at, for example, about 150 to 200 nm. Whereas, the thickness TH1 can be set at, for example, about 140 to 160 nm. This is the case where the thickness of the floating gate electrode FGA or FGB is set at, for example, about 70 to 80 nm, the thickness of the insulation film GI4A or GI4B is set at, for example, about 15 nm, and the thickness of the control gate electrode CGA or CGB is set at, for example, about 55 to 65 nm. Further, the thickness TH2 can be set at, for example, about 35 to 45 nm. At this step, the depth of the trench part GR7 can be set at, for example, about 175 to 205 nm. Incidentally, the thickness of the cap insulation film CP2A or CP2B before slimming can be set at about 45 to 55 nm. Slimming can result in a distance by which the side surface SC1A or SC1B of the cap insulation film CP2A or CP2B is set back, namely, a set-back amount of about 5 to 10 nm.

With such a structure, the width WD7 is larger than the distance WD0 between the side surface SG1A of the control gate electrode CGA and the side surface SG1B of the control gate electrode CGB. Accordingly, as compared with the case where along the X axis direction, namely, the gate length direction, the end EP1A is situated at the same position as that of the side surface SG1A, and the end EP1B is situated at the same position as that of the side surface SG1B, the width WD7 can be increased. As a result, when the interlayer insulation film 15 is formed, the raw materials for the interlayer insulation film 15 become more likely to reach the inside of the trench part GR7. This can prevent the formation of a cavity in the interlayer insulation film 15 in the inside of the trench part GR7.

Then, as described by reference to FIG. 18 in First Embodiment, n⁻ type semiconductor regions 11a and 11b are formed.

Figure 72:
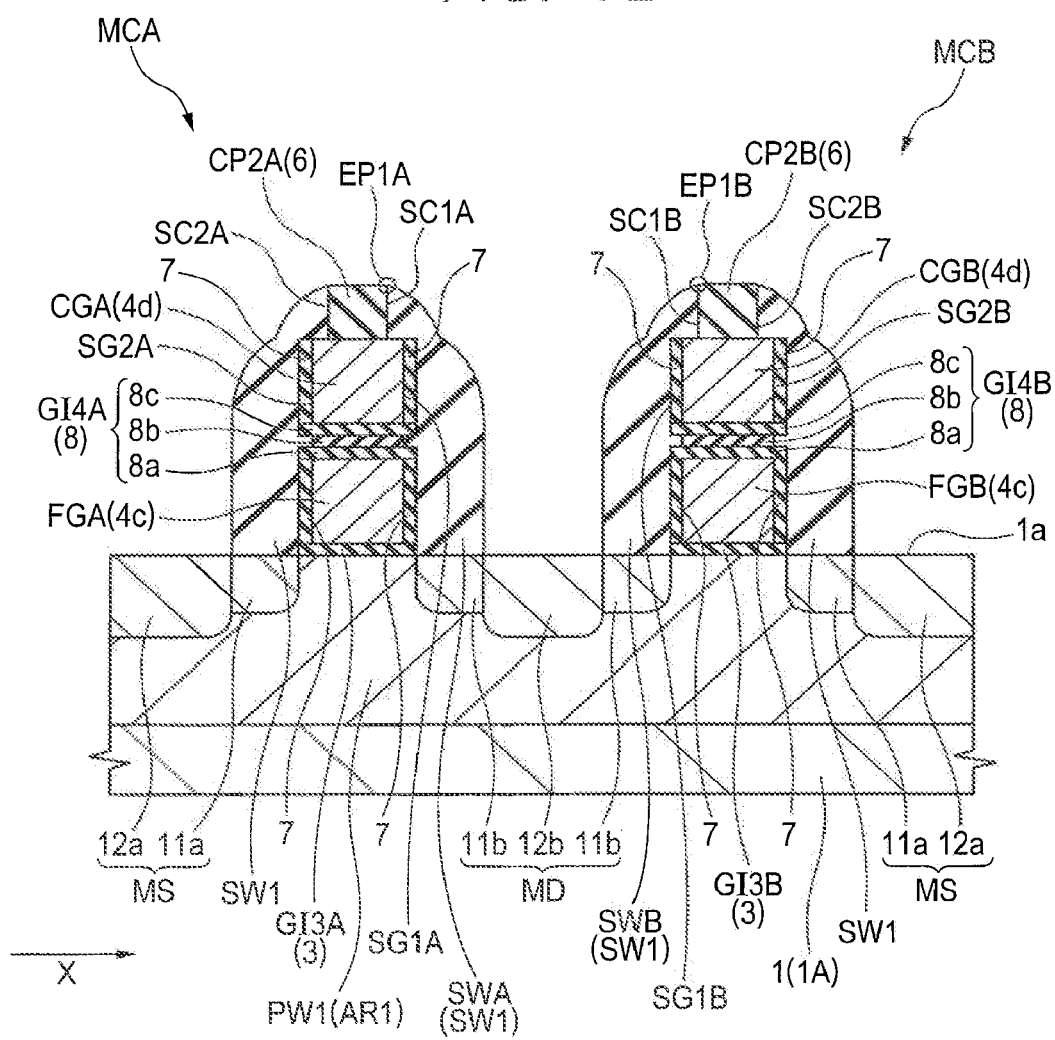
FIG. 72 is an essential part cross sectional view of the semiconductor device of Seventh Embodiment during a manufacturing step.

Then, the same steps as the steps described by reference to FIG. 19 in First Embodiment are performed. As a result, as shown in FIG. 72, sidewall spacers SW1 are formed at the side surface SG1A of the control gate electrode CGA, and the side surface SC1A of the cap insulation film CP2A. Whereas, sidewall spacers SW1 are formed at the side surface SG1B of the control gate electrode CGB, and the side surface SC1B of the cap insulation film CP2B.

Incidentally, as shown in FIG. 72, the sidewall spacer SW1 formed at the side surface SG1A of the control gate electrode CGA and the side surface SC1A of the cap insulation film CP2A is a sidewall spacer SWA. Whereas, the sidewall spacer SW1 formed at the side surface SG1B of the control gate electrode CGB and the side surface SC1B of the cap insulation film CP2B is a sidewall spacer SWB.

Then, as described by reference to FIG. 19 in First Embodiment, n⁺ type semiconductor regions 12a and 12b are formed. As a result, as shown in FIG. 72, the floating gate electrode FGA, the control gate electrode CGA, the gate insulation film GI3A, the insulation film GI4A, and the cap insulation film CP2A form the memory cell MCA. Whereas, the floating gate electrode FGB, the control gate electrode CGB, the gate insulation film GI3B, the insulation film GI4B, and the cap insulation film CP2B form the memory cell MCB.

Then, the same steps as the steps described by reference to FIGS. 20 to 22 in First Embodiment are performed. As a result, there is formed the semiconductor device of the present Seventh Embodiment described previously by reference to FIG. 66.

Main Features and Effects of the Present Embodiment

The semiconductor device of the present Seventh Embodiment also has the same features as the features of the semiconductor device of First Embodiment.

For example, also in the semiconductor device of the present Seventh Embodiment, as with the semiconductor device of First Embodiment, the end EP1A at the top surface of the cap insulation film CP2A on the control gate electrode CGB side is set back from the side surface SG1A of the control gate electrode CGA on the control gate electrode CGB side. Whereas, the end EP1B at the top surface of the cap insulation film CP2B on the control gate electrode CGA side is set back from the side surface SG1B of the control gate electrode CGB on the control gate electrode CGA side.

With such a structure, the semiconductor device of the present Seventh Embodiment also has the same effects as the effects of the semiconductor device of First Embodiment.

For example, when the interlayer insulation film 15 is formed by, for example, a CVD method, the raw materials become more likely to reach between the sidewall spacer SWA and the sidewall spacer SWB. Accordingly, it is possible to prevent or inhibit the formation of a cavity CV (see FIG. 66) in a portion of the interlayer insulation film 15 between the sidewall spacer SWA and the sidewall spacer SWB. Namely, it is possible to prevent or inhibit the formation of a cavity CV in a portion of the interlayer insulation film 15 between the control gate electrode CGA and the control gate electrode CGB.

Therefore, even when a plug is not formed between the control gate electrode CGA and the control gate electrode CGB, a cavity CV is not formed in the interlayer insulation film 15. This can prevent or inhibit an electrical short circuit between the memory cell and other portions due to the formation of a conductive film or the like in the inside of the cavity CV. For this reason, it is possible to improve the performances of the semiconductor device.

Up to this point, the invention made by the present inventors was specifically described by way of embodiments. However, it is naturally understood that the present invention is not limited to the embodiments, and may be variously changed within the scope not departing from the gist thereof.

What is claimed is:

1. A method for manufacturing a semiconductor device, comprising the steps of:
    (a) providing a semiconductor substrate,
    (b) forming a first insulation film over a first main surface of the semiconductor substrate,
    (c) forming a first conductive film over the first insulation film,
    (d) forming a second insulation film over the first conductive film,
    (e) patterning the second insulation film and the first conductive film, forming a first gate electrode and a second gate electrode spaced along a first direction in the first main surface of the semiconductor substrate with the first conductive film, forming a first gate insulation film formed of the first insulation film between the first gate electrode and the semiconductor substrate, forming a second gate insulation film formed of the first insulation film between the second gate electrode and the semiconductor substrate, forming a first cap insulation film formed of the second insulation film over the first gate electrode, and forming a second cap insulation film formed of the second insulation film over the second gate electrode, (f) removing a portion of the first cap insulation film exposed at the side surface on the second gate electrode side, and setting the side surface of the first cap insulation film on the second gate electrode side back from the side surface of the first gate electrode on the second gate electrode side, (g) forming a third insulation film having a first charge accumulation part in the inside thereof at the first main surface of the semiconductor substrate, the surface of the first gate electrode, the surface of the second gate electrode, the surface of the first cap insulation film, and the surface of the second cap insulation film, (h) forming a second conductive film over the third insulation film, (i) etching back the second conductive film, and thereby leaving the second conductive film, and forming a third gate electrode at the side surface of the first gate electrode opposite to the second gate electrode side via the third insulation film, and leaving the second conductive film, and forming a fourth gate electrode at the side surface of the second gate electrode opposite to the first gate electrode side via the third insulation film, and (j) removing a portion of the third insulation film not covered with any of the third gate electrode and the fourth gate electrode, and forming a third gate insulation film formed of the third insulation between the third gate electrode and the semiconductor substrate, and the third insulation film between the first gate electrode and the third gate electrode, and forming a fourth gate insulation film formed of the third insulation film between the fourth gate electrode and the semiconductor substrate, and the third insulation film between the second gate electrode and the fourth gate electrode.

2. The method for manufacturing a semiconductor device according to claim 1,
wherein, in the step (f), a portion of the second cap insulation film exposed at the side surface on the first gate electrode side is removed, and the side surface of the second cap insulation film on the first gate electrode side is set back from the side surface of the second gate electrode on the first gate electrode side.

3. The method for manufacturing a semiconductor device according to claim 2,
wherein, in the step (a), there is provided the semiconductor substrate having a first active region and a second active region spaced along a second direction crossing with the first direction in the first main surface of the semiconductor substrate, and a first element isolation region arranged between the first active region and the second active region in the first main surface of the semiconductor substrate,
wherein, in the step (b), the first insulation film is formed over the first main surface of the semiconductor substrate including over the first active region and over the second active region,
wherein, in the step (e), the first gate electrode, the second gate electrode, the first cap insulation film, and the second cap insulation film are formed in such a manner as to each extend in the second direction through over the first active region, over the first element isolation region, and over the second active region, and
wherein, in the step (j), over the first active region, the first gate electrode, the first gate insulation film, the first cap insulation film, the third gate electrode, and the third gate insulation film form a first memory cell, over the first active region, the second gate electrode, the second gate insulation film, the second cap insulation film, the fourth gate electrode, and the fourth gate insulation film form a second memory cell, over the second active region, the first gate electrode, the first gate insulation film, the first cap insulation film, the third gate electrode, and the third gate insulation film form a third memory cell, and over the second active region, the second gate electrode, the second gate insulation film, the second cap insulation film, the fourth gate electrode, and the fourth gate insulation film form a fourth memory cell,
the method comprising the steps of:
(k) after the step (j), forming an interlayer insulation film in such a manner as to cover the first gate electrode, the second gate electrode, the first cap insulation film, the second cap insulation film, the third gate electrode, and the fourth gate electrode over the first active region, over the first element isolation region, and over the second active region,
(l) forming a first opening penetrating through the interlayer insulation film, and reaching the first active region between the first gate electrode and the second gate electrode, and forming a second opening penetrating through the interlayer insulation film, and reaching the second active region between the first gate electrode and the second gate electrode, and
(m) forming a first plug formed of a third conductive film embedded in the first opening, and electrically coupled with the first active region, and forming a second plug formed of the third conductive film embedded in the second opening, and electrically coupled with the second active region.

4. The method for manufacturing a semiconductor device according to claim 2,
wherein the first conductive film is a first silicon film, and
wherein the second insulation film is a first silicon nitride film,
the method comprising the steps of:
(n) after the step (c), and before the step (d), forming a first silicon oxide film over the first silicon film, and
(o) after the step (e), and before the step (f), forming a second silicon oxide film at the side surface of the first gate electrode, and forming a third silicon oxide film at the side surface of the second gate electrode,
wherein, in the step (d), the first silicon nitride film is formed over the first silicon oxide film, and
wherein, in the step (f), a portion of the first cap insulation film exposed at the side surface on the second gate electrode side, and a portion of the second cap insulation film exposed at the side surface on the first gate electrode side are etched and removed using a hot phosphoric acid.

5. The method for manufacturing a semiconductor device according to claim 2,
wherein the step (j) includes:
(j1) removing a portion of the third insulation film not covered with any of the third gate electrode and the fourth gate electrode, forming the third gate insulation film, and forming the fourth gate insulation film,
(j2) after the step (j1), forming a fourth insulation film in such a manner as to cover the first gate electrode, the second gate electrode, the first cap insulation film, the second cap insulation film, the third gate electrode, and the fourth gate electrode, and
(j3) etching back the fourth insulation film, leaving the fourth insulation film and forming a first sidewall spacer at the side surface of the first gate electrode on the second gate electrode side, and leaving the fourth insulation film and forming a second sidewall spacer at the side surface of the second gate electrode on the first gate electrode side.

6. The method for manufacturing a semiconductor device according to claim 2,
wherein the third insulation film includes a fourth silicon oxide film, a second silicon nitride film over the fourth silicon oxide film, and a fifth silicon oxide film over the second silicon nitride film, and
wherein the step (g) includes the steps of:
(g1) forming the fourth silicon oxide film over the first main surface of the semiconductor substrate, the surface of the first gate electrode, the surface of the second gate electrode, the surface of the first cap insulation film, and the surface of the second cap insulation film,
(g2) forming the second silicon nitride film over the fourth silicon oxide film, and
(g3) forming the fifth silicon oxide film over the second silicon nitride film.

* * * * *